(12) United States Patent
Yano et al.

(10) Patent No.: US 11,960,719 B2
(45) Date of Patent: *Apr. 16, 2024

(54) SEMICONDUCTOR STORAGE DEVICE WITH VOLATILE AND NONVOLATILE MEMORIES TO ALLOCATE BLOCKS TO A MEMORY AND RELEASE ALLOCATED BLOCKS

(71) Applicant: Kioxia Corporation, Minato-ku (JP)

(72) Inventors: Hirokuni Yano, Tokyo (JP); Shinichi Kanno, Tokyo (JP); Toshikatsu Hida, Kawasaki (JP); Hidenori Matsuzaki, Fuchu (JP); Kazuya Kitsunai, Kawasaki (JP); Shigehiro Asano, Yokosuka (JP)

(73) Assignee: Kioxia Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/974,740

(22) Filed: Oct. 27, 2022

(65) Prior Publication Data
US 2023/0042619 A1 Feb. 9, 2023

Related U.S. Application Data

(60) Continuation of application No. 17/083,529, filed on Oct. 29, 2020, now Pat. No. 11,513,682, which is a
(Continued)

(30) Foreign Application Priority Data

Dec. 28, 2007 (JP) .................................. 2007-339943
Feb. 27, 2008 (JP) .................................. 2008-046227

(51) Int. Cl.
*G06F 3/06* (2006.01)
*G06F 12/02* (2006.01)
(Continued)

(52) U.S. Cl.
CPC .......... *G06F 3/0604* (2013.01); *G06F 3/0616* (2013.01); *G06F 3/0631* (2013.01);
(Continued)

(58) Field of Classification Search
None
See application file for complete search history.

(56) References Cited

U.S. PATENT DOCUMENTS 7,254,668 B1 8/2007 Chang et al.
7,630,252 B2 12/2009 Lin
(Continued)

FOREIGN PATENT DOCUMENTS

CN 1905073 A 1/2007
JP 10-116230 5/1998
(Continued)

OTHER PUBLICATIONS

Jo et al., "FAB: flash-aware buffer management policy for portable media players," Consumer Electronics, IEEE Transactions on, May 2006, vol. 52, Issue 2, pp. 485-493.
(Continued)

*Primary Examiner* — Kevin Verbrugge
(74) *Attorney, Agent, or Firm* — Oblon, McClelland, Maier & Neustadt, L.L.P.

(57) ABSTRACT

A semiconductor storage device includes a first memory area configured in a volatile semiconductor memory, second and third memory areas configured in a nonvolatile semiconductor memory, and a controller which executes following processing. The controller executes a first processing for storing a plurality of data by the first unit in the first memory area, a second processing for storing data outputted from the first memory area by a first management unit in the second memory area, and a third processing for storing data out-
(Continued)

putted from the first memory area by a second management unit in the third memory area.

20 Claims, 53 Drawing Sheets

Related U.S. Application Data continuation of application No. 16/364,280, filed on Mar. 26, 2019, now Pat. No. 10,845,992, which is a continuation of application No. 15/617,220, filed on Jun. 8, 2017, now Pat. No. 10,248,317, which is a continuation of application No. 14/822,138, filed on Aug. 10, 2015, now Pat. No. 9,703,486, which is a continuation of application No. 14/282,242, filed on May 20, 2014, now Pat. No. 9,134,924, which is a continuation of application No. 13/571,034, filed on Aug. 9, 2012, now Pat. No. 8,782,331, which is a division of application No. 13/271,838, filed on Oct. 12, 2011, now abandoned, which is a continuation of application No. 12/552,330, filed on Sep. 2, 2009, now Pat. No. 8,065,470, which is a continuation of application No. PCT/JP2008/073950, filed on Dec. 25, 2008.

(51) Int. Cl.
*G11C 11/56* (2006.01)
*G06F 12/0804* (2016.01)
*G06F 12/0866* (2016.01)

(52) U.S. Cl.
CPC ............ *G06F 3/064* (2013.01); *G06F 3/0656* (2013.01); *G06F 3/0658* (2013.01); *G06F 3/0679* (2013.01); *G06F 3/0685* (2013.01); *G06F 12/0246* (2013.01); *G11C 11/5628* (2013.01); *G06F 12/0804* (2013.01); *G06F 12/0866* (2013.01); *G06F 2212/7201* (2013.01); *G06F 2212/7202* (2013.01); *G06F 2212/7203* (2013.01); *G06F 2212/7209* (2013.01)

(56) References Cited

U.S. PATENT DOCUMENTS

| | | |
|---|---|---|
| 7,689,761 B2 | 3/2010 | Yim et al. |
| 7,719,889 B2 | 5/2010 | Lin |
| 7,953,931 B2 | 5/2011 | Yu et al. |
| 8,019,943 B2 | 9/2011 | Yu et al. |
| 8,078,794 B2 | 12/2011 | Lee et al. |
| 2002/0184436 A1 | 12/2002 | Kim et al. |
| 2006/0179212 A1 | 8/2006 | Kim et al. |
| 2007/0028034 A1 | 2/2007 | Nishihara |
| 2007/0061502 A1 | 3/2007 | Lasser |
| 2007/0283081 A1 | 12/2007 | Lasser |
| 2008/0104309 A1 | 5/2008 | Cheon |
| 2008/0209109 A1 | 8/2008 | Lasser |
| 2008/0209114 A1 | 8/2008 | Chow et al. |
| 2008/0235441 A1 | 9/2008 | Sherman |
| 2008/0316815 A1 | 12/2008 | Lin |
| 2008/0316816 A1 | 12/2008 | Lin |
| 2009/0043831 A1 | 2/2009 | Antonopoulos et al. |
| 2009/0089482 A1 | 4/2009 | Traister |
| 2009/0144501 A2 | 6/2009 | Yim et al. |
| 2009/0327591 A1 | 12/2009 | Moshayedi |
| 2010/0037009 A1 | 2/2010 | Yano et al. |
| 2010/0153630 A1 | 6/2010 | Yim et al. |
| 2011/0197017 A1 | 8/2011 | Yu |
| 2014/0379970 A1 | 12/2014 | Cheon |
| 2015/0120988 A1 | 4/2015 | Hung |

FOREIGN PATENT DOCUMENTS

| | | |
|---|---|---|
| JP | 2002-278828 | 9/2002 |
| JP | 2002-366423 | 12/2002 |
| JP | 2005-222550 | 8/2005 |
| JP | 2006-221627 | 8/2006 |
| JP | 2007-34944 | 2/2007 |
| JP | 2008-33788 | 2/2008 |
| JP | 2008-197981 A | 8/2008 |
| JP | 2010-521718 A | 6/2010 |
| TW | 200413916 | 8/2004 |
| WO | WO 2004/040453 A2 | 5/2004 |

OTHER PUBLICATIONS

Lee et al., "A Log Buffer-Based Flash Translation Layer Using Fully-Associative Sector Translation," ACM Transactions on Embedded Computing Systems, vol. 6, No. 3, Article 18, Jul. 2007.
Search Report dated May 31, 2013 in European Application No. 08868057.4.
Chinese Office Action dated May 6, 2014, in China Patent Application No. 200880008447.6 (w/English translation).

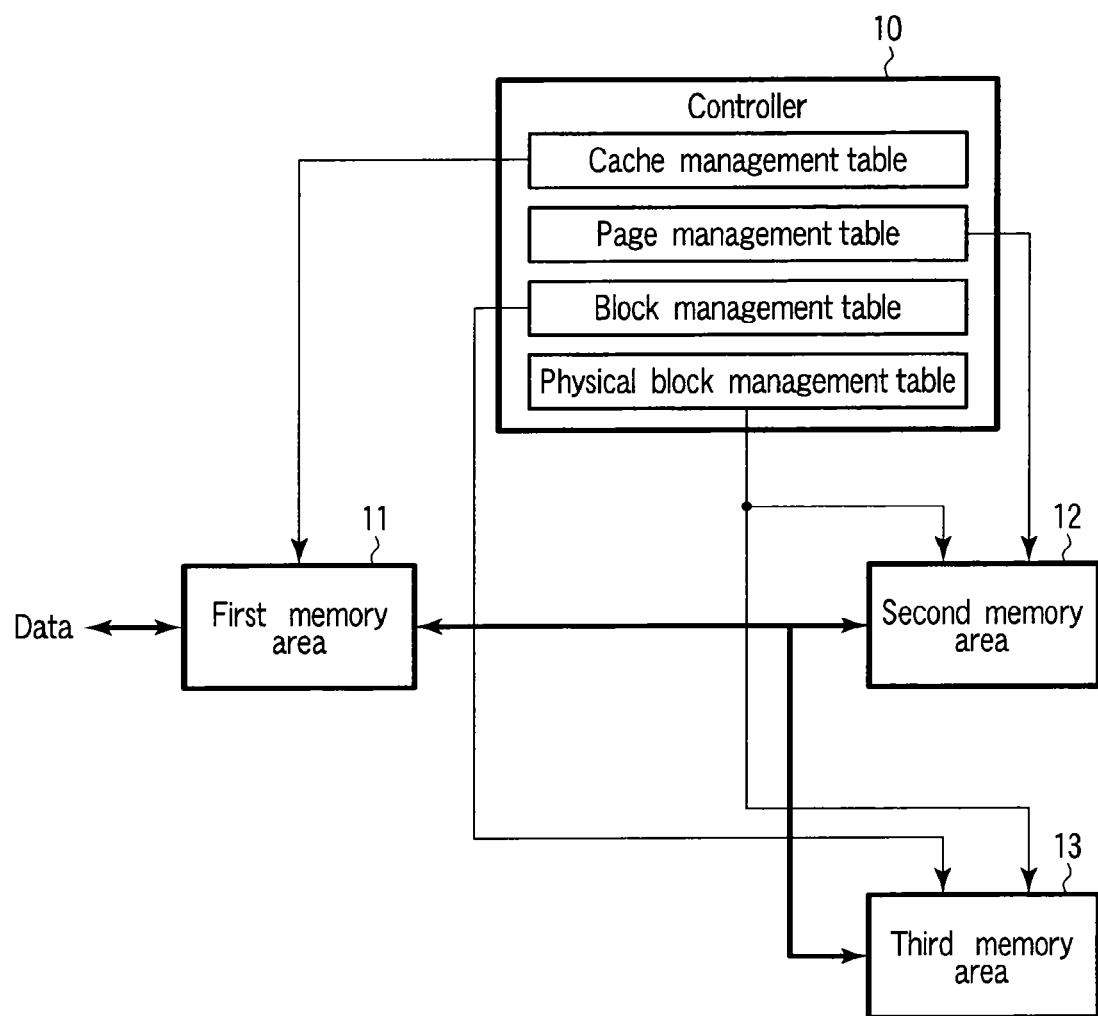
F I G. 1

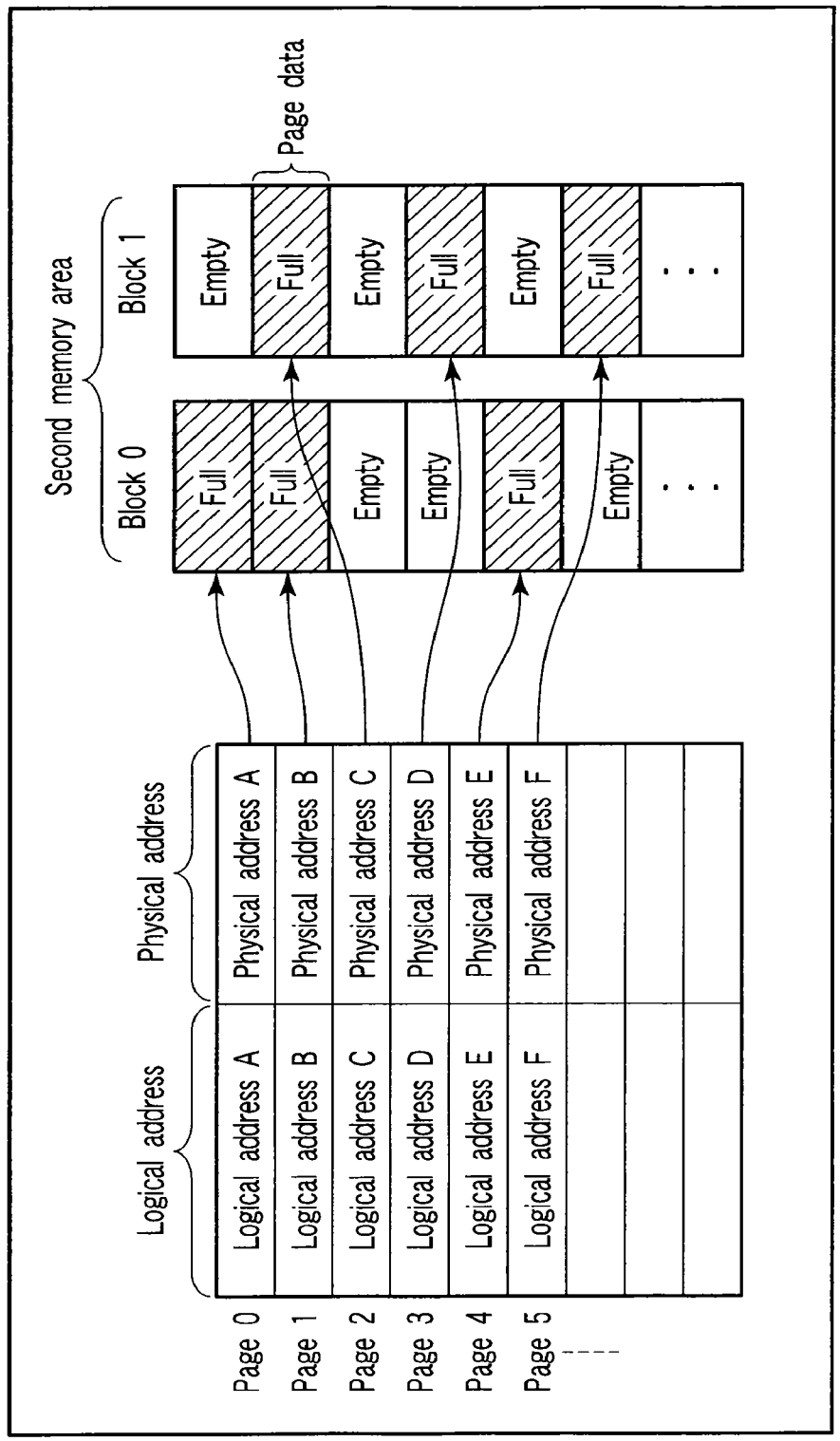
F I G. 4

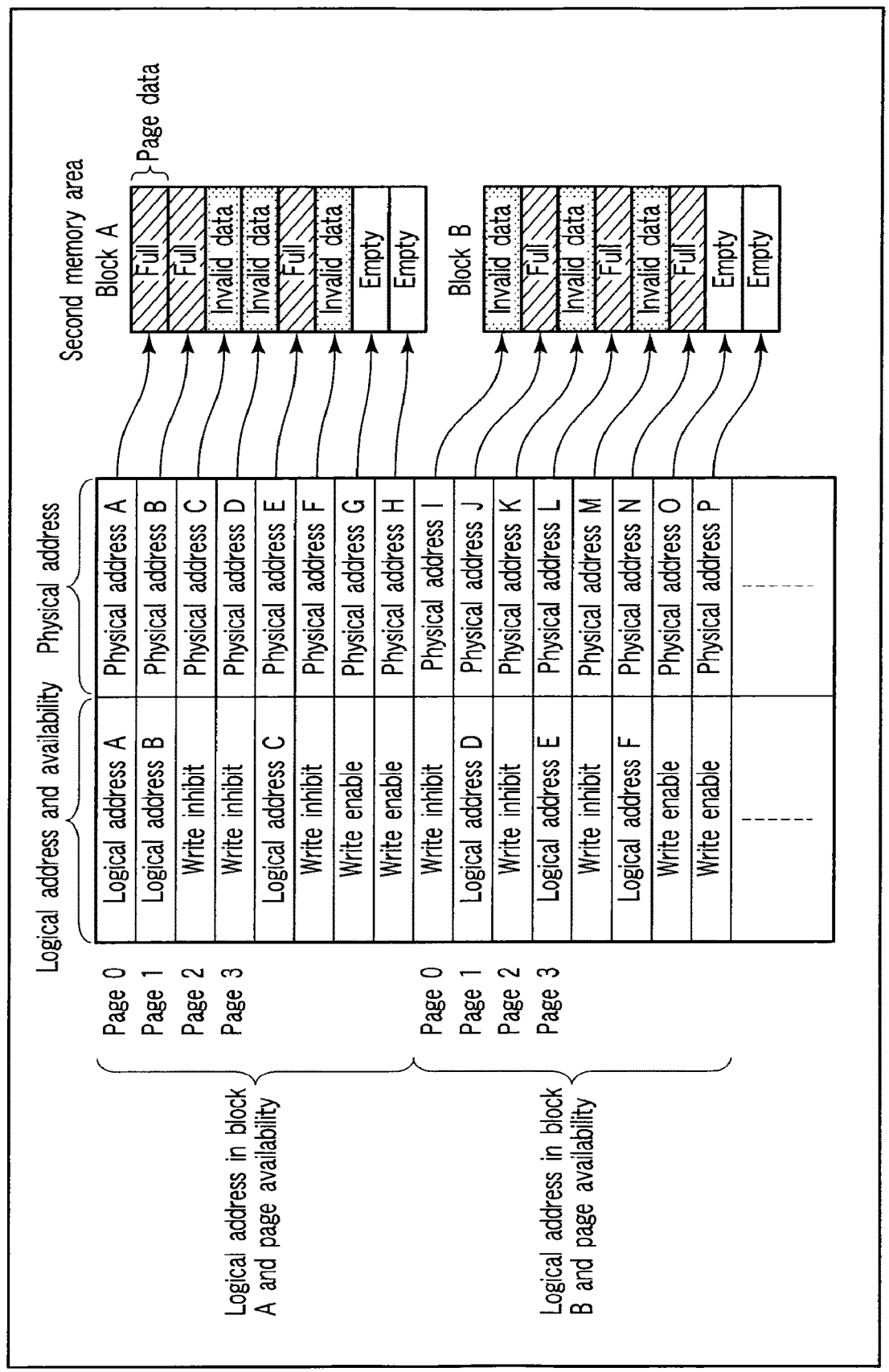
F I G. 5

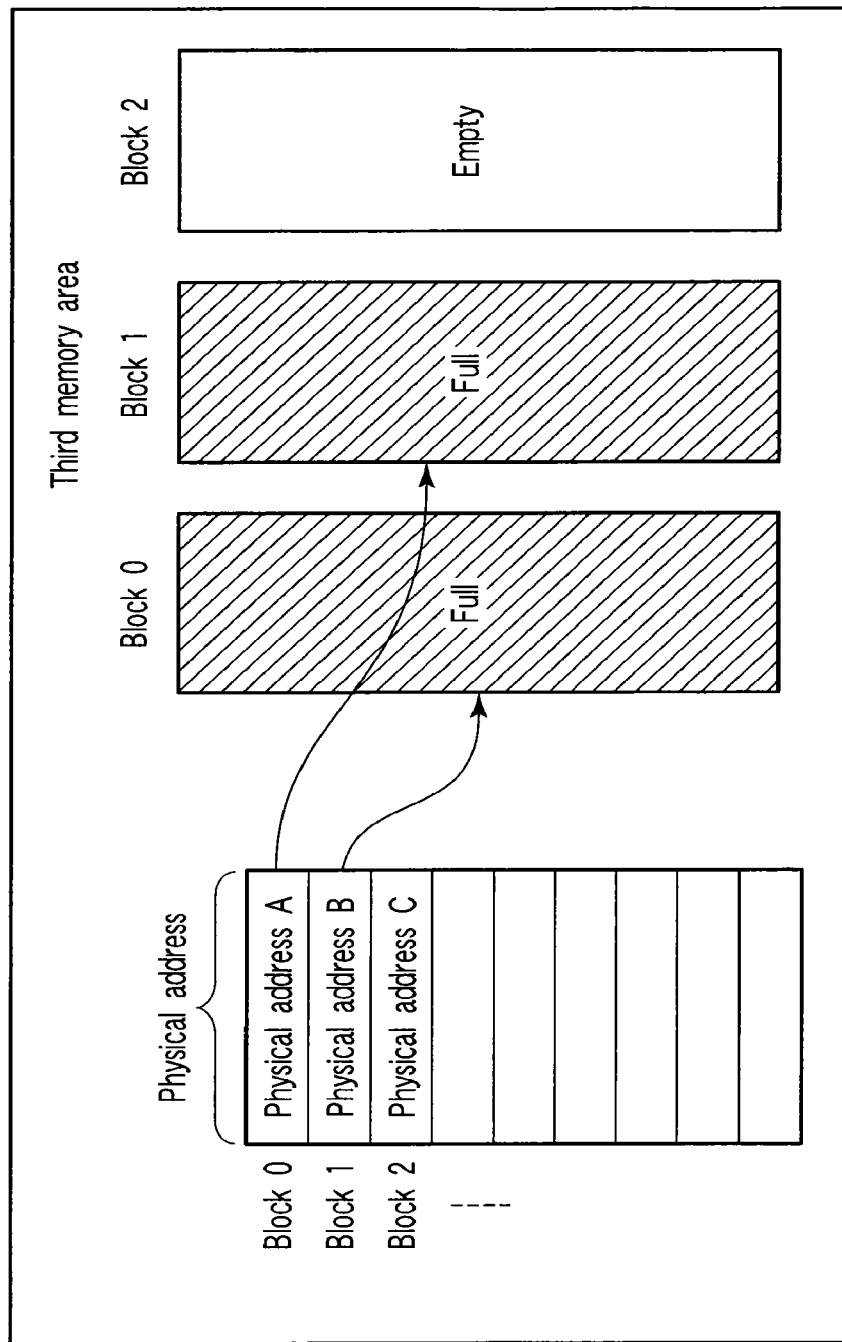
F I G. 6

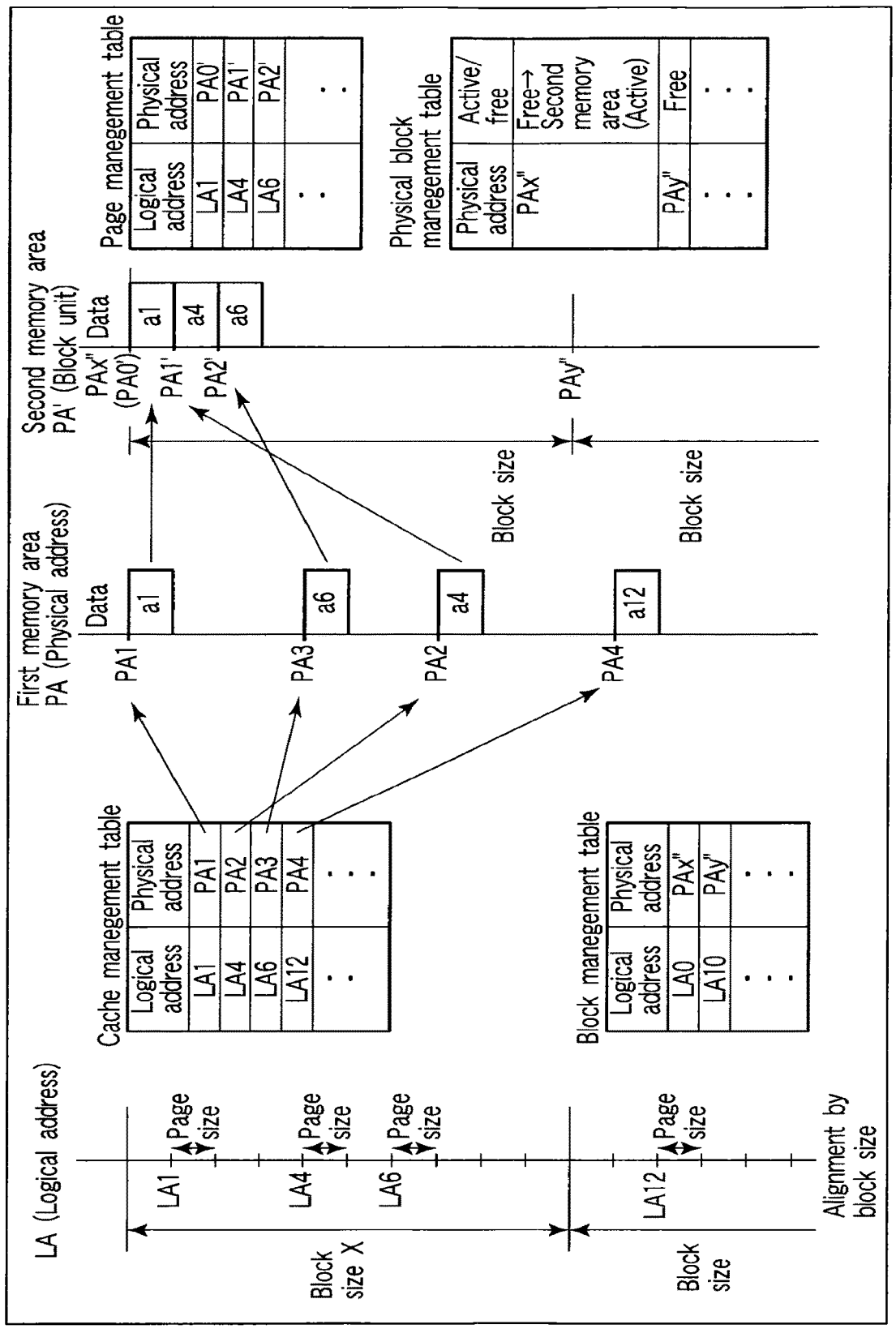
F I G. 12

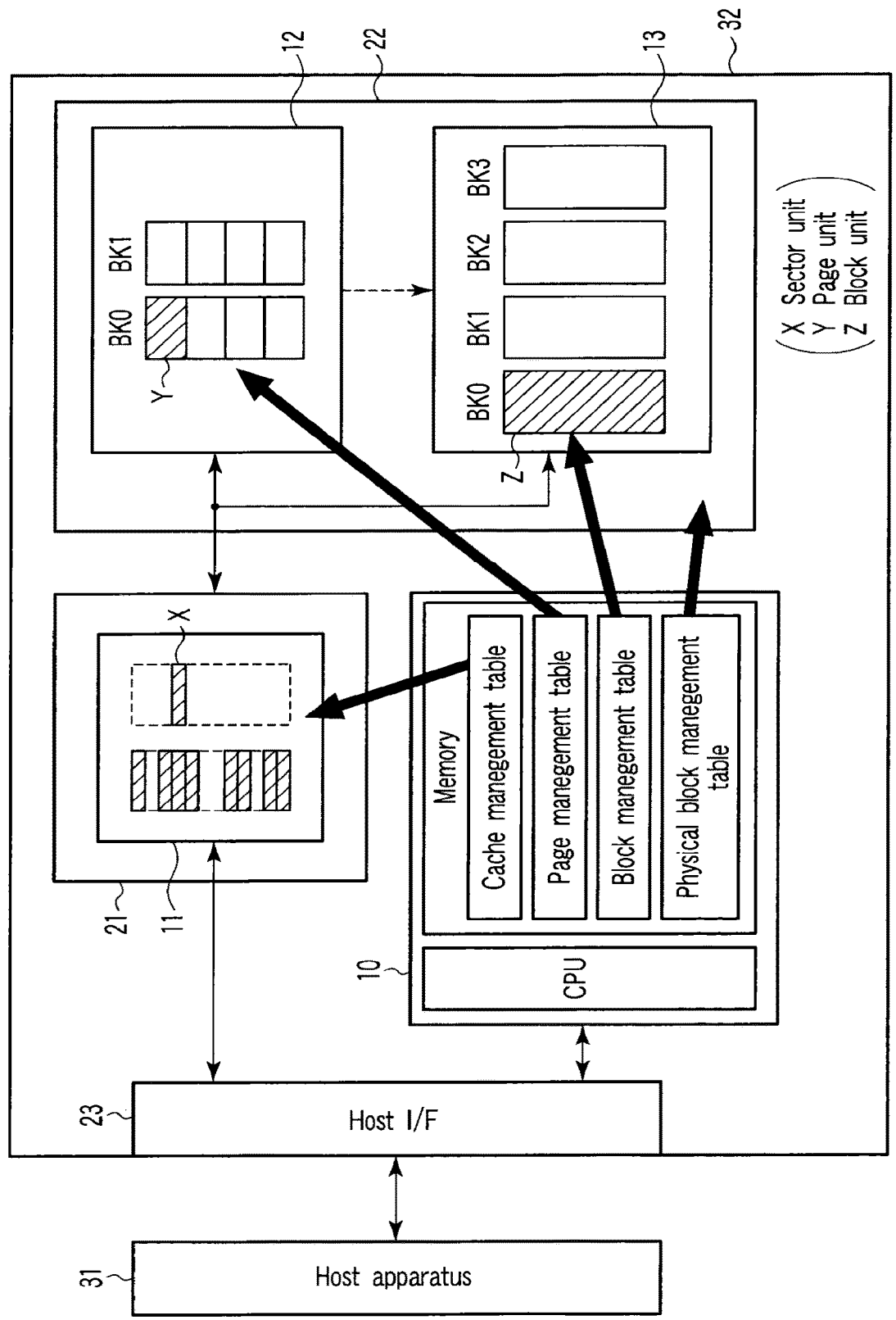
F I G. 17

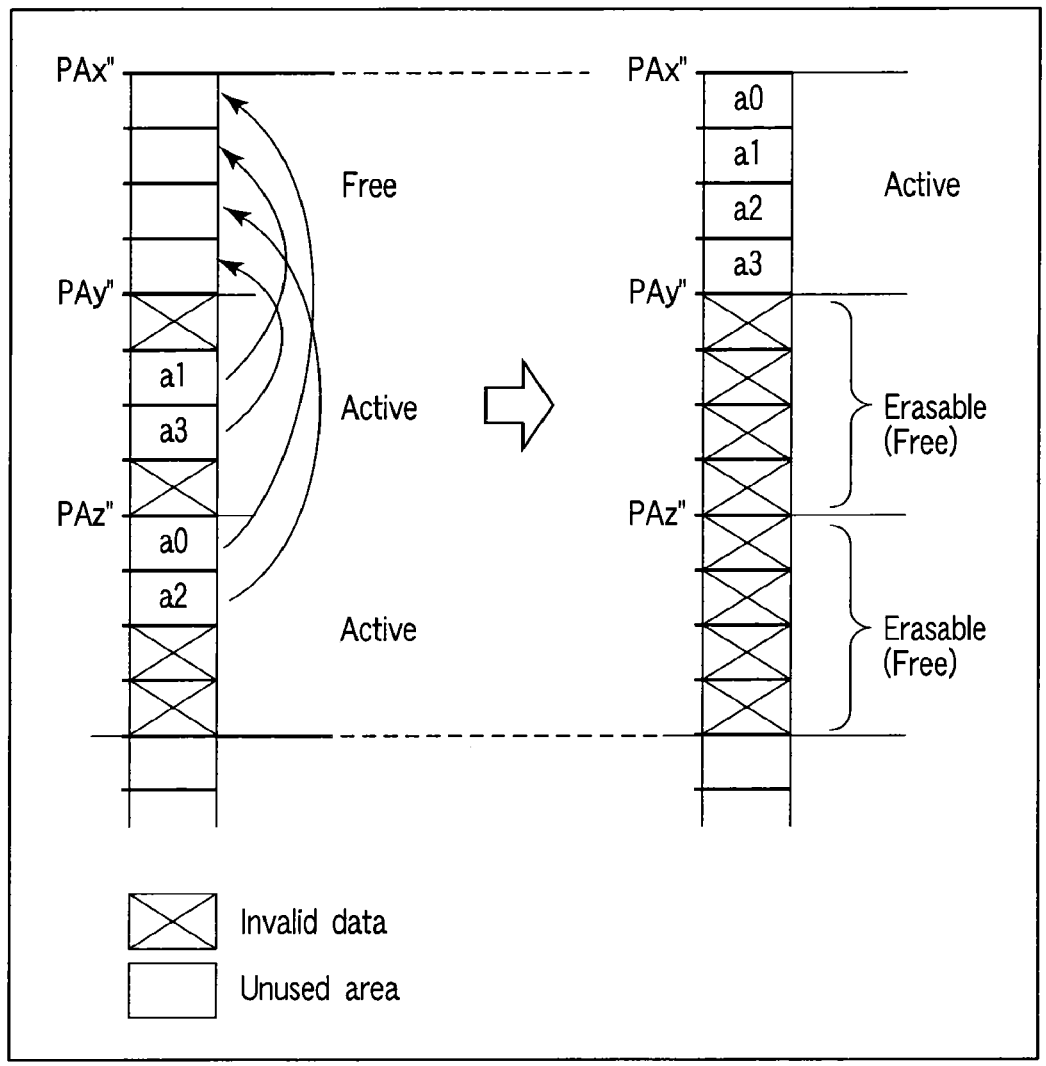
F I G. 19

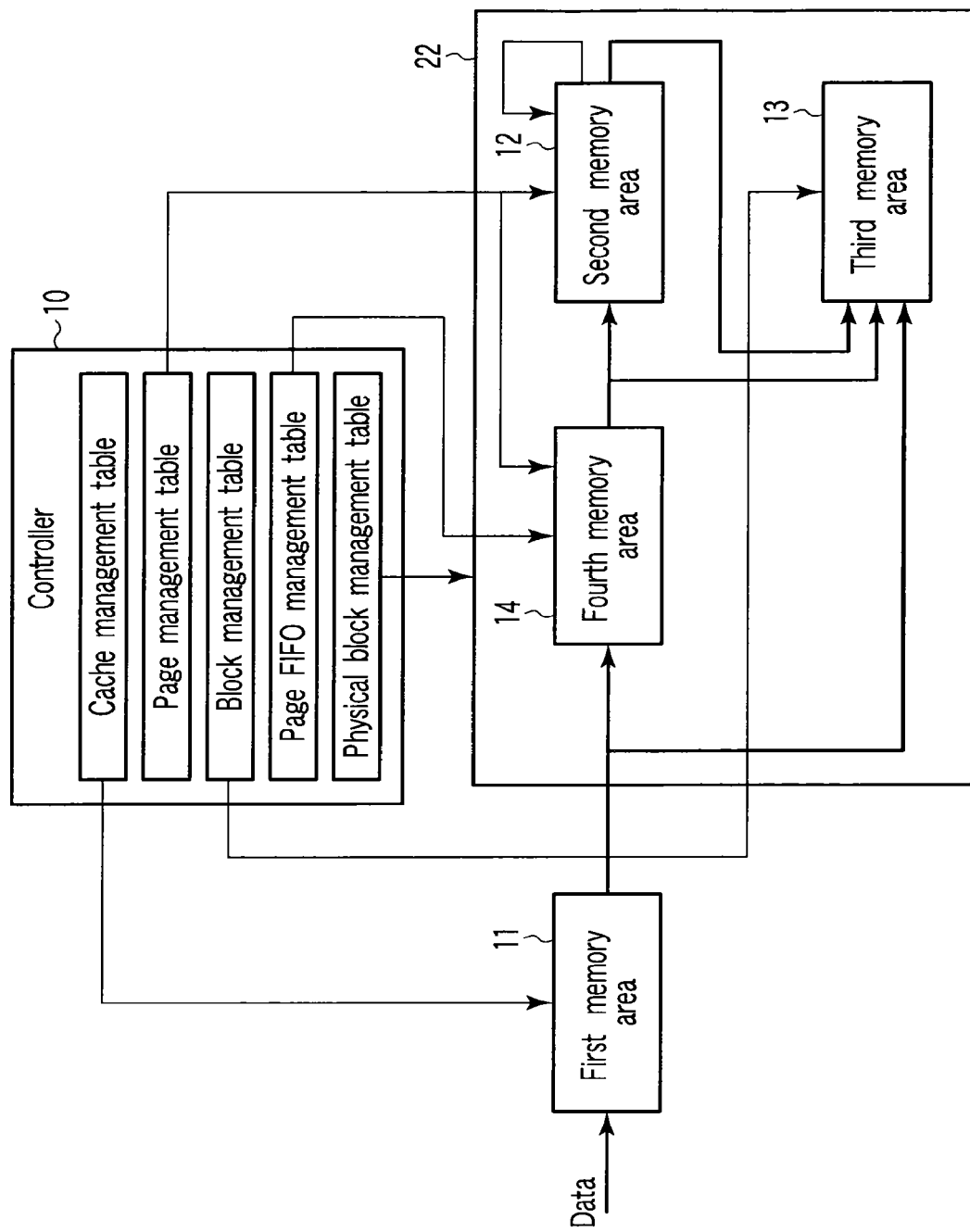
F I G. 20

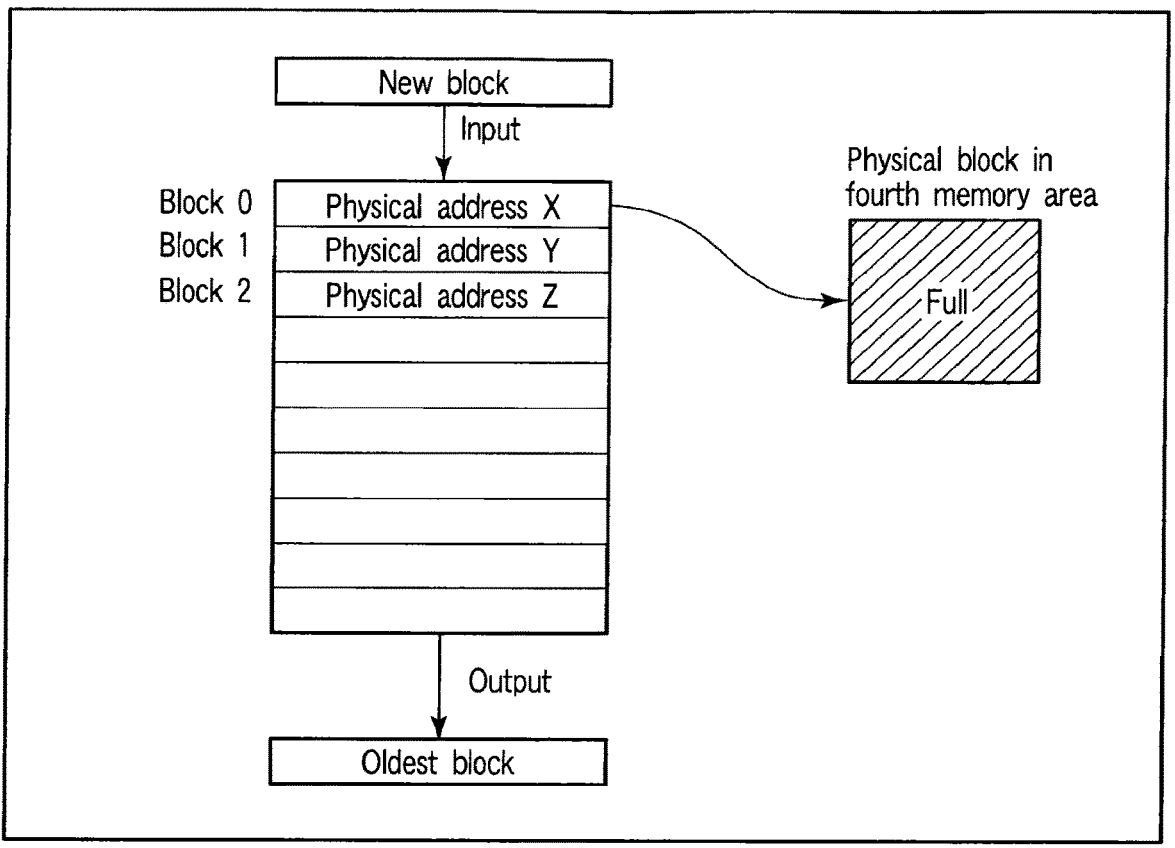
F I G. 24
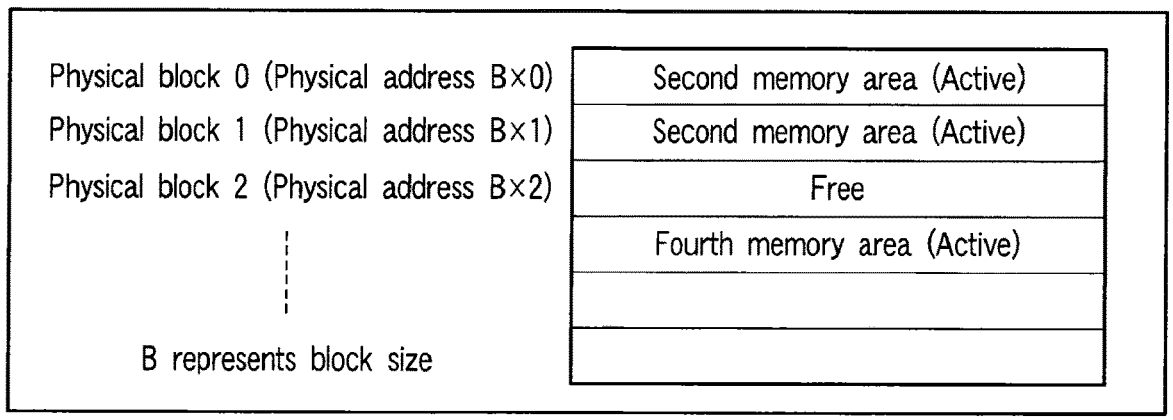
F I G. 25

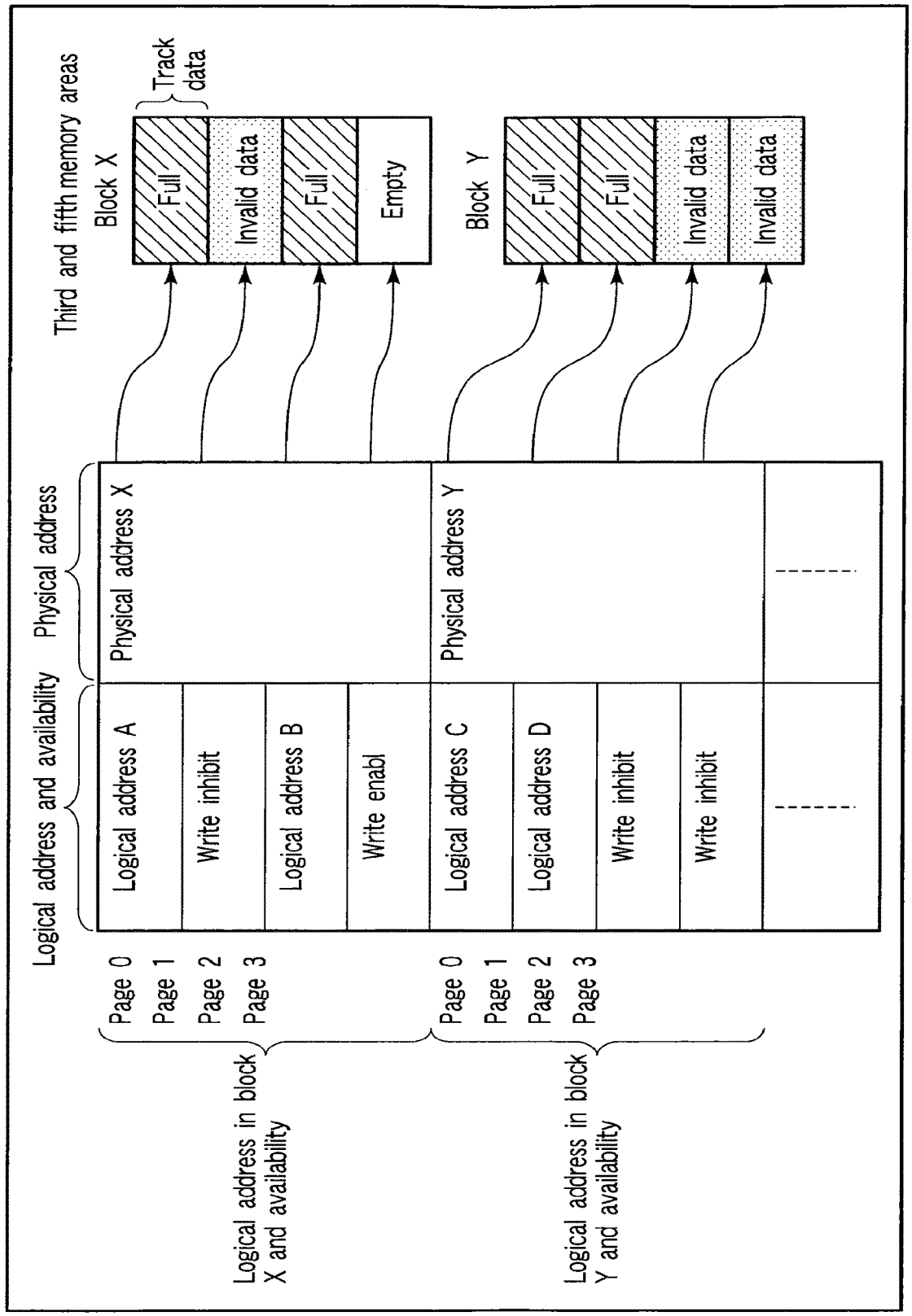
F I G. 31

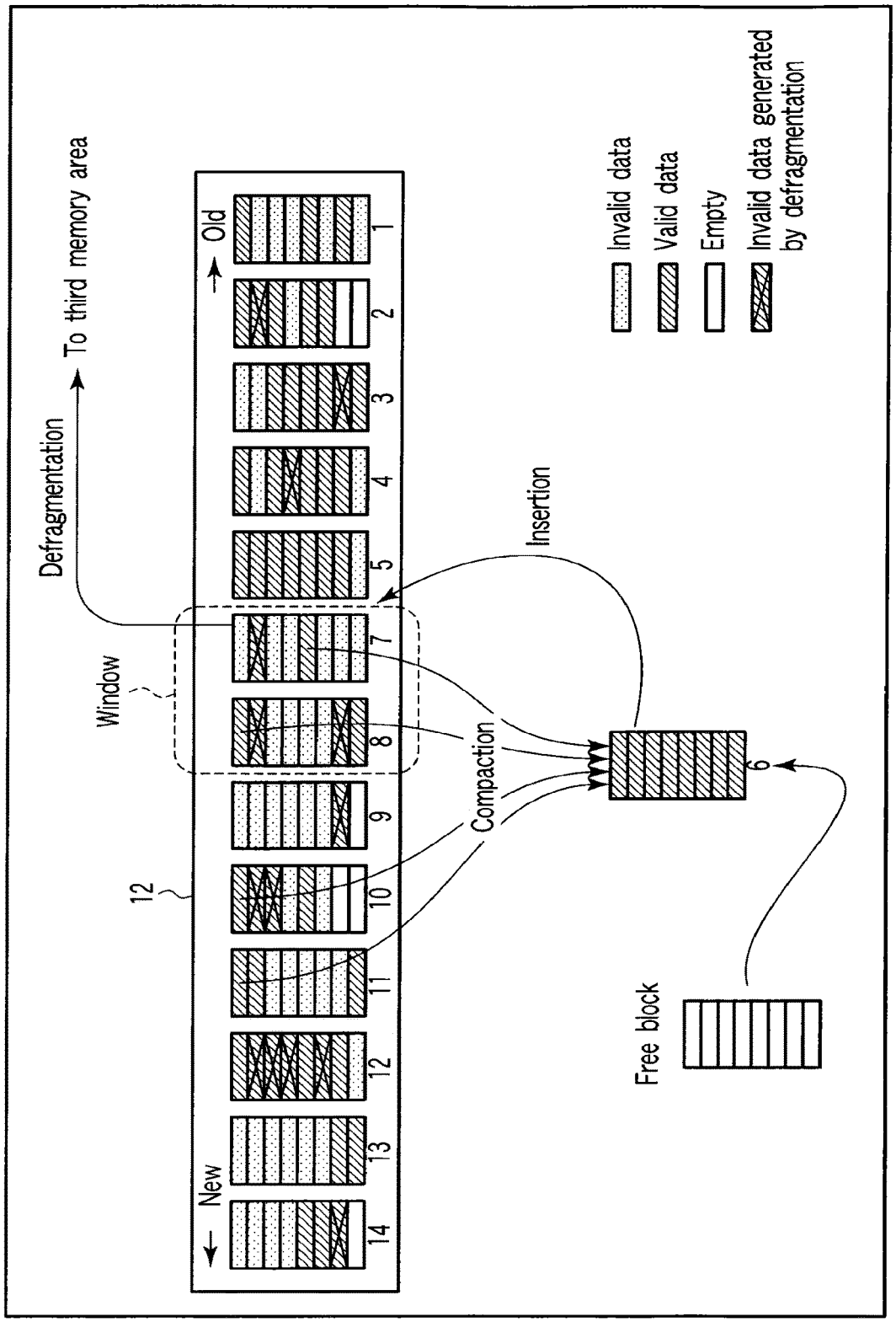
F I G. 44

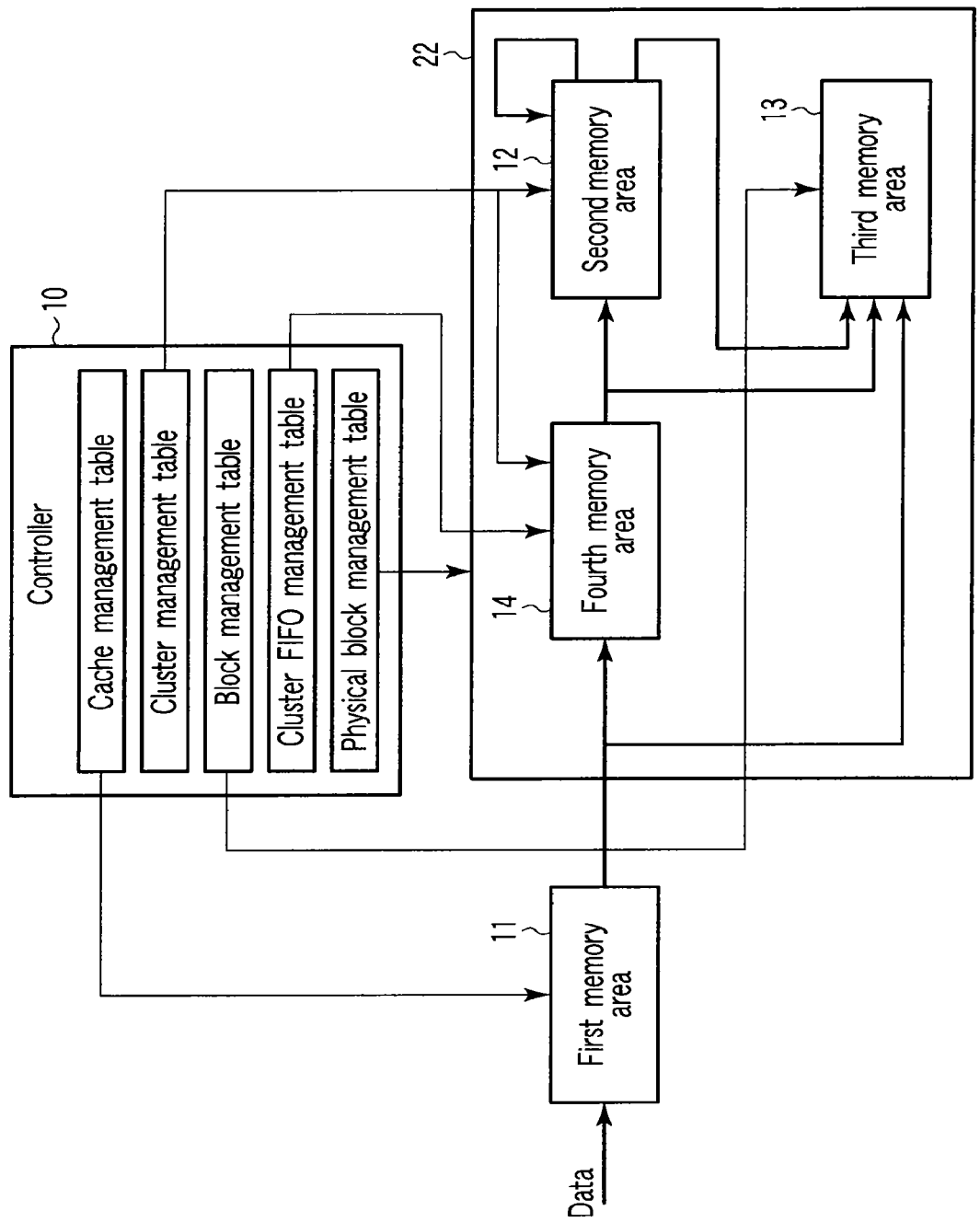
F I G. 47

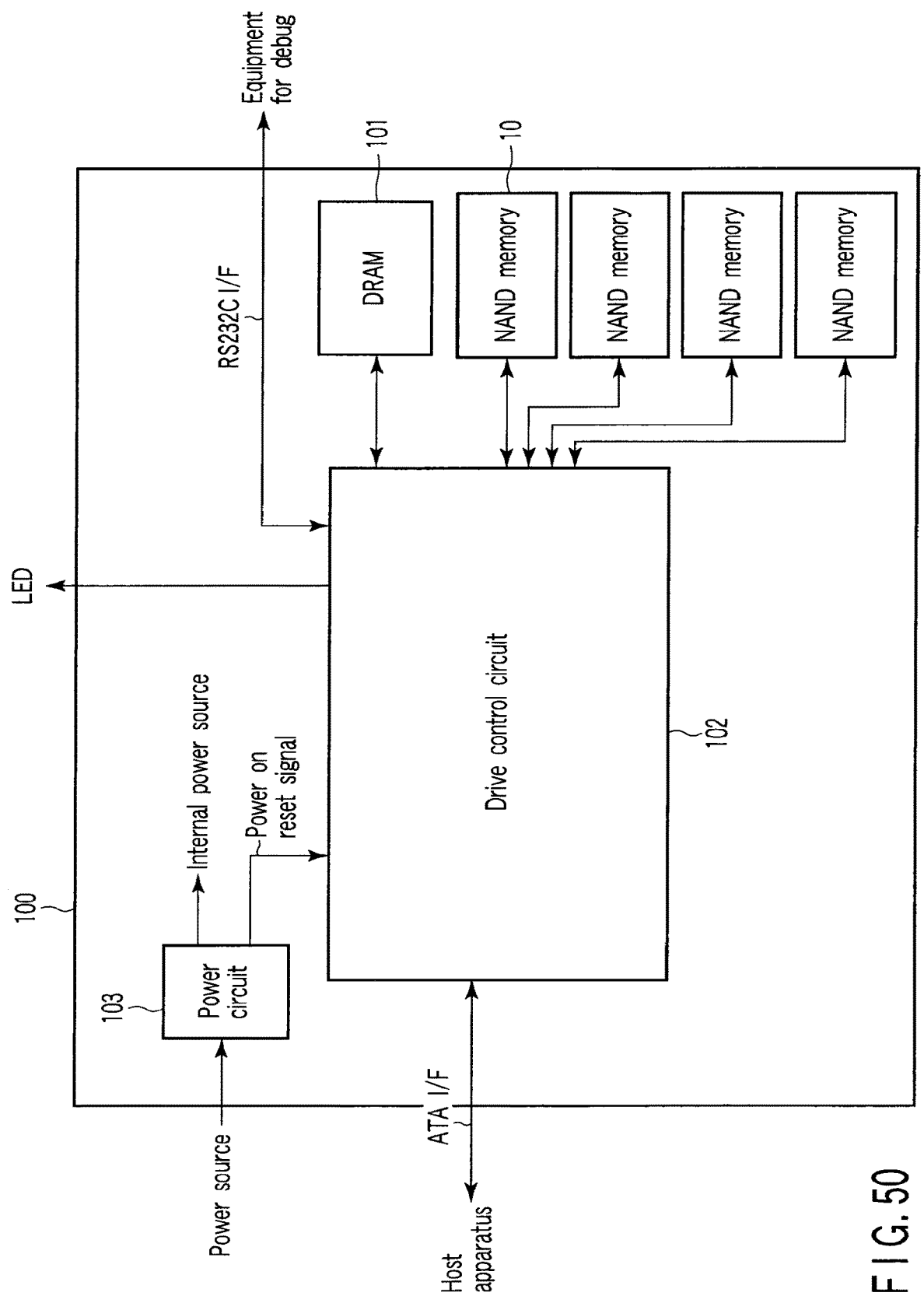
F I G. 50

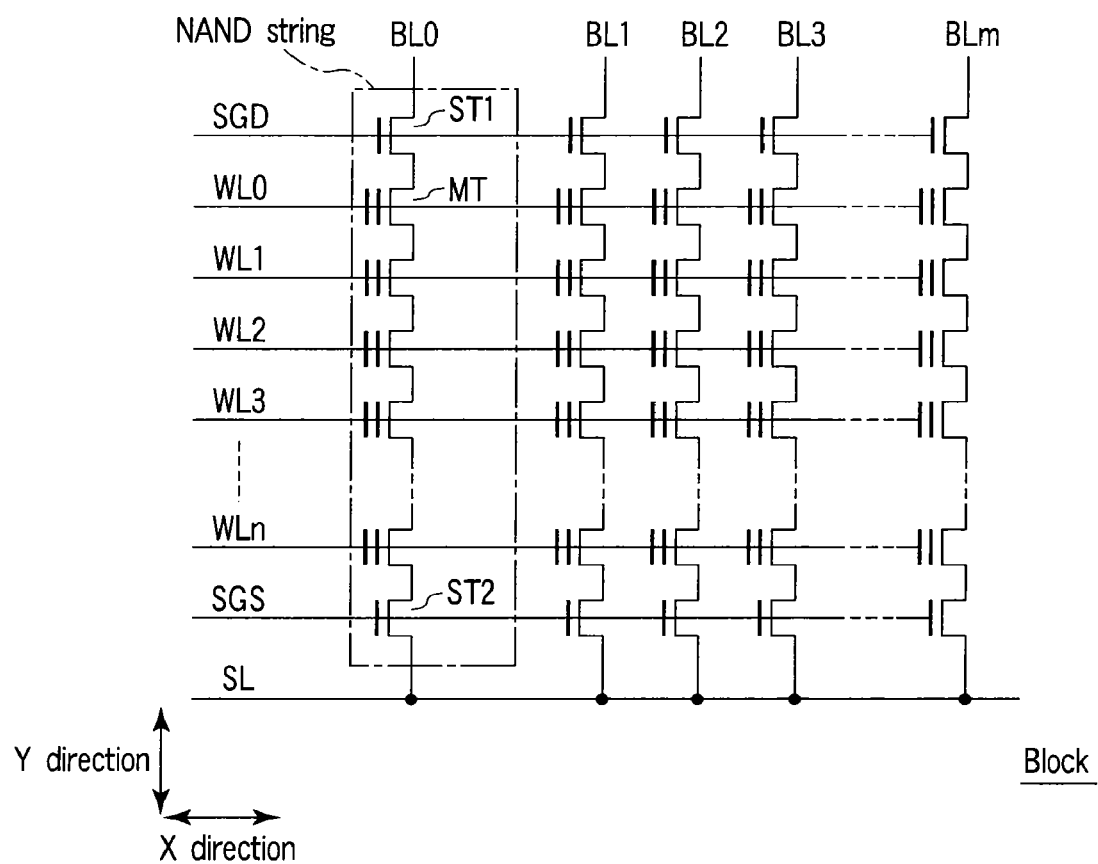
F I G. 51

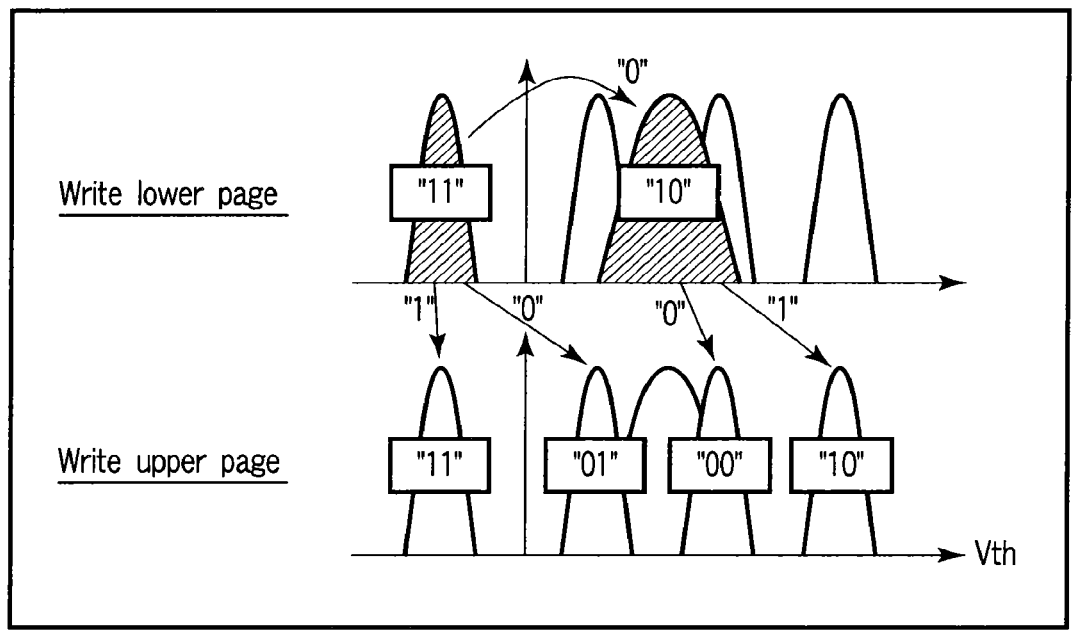
F I G. 52

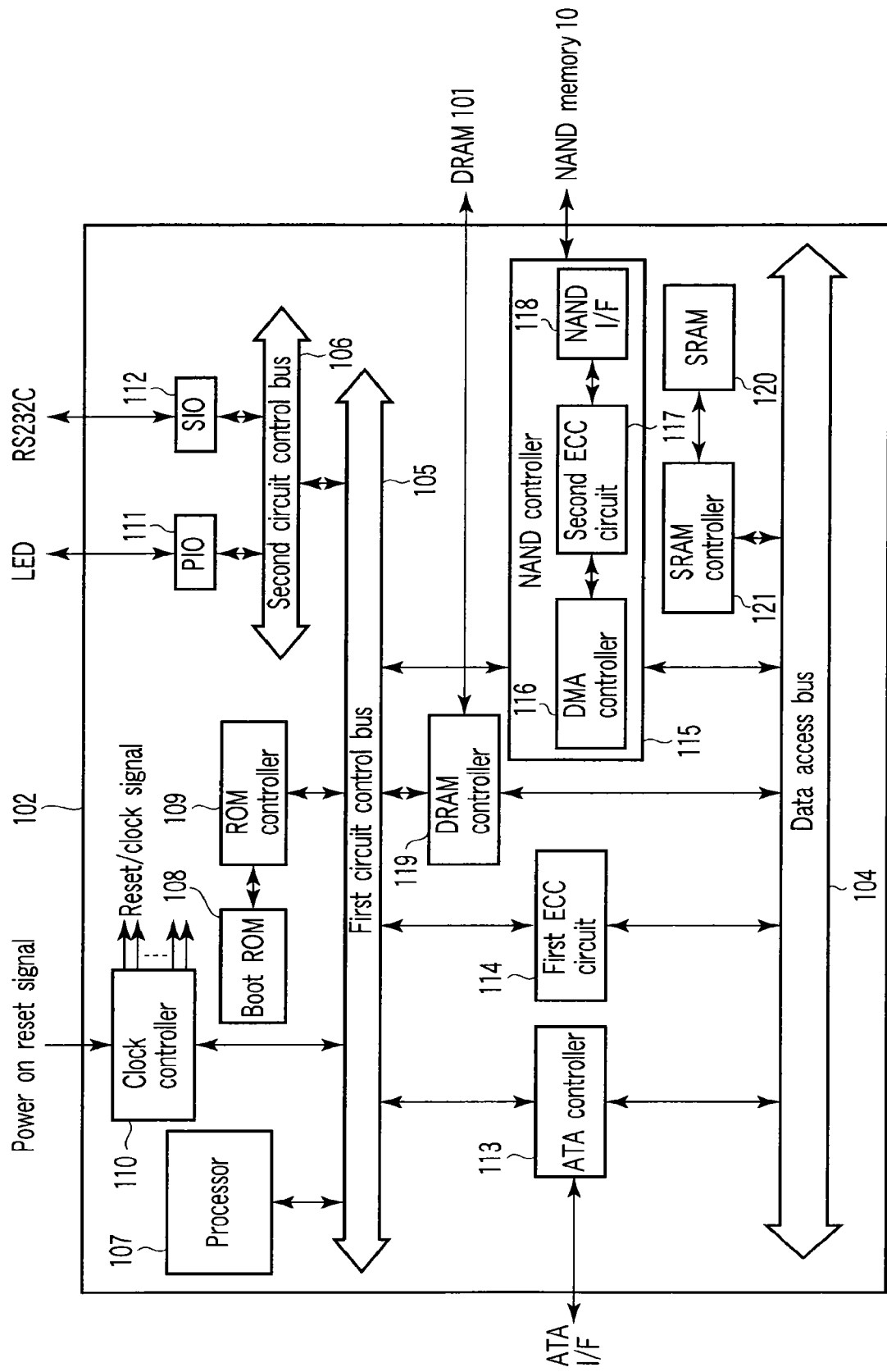
F I G. 53

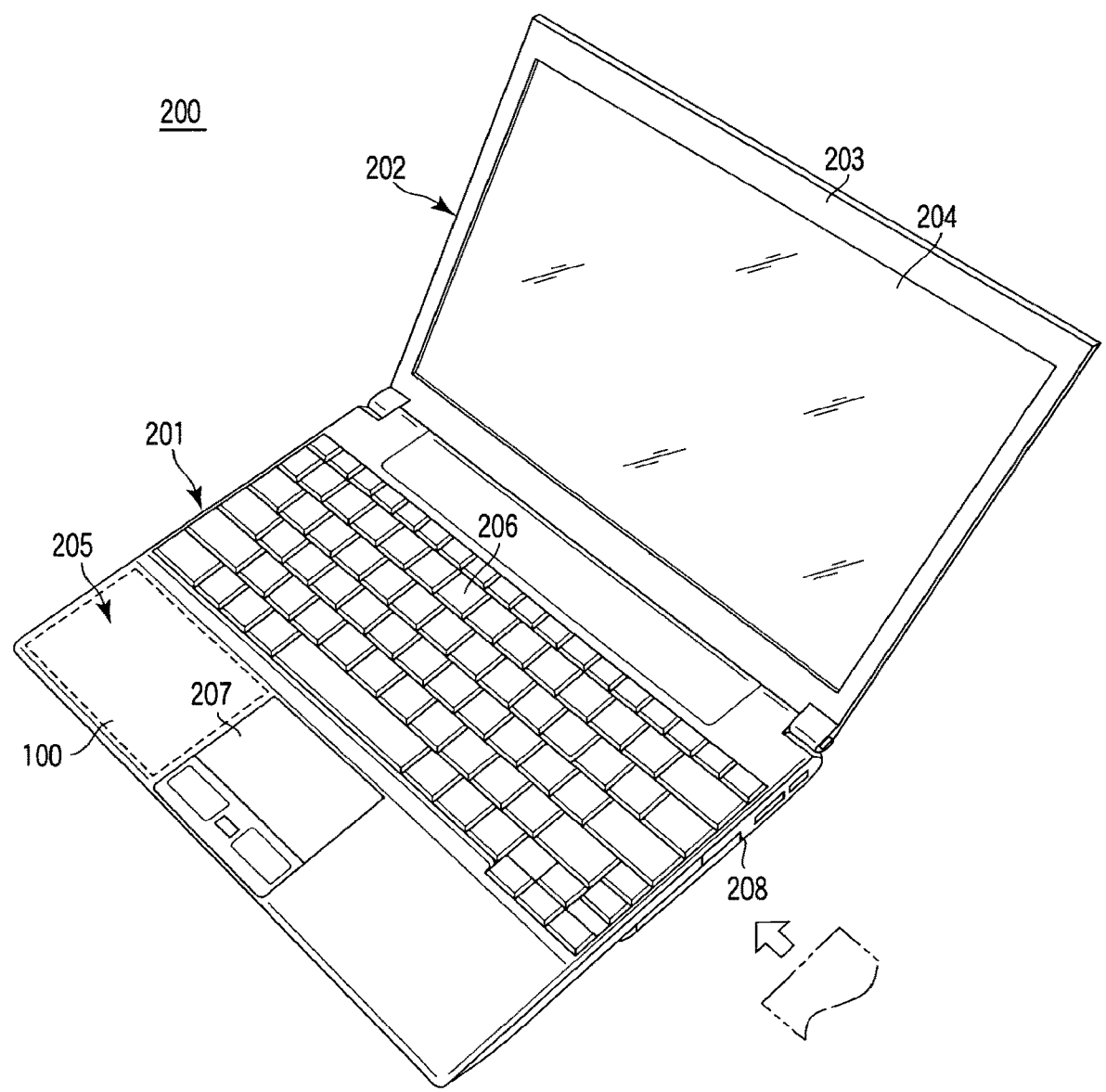
F I G. 55

SEMICONDUCTOR STORAGE DEVICE WITH VOLATILE AND NONVOLATILE MEMORIES TO ALLOCATE BLOCKS TO A MEMORY AND RELEASE ALLOCATED BLOCKS

CROSS-REFERENCE TO RELATED APPLICATIONS

This application is a continuation of and claims the benefit of priority under 35 U.S.C. § 120 from U.S. application Ser. No. 17/083,529 filed Oct. 29, 2020, which is a continuation of U.S. application Ser. No. 16/364,280 filed Mar. 26, 2019 (now U.S. Pat. No. 10,845,992 issued Nov. 24, 2020), which is a continuation of U.S. application Ser. No. 15/617,220 filed Jun. 8, 2017 (now U.S. Pat. No. 10,248,317 issued Apr. 2, 2019), which is continuation of U.S. application Ser. No. 14/822,138 filed Aug. 10, 2015 (now U.S. Pat. No. 9,703,486 issued Jul. 11, 2017), which is a continuation of U.S. application Ser. No. 14/282,242 filed May 20, 2014 (now U.S. Pat. No. 9,134,924 issued Sep. 15, 2015), which is a continuation of U.S. application Ser. No. 13/571,034 filed Aug. 9, 2012 (now U.S. Pat. No. 8,782,331 issued Jul. 15, 2014), which is a division of U.S. application Ser. No. 13/271,838 filed Oct. 12, 2011 (now abandoned), which is a continuation of U.S. application Ser. No. 12/552,330 filed Sep. 2, 2009 (now U.S. Pat. No. 8,065,470 issued Nov. 22, 2011), which is a continuation of PCT Application No. PCT/JP2008/073950 filed Dec. 25, 2008, and claims the benefit of priority under 35 U.S.C. § 119 from Japanese Patent Applications Nos. 2007-339943 filed Dec. 28, 2007 and No. 2008-046227 filed Feb. 27, 2008. The entire contents of each of the above are incorporated herein by reference.

BACKGROUND OF THE INVENTION

1. Field of the Invention

The present invention relates to a semiconductor storage device with a nonvolatile semiconductor memory.

2. Description of the Related Art

Like a NAND type flash memory, a nonvolatile semiconductor memory has a type which, when data is stored therein, once erases data in units called a block and thereafter to perform writing, a type which performs reading and writing in units called a page, and a type in which a unit of erasing, reading, and writing is specified.

On the other hand, a unit, which is used when a host apparatus such as a personal computer performs reading and writing of data from and to a secondary storage device such as a hard disk drive, is called a sector. The sector is determined independently from a unit of erasing, reading, and writing in the nonvolatile semiconductor memory.

For example, whereas a size of a block unit (a block size) in the nonvolatile semiconductor memory is 512 kB and a size of a page unit (a page size) is 4 kB, a size of a sector unit (a sector size) in the host apparatus is 512 B.

In this way, in some cases, the unit of erasing, reading, and writing in the nonvolatile semiconductor memory may be larger than the unit of reading and writing in the host apparatus.

Therefore, when the secondary storage device such as a hard disk drive in a personal computer is comprised using the nonvolatile semiconductor memory, data of the sector size from the personal computer as the host apparatus is required to be conformed to the block size and the page size of the nonvolatile semiconductor memory, and thus, to be written therein.

On the other hand, a flash memory, for example a NAND type flash memory, has characteristics in which the deterioration of memory cells is progressed in accordance with the increasing of the erasing count of the block, which is performed prior to writing of data. And therefore, a process called wear leveling is performed for uniformly distributing data updating positions in the nonvolatile semiconductor memory so that erasing counts of all memory cells in the nonvolatile semiconductor memory become substantially the same.

For example, a logical address of the secondary storage device designated by the host apparatus is translated into a physical address of a nonvolatile semiconductor memory representing the data updating position, whereby the data updating positions are uniformly distributed.

On the other hand, when the above address translation is performed in a large-capacity secondary storage device, if the unit of data management is a small size (for example, a page size), the correspondence list (address translation table or management table) between the logical address and the physical address is enlarged. As a result, the correspondence list does not fit in a main memory of a controller in the secondary storage device, whereby there arises a problem that the address translation cannot be performed at high speed. Therefore, the unit of data management in the secondary storage device is required to have a larger size than a page size, such as a block size.

In order to solve the above problem, there has been known a technique in which another block called a log block is provided so as to correspond to a block (data block) with data stored therein (see Jpn. Pat. Appln KOKAI Publication No. 2002-366423, for example).

In the above technique, data is written in an empty page in the log block, and when there is no empty page in the log block, or when there is not enough log block area, the data stored in the log block is reflected to the data block to improve the writing efficiency.

However, the above technique has a problem that since the data block and the log block have one-to-one correspondences, the number of blocks capable of being simultaneously updated is limited to the number of log blocks.

Namely, when the data of a small size is written in a large number of blocks, the data reflection processing is performed in the state that there are a large number of empty pages in the log block, whereby the writing efficiency is not improved.

In addition, in order to suppress the erasing count of the block, data is sometimes managed in units of the page size smaller than the block size, and the superseding data of the page size may be appended (additionally written) to another erased block.

In this case, since the superseding data of the page size is written in another block, the old data originally stored becomes invalid data. However, when valid data exists in a block including the invalid data, data in the block cannot be erased for reuse.

This is because, the erasing is required to be performed in the block unit, and therefore, when the valid data is stored in the same block, for the purpose of preventing erasing of the valid data, data in the block cannot be erased until the valid data is rewritten in another block.

The existence of the invalid data requires larger storage areas in the nonvolatile semiconductor memory than the amount of the valid data.

However, if the updating of the data progresses in the secondary storage device, the amount of the invalid data increases. And therefore, the data capacity including the invalid data and the valid data becomes large. As a result, these data may not be able to be stored in the storage area in the nonvolatile semiconductor memory.

For the purpose of deleting the invalid data, the process (compaction) in which the valid data collected from blocks is rewritten to an unused block is executed (see Jpn. Pat. Appln KOKAI Publication No. 2005-222550, for example).

BRIEF SUMMARY OF THE INVENTION

A semiconductor storage device according to an aspect of the present invention comprises a first memory area configured in a volatile semiconductor memory which performs writing of data by a first unit or less, the first unit being an access unit to the semiconductor storage device, second and third memory areas configured in a nonvolatile semiconductor memory which performs writing of data by a second unit and performs erasing of data by a third unit, the third unit being twice or larger natural number times as large as the second unit, and a controller executing; a first processing for storing a plurality of data by the first unit in the first memory area; a second processing for storing data outputted from the first memory area by a first management unit in the second memory area, the first management unit being twice or larger natural number times as large as the first unit and being less than the third unit; and a third processing for storing data outputted from the first memory area by a second management unit in the third memory area, the second management unit being twice or larger natural number times as large as the first management unit.

BRIEF DESCRIPTION OF THE SEVERAL VIEWS OF THE DRAWING

FIG. 1 is a diagram showing a first basic configuration;
FIG. 4 is a diagram showing a page management table;
FIG. 5 is a diagram showing a page management table;
FIG. 6 is a diagram showing a block management table;
FIG. 12 is a diagram showing data transfer from the first memory area to a second memory area;
FIG. 17 is a diagram showing a system example;
FIG. 19 is a diagram showing an example of compaction;
FIG. 20 is a diagram showing a configuration of a first embodiment;
FIG. 24 is a diagram showing a page FIFO management table;
FIG. 25 is a diagram showing a physical block management table;
FIG. 31 is a diagram showing a track management table;
FIG. 44 is a diagram showing a state of the second memory area;
FIG. 47 is a diagram for explaining an example of data management unit;
FIG. 50 is a diagram showing an example of SSD;
FIG. 51 is a diagram showing a configuration example of one block;
FIG. 52 is a diagram showing threshold voltage distributions in a memory cell transistor;
FIG. 53 is a diagram showing a configuration example of a drive control circuit.

FIG. 55 is a diagram showing an example of a portable computer; and

DETAILED DESCRIPTION OF THE INVENTION

Figure 2:
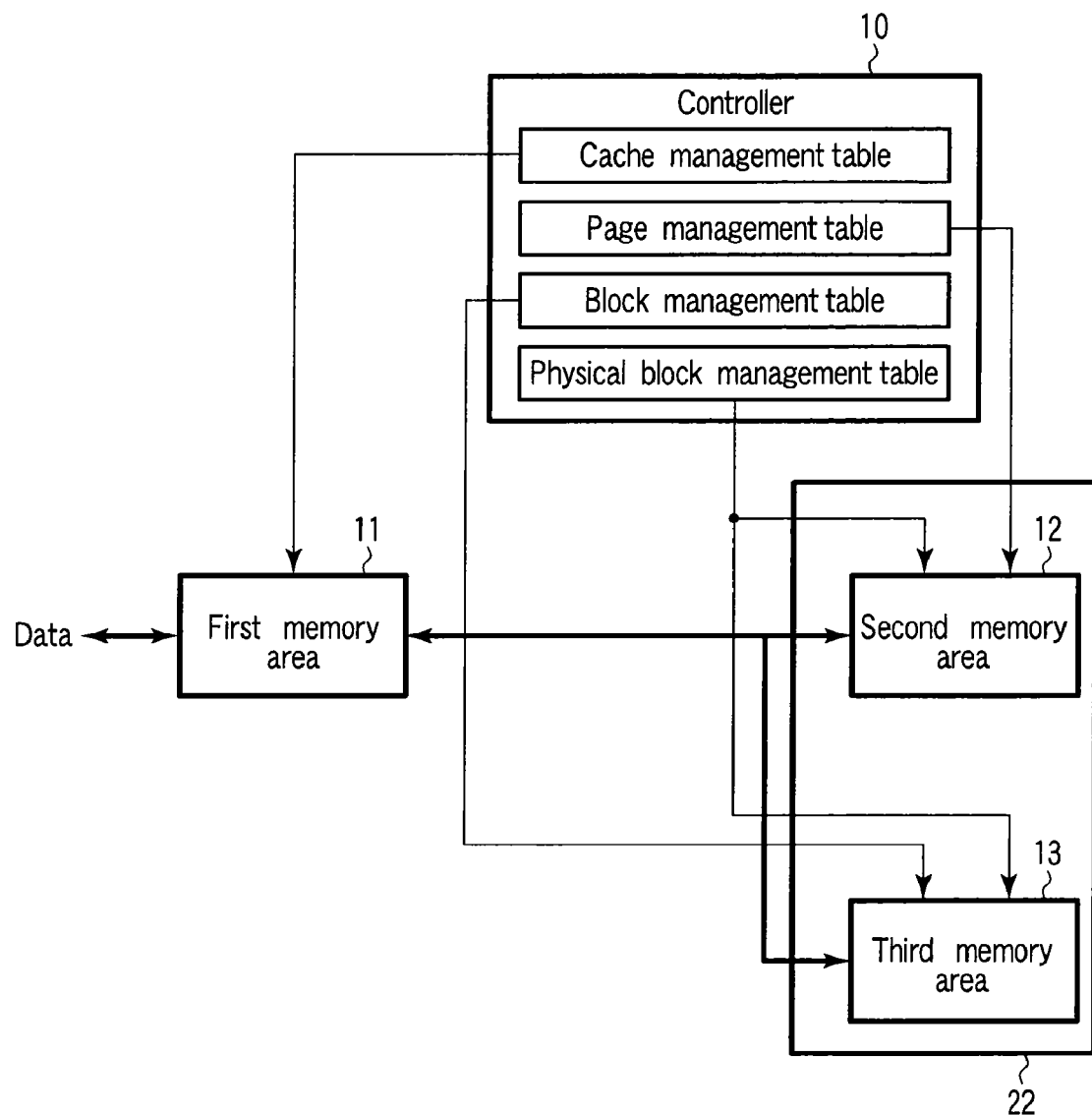
FIG. 2 is a diagram showing a second basic configuration.

Hereinafter, embodiments of the invention will be described with reference to the drawings.

[I. Semiconductor Storage Device for Realizing the Improvement of Writing Efficiency]

1. Outline

A semiconductor storage device according to this embodiment is characterized by storing sector unit data stream from a host apparatus in a first memory area, by distinguishing whether the data stored in the first memory area should be managed with a "small unit (first management unit)" or a "large unit (second management unit)", and by storing "small unit" data and "large unit" data respectively in a second memory area and a third memory area.

In addition, the semiconductor storage device according to this embodiment is characterized by merging "small unit" data stored in the second memory area, into one "large unit" data, and storing the "large unit" data in the third memory area.

A size of the "large unit" is a natural number times as large as a size of the "small unit". In each "small unit" data, a plurality of sector unit data is sequentially arranged in order of logical address. Similarly, in each "large unit" data, a plurality of sector unit data is sequentially arranged in order of logical address.

In other words, the semiconductor storage device according to this embodiment stores a plurality of sector unit data within a range of narrow logical address (fine grained data) by the "small unit" in the second memory area, and stores a plurality of sector data within a range of wide logical address (coarse grained data) by the "large unit" in the third memory area.

Moreover, when a certain quantity of "small unit" data is accumulated in the second memory area, the semiconductor storage device according to this embodiment merges the data into "large unit" data and stores the "large unit" data in the third memory area (Defragmentation).

For example, the case where a size of the "small unit" is equal to a size of a page unit and a size of the "large unit" is equal to a size of a block unit in a NAND-type flash memory can be considered. In other words, sector unit (a first unit) data is stored in the first memory area, page unit (a second unit) data is stored in the second memory area, and block unit (a third unit) data is stored in the third memory area.

In this case, sector unit data transferred from the host apparatus to the semiconductor storage device is first stored in the first memory area. The data stored in the first memory area is determined whether it is transferred to the second memory area or to the third memory area, on the basis of the number of data or the data amount.

Namely, when the data stored in the first memory area satisfies a first condition, the data is managed with the "large unit" and is stored in each block of the third memory area as block unit data. In this case, the writing efficiency does not become lowered, even if block unit data is erased subsidiary to writing.

On the other hand, when the data stored in the first memory area fails to satisfy the first condition, the data is managed with the "small unit" and is stored in each page of the second memory area as page unit data. In this case, the erasing amount of block unit data can be decreased by storing page unit data in appending manner.

The data of the "small unit" equivalent to the page unit stored in the second memory area is further selected based on a second condition. A plurality of data including the selected data is merged into "large unit" data. The "large unit" data is stored in each block of the third memory area as block unit data.

The first condition is defined by the number of data, for example.

Namely, when the number of data stored in the first memory area reaches a predetermined threshold value, the data are transferred to the third memory area, and when the number of data stored in the first memory area does not reach the predetermined threshold value, the data are transferred to the second memory area.

Alternatively, it may be determined whether or not the total number of the data stored in the first and second memory areas reaches a predetermined threshold value. Namely, when the total number reaches the predetermined threshold value, the data are transferred to the third memory area, and when the total number does not reach the predetermined threshold value, the data are transferred to the second memory area.

The second condition is defined by the writing order or the number of the valid data, for example.

When the second condition is defined by the writing order, the data in a block with the earliest writing order detected from among the blocks in the second memory area are sequentially selected, and the selected data are transferred to the third memory area.

When the second condition is defined by the number of valid data, with respect to each block in the second memory area, the number of valid data of the page unit stored in the second memory area is summed in a logical address range at the time when the logical address of valid data in a block is aligned by a size of the block unit, and the valid data in a block with the largest summed value are transferred to the third memory area.

Incidentally, "the logical address is aligned by a predetermined size (such as a size of the page unit or the block unit)" means that the logical address is rounded down to such an address that a reminder when the logical address is divided by the predetermined size is 0. For example, an address calculated by aligning the logical address A by the size S is (A−(a remainder when A is divided by S)). Similarly, "the logical address range aligned by a predetermined size" means that the range of the predetermined size from the address calculated by aligning the logical address by the predetermined size.

The semiconductor storage device according to this embodiment can realize the improvement of the writing efficiency, and the prevention of the performance deterioration and the life shortening, regardless the data size or the data amount from a host apparatus.

Particularly, the effect of this embodiment is most obvious in the case in which the semiconductor storage device is comprised of a nonvolatile semiconductor memory (for example, a NAND type flash memory) with a specified unit of erasing, reading, and writing, and is used as a secondary storage device (SSD: Solid State Drive) for a personal computer.

The capacity of the above semiconductor storage device tends to become larger, and when the increasing of the capacity is realized by MLC (Multi Level Cell) technology in which plural bits are stored in one memory cell, the unit of erasing, reading, and writing tends to become larger, in order to keep a substantial write performance.

In addition, in a personal computer and the like, data on the secondary storage device is often updated by the "small unit". When this data is managed only with the "large unit" such as the block unit, the data erasing amount against the data updating amount becomes larger, whereby the writing efficiency is lowered, and the deterioration of the memory cell is accelerated.

As shown in this embodiment, the data stream from the host apparatus are divided into the "small unit" and the "large unit", and the "small unit" data and the "large unit" data are respectively written in the different memory areas, whereby the possibility of the occurrence of the above problems can be reduced.

In other words, the data erasing amount of the nonvolatile semiconductor memory is optimized against data writing amount from the host apparatus and the writing efficiency is improved, by using two management units, the "small unit" and the "large unit", in the semiconductor storage device.

2. Embodiment

An embodiment of the invention will be described.

The writing efficiency as a concept relating to this embodiment is described.

With regard to the deterioration of memory cells in a flash memory, for example a NAND type flash memory, the erasing amount of block unit data in the flash memory required for the writing data amount from the host apparatus is an important factor.

In this embodiment, the data erasing amount is called a "value of writing efficiency".

If the erasing amount of block unit data against the writing data amount is small, the value of writing efficiency becomes small, and the progression of the deterioration of memory cells is relatively slowed. This phenomenon means that the writing efficiency is improved. On the other hand, if the erasing amount of block unit data is large, the value of writing efficiency becomes large. This phenomenon means that the writing efficiency is deteriorated.

Namely, in order to prevent the deterioration of memory cells in the flash memory, it is important to reduce the erasing amount of block unit data, whereby to improve the writing efficiency.

There will be shown an example in which the writing efficiency in a semiconductor storage device using the flash memory is deteriorated.

In this example, a size of the block unit and a size of the page unit in the flash memory are respectively assumed to be 512 kB and 4 kB, a size of the sector unit of a host apparatus is assumed to be 512 B, and a size of the data management unit is assumed to be 512 kB which is the same as the block unit.

A process upon updating data Y, which has a size of 1 sector and has logical address included in logical address range of data X, is considered in such a state that the data X with the same size as the block unit is stored in the flash memory.

The data X is assumed to be stored in the entirety of a block B1 of the flash memory.

First, the data X from the block B1 is read out onto a temporary storing area, and a part of the data X is superseded with the updating data Y from the host apparatus, whereby the latest data is created. Then, the data in a block B2 different from the block B1 is erased, and the latest data is written in the block B2.

In this process, as above mentioned, it is necessary to read the data X of 512 kB from the block B1 in order to write the data Y of 512 B therein, and further to erase the data of 512 kB in the block B2 in order to write the latest data in the block B2.

Accordingly, the erasing amount in the flash memory is large with respect to the writing data amount from the host apparatus, whereby the writing efficiency is extremely bad.

The value of writing efficiency in this example is 512 kB/512 B=1024.

Usually, in the NAND type flash memory, it takes considerable time for block erasing process and writing process, and therefore, the deterioration of the writing efficiency means that the erasing amount of block unit data and the writing data amount in the erased block are large with respect to the writing data amount from the host apparatus, and, at the same time, means that the rate performance of the semiconductor storage device is deteriorated.

(1) Basic Configuration

FIG. 1 shows a first basic configuration of the semiconductor storage device according to this embodiment.

A first memory area 11 temporarily stores data from a host apparatus. The data is written by a sector unit (a first unit) in the first memory area 11. The first memory area 11 is configured in a volatile semiconductor memory such as a DRAM (Dynamic Random Access Memory), for example.

The physical unit of reading/writing in a volatile semiconductor memory which comprises the first memory area 11 is the sector unit or less. The host apparatus executes an access to the semiconductor storage device using a logical address with the sector unit (LBA: Logical Block Addressing). Therefore, the first memory area 11 manages an input data with the sector unit.

A second memory area is composed of blocks in a nonvolatile semiconductor memory, for example, a NAND type flash memory. A third memory area is composed of blocks in a nonvolatile semiconductor memory, for example, a NAND type flash memory.

The second and third memory areas 12 and 13 are respectively configured in separate nonvolatile semiconductor memories (memory chips). Each memory chip may have different performance, such as writing performance, or may have different storage capacity. For example, the second memory area 12 may be configured in a NAND type flash memory with the SLC (Single level cell) technology, the third memory area 13 may be configured in a NAND type flash memory with the MLC (Multi level cell) technology.

The unit in which reading/writing is executed at one time is a page (a second unit) and the unit in which erasing is executed at one time is a block (a third unit), in the nonvolatile semiconductor memory. One block unit is composed of a plurality of page units. In addition, the nonvolatile semiconductor memory according to this embodiment does not permit to rewrite in the same page unless data in the block including the page is once erased.

Therefore, if superseding data (new data) is inputted from the host apparatus, old data originally stored in the block, having the same logical address as the new data, is treated as invalid data. The new data is treated as valid data which has priority over the old data, and the old data is treated as invalid data which is ignored by referring to the new data.

To simplify the explanation, each of the units is assumed below:

A size of the "small unit (first management unit)" which is a data management unit in the semiconductor storage device is equal to a size of the page unit (a storable data amount in one page). A size of the "large unit (second management unit)" is equal to a size of the block unit (a storable data amount in one block). A size of the "small unit" is a natural number times as large as a size of the sector unit.

The first, second and third units representing a size of data do not include a redundant data (ECC: Error Checking/ Correcting Code, internal control flag, etc.) which is added in the semiconductor storage device to main data from the host apparatus.

In general, the system including the nonvolatile semiconductor memory, for example a NAND type flash memory, executes reading/writing in the state of adding the redundancy data to the main data. But, for simplifying the explanation, each of the units is assumed above.

The second memory area 12 stores data transferred from the first memory area 11 by the "small unit" which is equal to the page unit. The third memory area 13 stores data transferred from the first memory area 11 or the second memory area 12 by the "large unit" which is equal to the block unit.

The second memory area 12 may have a capacity smaller than the capacity of the third memory area 13 because of controlling only part of data updated by "small unit".

The following description, one block unit data is entirely stored in one block, and one page unit data is entirely stored in one page. Each block is comprised of plural pages, and a plurality of page unit data is stored in one block.

A controller 10 has a CPU and a main memory, and can operate a program for executing data management. In this embodiment, the functions realized by the controller 10 can be implemented as any of hardware and software or the combination of the both. Whether these functions are implemented as hardware or software depends on the practical embodiment or the design constraints imposed on the entire system. Those skilled in the art can implement these functions by various methods for each practical embodiment, and the scope of the present invention includes determination of the implementation.

The controller 10 has, in the main memory, a cache management table, a page management table, a block management table, and a physical block management table, in order to manage where data accessed by the logical address is stored in the first, second and third memory areas 11, 12, and 13.

When the main memory of the controller 10 is comprised of a volatile semiconductor memory such as a DRAM, the first memory area 11 may be configured in the main memory of the controller 10.

FIG. 2 shows a second basic configuration of the semiconductor storage device according to this embodiment.

The second basic configuration is different in the following points from the first basic configuration of FIG. 1.

The second and third memory areas 12 and 13 are configured in a nonvolatile semiconductor memory 22. The volatile semiconductor memory comprising the first memory area 11 is assumed to be a DRAM, and the nonvolatile semiconductor memory 22 comprises the second and third memory areas 12 and 13 is assumed to be a NAND type flash memory, for example.

The second and third memory areas 12 and 13 are configured so as to share a storage area in the nonvolatile semiconductor memory 22, and the controller 10 allocates blocks in the nonvolatile semiconductor memory 22 to the second memory area 12 or the third memory area 13. The allocation to the second and third memory areas 12, 13 is not static, but also dynamic. The allocation to the second and third memory areas 12, 13 is controlled by the controller 10. The second and third memory areas 12 and 13 may be configured over a plurality of nonvolatile semiconductor memories (memory chips). The controller 10 may treats whole plural blocks in nonvolatile semiconductor memories as one abstracted storage region.

The controller 10 has, in the main memory, a cache management table, a page management table, a block management table, and a physical block management table.

In FIG. 1 and FIG. 2, these management tables are stored in a nonvolatile semiconductor memory in the state of no power supply to the semiconductor storage device. The controller 10 reads out these management tables onto the main memory in the time of the power supply. The controller 10 executes address translation in order to correlate the logical address space designated from the host apparatus with the physical position of the data in the nonvolatile semiconductor memory.

—Cache Management Table—

Figure 3:
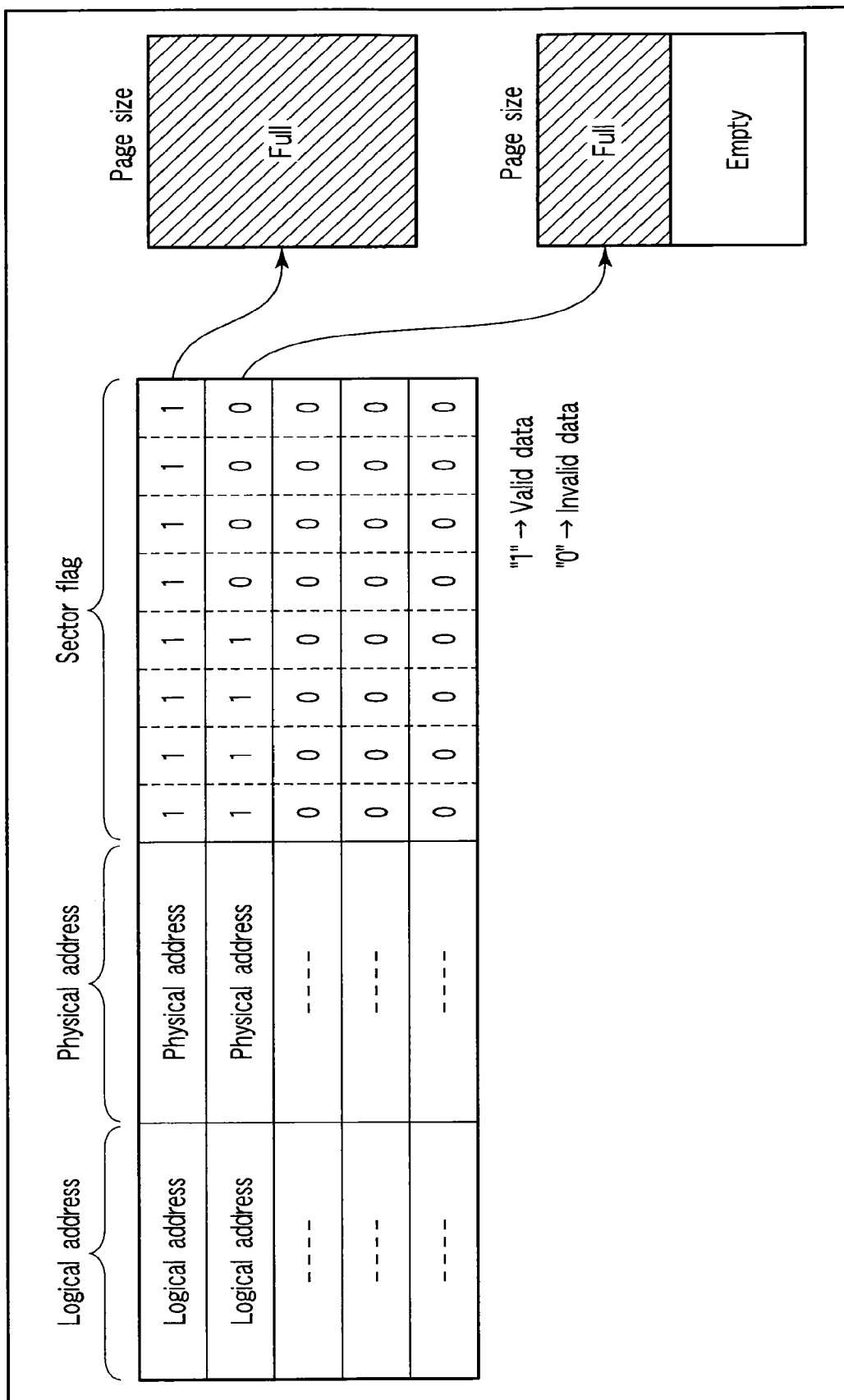
FIG. 3 is a diagram showing a cache management table.

FIG. 3 shows an example of a cache management table. The cache management table controls data stored in the first memory area 11 of FIGS. 1 and 2 by the "small unit" which is equal to the page unit. The control of the valid data is executed by the sector unit.

It is assumed that one entry is assigned to one area of one page unit in the first memory area 11.

The number of entries is assumed to be the number of page unit data which can be contained within the first memory area 11, that is, not larger than (the total capacity of the first memory area 11)/(a size of the page unit).

A logical address of page unit data, a physical address of the first memory area 11, and a sector flag indicating the location of the valid data in the relevant area of the page unit are associated with each entry.

The area of the page unit for temporarily storing data corresponded to each entry is provided in the first memory area 11, and the physical address of the area is stored in each entry. If the physical address of the area corresponding to the entry is specified, such as if the areas of the page unit are continuously disposed, the physical address is not required to be stored in the entry.

The each area of the page unit in the first memory area 11 is further divided into areas of the sector unit in the cache management table. A data status in each area of the sector unit is represented by setting the value of the sector flag as "1" or "0".

In an area with the sector flag of "1", valid data from the host apparatus is stored. In an area with the sector flag of "0", the latest data written from the host apparatus is not stored, whereby the area is treated as an invalid area. The entry in which all the sector flags are "0" is regarded to be an unused entry.

The configuration of the above cache management table is based on a control method called a full associative method in which the logical address is assigned to each entry. However, the correspondence between the logical address and the physical address in the first memory area 11 may be controlled by an n-way set associative method or the like.

—Page Management Table—

FIG. 4 shows an example of a page management table. The page management table controls data stored in the second memory area 12 of FIGS. 1 and 2 by the "small unit" which is equal to the page unit.

It is assumed that one entry is assigned to one area of one page unit in the second memory area 12.

The number of entries is assumed to be the number of page unit data which can be contained within the second memory area 12, that is, not larger than (the total capacity of the second memory area 12)/(a size of the page unit).

A logical address of page unit data and a physical address of the second memory area 12 are associated with each entry.

For example, one page unit data with the physical address A is stored in the first page of the block 0 in the second memory area 12 designated by the physical address A, and one page unit data with the physical address C is stored in the second page of the block 1 in the second memory area 12 designated by the physical address C. An invalid entry is represented, for example, by means of providing a flag indicating the validity or invalidity of the entry, or storing an invalid logical address or an invalid physical address in the entry.

FIG. 5 shows another example of a page management table. The page management table in FIG. 5 is explained later.

—Block Management Table—

FIG. 6 shows an example of a block management table. The block management table controls data stored in the third memory area 13 of FIGS. 1 and 2 by the "large unit" which is equal to the block unit.

It is assumed that one entry is assigned to one area of one block unit in the third memory area 13.

The number of entries is assumed to be the number of block unit data which can be contained within the third memory area 13, that is, not larger than (the total capacity of the third memory area 13)/(a size of the block unit).

Each entry is arranged in order of a logical address. A physical address which corresponds to a logical address of the block unit data and designates a block in the third memory area 13 is associated with each entry. The invalid entry is represented, for example, by means of providing a flag indicating the validity or invalidity of the entry, or storing an invalid physical address in the entry.

—Physical Block Management Table—

Figure 7:
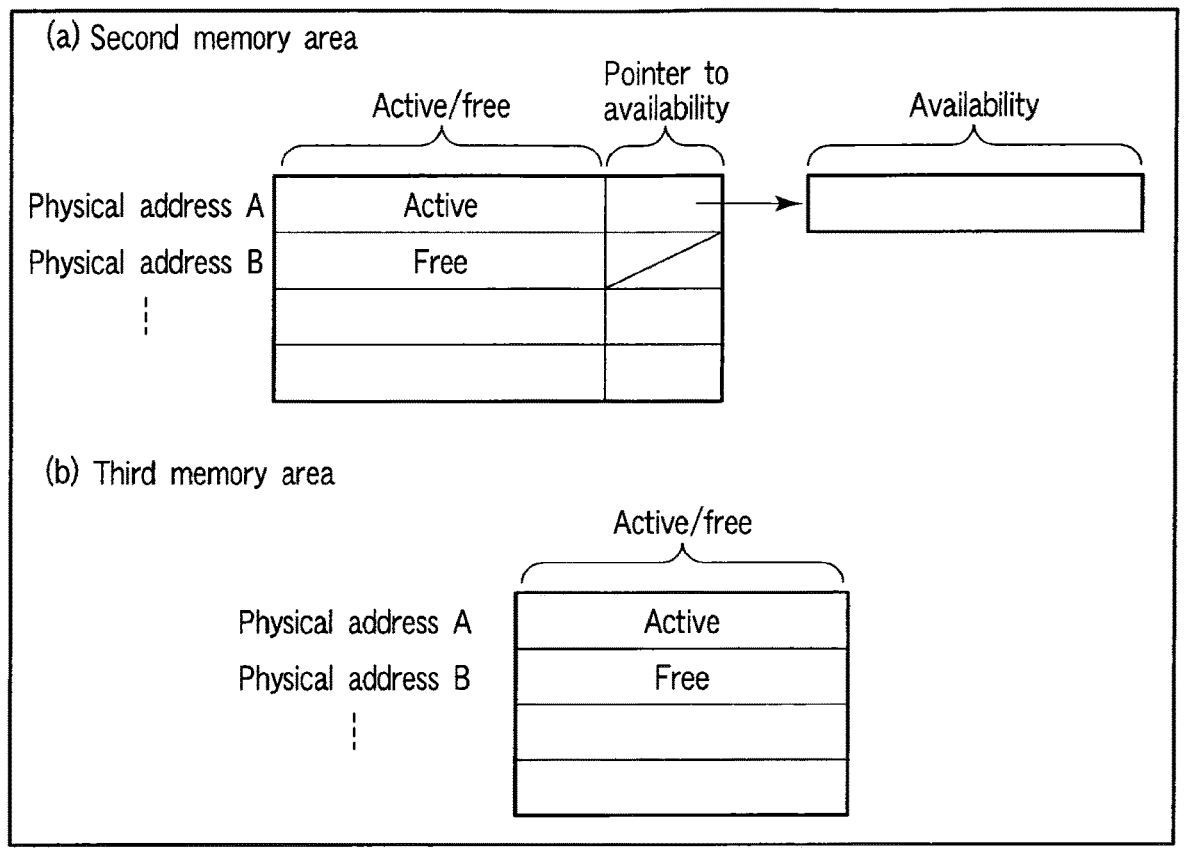
FIG. 7 is a diagram showing a physical block management table.
Figure 8:
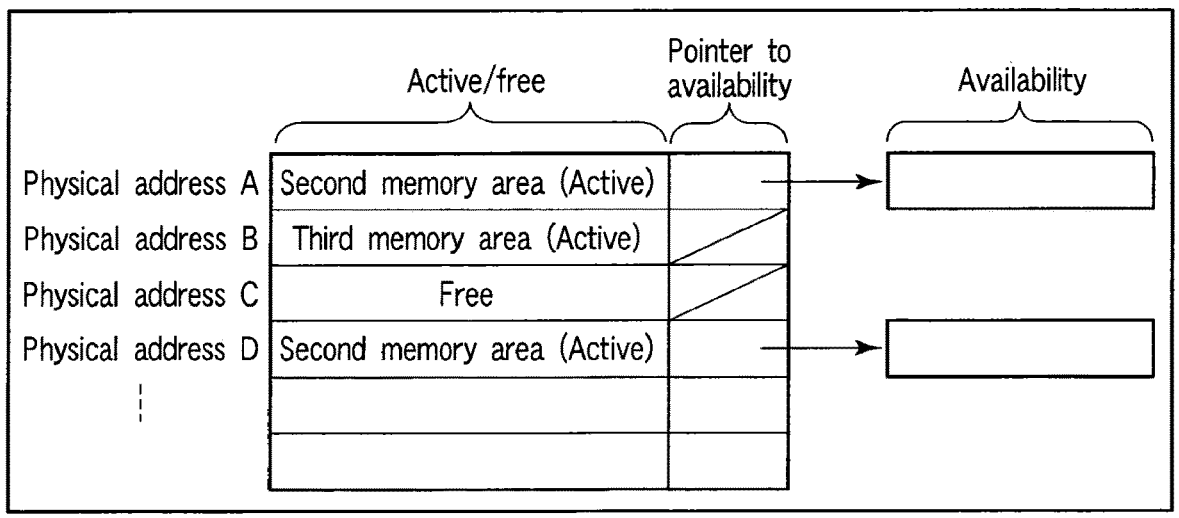
FIG. 8 is a diagram showing a physical block management table.

FIGS. 7 and 8 show examples of a physical block management table.

The physical block management table of FIG. 7 is used in the first basic configuration and controls the usage (active/free) of blocks in the second and third memory areas 12 and 13 of FIG. 1. As shown in FIG. 7(a), a pointer to availability is stored in the physical block management table for the second memory area 12, and the physical block management table controls the availability of pages in a block.

As shown in FIG. 7(b), in order to save the storage area, the availability of a page is not controlled by the physical block management table for the third memory area 13.

The physical block management table of FIG. 8 is used in the second basic configuration and controls whether the storage area (block) in the nonvolatile semiconductor memory 22 of FIG. 2 is used as the second memory area 12 (active), is used as the third memory area 13 (active), or is unused (free: no valid data exists therein). When the storage area is used as the second memory area 12, the physical block management table controls the availability of a page associated therewith.

It is assumed that one entry is assigned to one block (physical block) in the second and third memory areas 12, 13.

The number of entries is assumed to be not larger than the number of blocks which can be used as a data area.

A physical address and the usage of a block designated by the physical address are associated with each entry, and for the blocks used in the second memory area 12, the availability of pages are managed.

The page availability is configured to be able to distinguish "write-enable" state (this storage area is empty) from "write-inhibit" state (this storage area is invalid because old data has once written therein and new data is rewritten in another storage area) for each page.

In data writing sequence to each page, if a nonvolatile semiconductor memory can only perform writing of data in the ascending order of the physical address, the page availability is managed by storing a position of an empty page in which data can be appended in a block.

As the availability of pages in a block for the second memory area 12, the data structure shown in FIG. 4 that manages empty pages in a block is adopted, for example.

In this embodiment, the page availability is stored in the physical block management table; however, as shown in FIG. 5, it may be stored in the page management table. In this case, the page management table is partitioned into units of a physical block used for the second memory area 12, and stores the logical address together with the page availability.

In the above description, for simplifying of the explanation, the "small unit (first management unit)" used in the second memory area 12 is assumed to be the page unit, the "large unit (second management unit)" used in the third memory area 13 is assumed to be the block unit; however, the management units are not limited to this settings.

It is important that, in a nonvolatile semiconductor memory such as a NAND type flash memory, which comprises a secondary storage device as a substitute for a hard disc drive (magnetic disk apparatus), the unit of erasing, reading, and writing, is specified.

For example, a page is controlled by being divided, specifically, a size of the "small unit" used in the second memory area 12 may be a natural number times as large as a size of the sector unit and a size of the page unit may be twice or larger natural number times as large as a size of the "small unit".

Alternatively, plural pages are collectively controlled, specifically, a size of the "small unit" used in the second memory area 12 may be twice or larger natural number times as large as a size of the page unit and a size of the block unit may be twice or larger natural number times as large as a size of the "small unit".

Likewise, a block is controlled by being divided, specifically, a size of the "large unit" used in the third memory area 13 may be twice or larger natural number times as large as a size of the "small unit" and a size of the block unit may be twice or larger natural number times as large as a size of the "large unit".

Alternatively, plural blocks are collectively controlled, specifically, a size of the "large unit" used in the third memory area 13 may be twice or larger natural number times as large as a size of the block unit.

The unit of erasing in the second and third memory areas 12 and 13 may be the same (for example, the block size), or may be different by simultaneously erasing plural blocks, and so on.

(2) Process Method

The process executed by the controller 10 of FIGS. 1 and 2 is described.

A. Data Store Process in the First Memory Area

Figure 9:
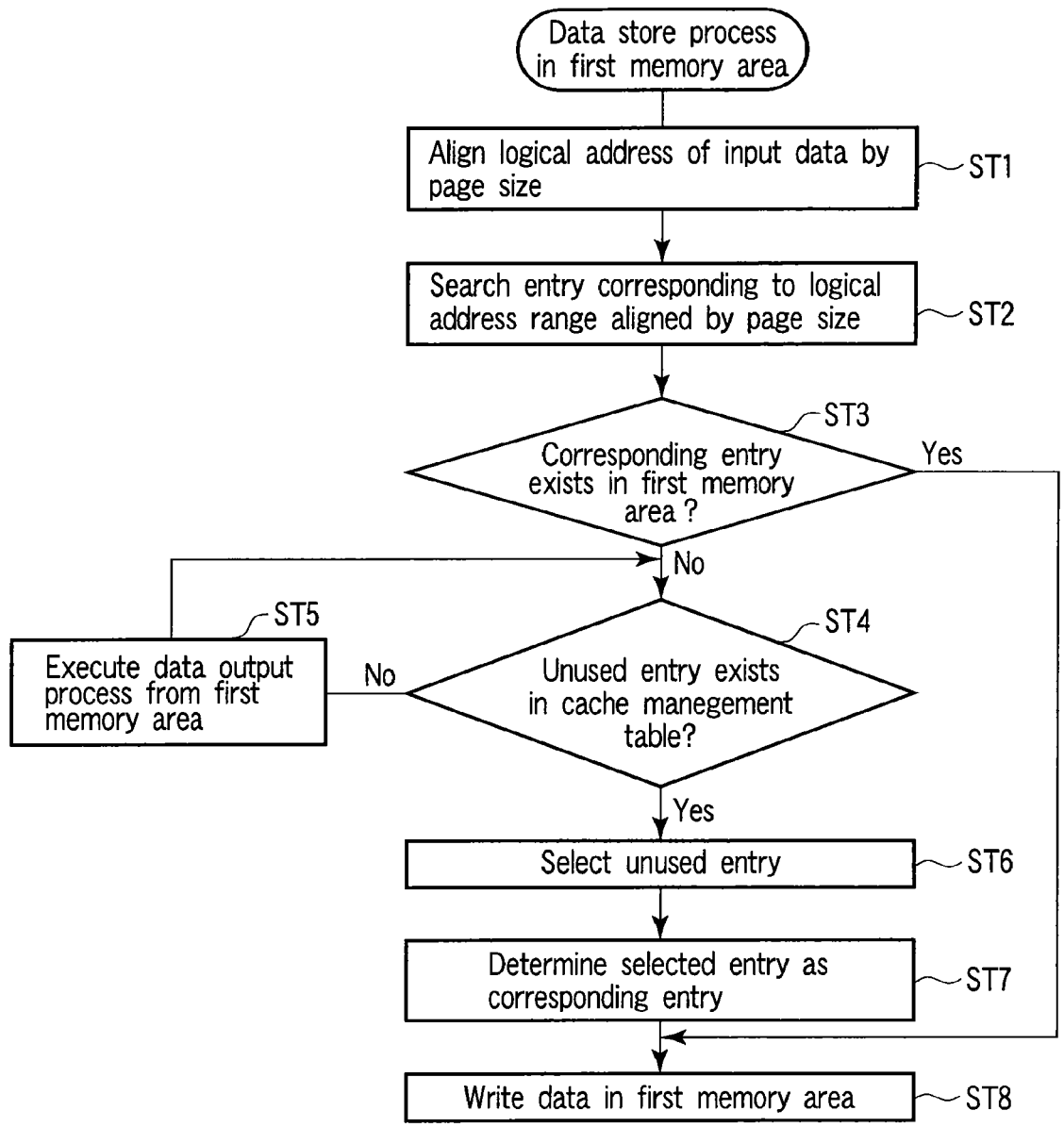
FIG. 9 is a flowchart showing a data store process in a first memory area.

The data store process in the first memory area 11 is described with reference to FIG. 9.

The input data from the host apparatus is first written in the first memory area 11 and the data is stored in the first memory area 11 for a certain period. At that time, the cache management table of FIG. 3 is updated.

1. The controller 10 aligns the logical address of the input data by a size of the "small unit" which is equal to the page unit (Step ST 1).
2. The controller 10 searches the entry corresponding to the logical address range aligned by a size of the page unit from the cache management table (Step ST2).
3. The controller 10 judges whether there exists corresponding entry in the first memory area 11. If the corresponding entry is detected in the first memory area 11, the controller 10 selects this entry and this process goes to the step ST 8. If the corresponding entry is not detected in the first memory area 11, this process goes to the step ST4.
4. The controller 10 searches the cache management table and judges whether there exists an unused entry (Step ST4). If the unused entry is detected, this process goes to the step ST 6. If the unused entry is not detected, this process goes to the step ST 5.
5. The controller 10 executes "data output process from the first memory area" which is described next. Whereby, the data is outputted from the first memory area 11 to the second memory area 12 and the third memory area 13 (Step ST5). As a result, the entry in the cache management table corresponding to the outputted data is set to be an unused entry. At that time, all sector flags in this entry are set to be "0". After finishing the settings, this process returns to the step ST4.
6. The controller 10 selects the unused entry for the input data from the host apparatus (Step ST6).
7. The controller 10 sets the logical address obtained by aligning the logical address of the input data by a size of the page unit to the selected entry (Step ST7). Namely, the controller 10 determines the selected entry as the entry corresponding to the input data.
8. The controller 10 determines the physical address for data writing based on the logical address of the input data and the logical address and the physical address of the selected entry. The controller 10 instructs the volatile semiconductor memory including the first memory area 11 to write the input data in the area designated by the physical address (Step ST8).

In addition, the controller 10 sets the sector flags, corresponding to the data written position in the area of the page unit, to be "1".

In the case where the input data from the host apparatus is larger than the page size, plural entries in the cache management table may be required. In such a case, the controller 10 updates the plural entries by repeating the above process.

B. Data Output Process from the First Memory Area

The data output process from the first memory area 11 is described with reference to FIGS. 10 and 11.

The controller 10 selects page unit data which will be outputted from the first memory area 11 and transfers the data to the second memory area 12 or the third memory area 13 in accordance with a first condition. For example, the first condition is defined by the number of data. Specifically, the controller 10 executes following process (a) or process (b).

(a). The controller 10 counts the number of data in the first memory area 11 and determines to manage the data with either the "large unit" which is equal to the block unit or the "small unit" which is equal to the page unit.

1. The controller 10 aligns a logical address LA of page unit ("small unit") data, which will be outputted, by a size of the block unit ("large unit") (Step ST1).
2. The controller 10 counts up the number of entries included in the logical address range of a size of the block unit by searching the cache management table of FIG. 3 (Step ST2).

For example, according to the example of FIG. 12, the number of entries included in the logical address range X aligned by a size of the block unit is 3, that is, LA1, LA4, and LA6.

3. The controller 10 judges whether the number of entries is a predetermined threshold value or more. For example, the predetermined threshold value may be set to be 50% of the total number of page unit ("small unit") data storable in one area of the block unit ("large unit") (Step ST3).

If the number of entries is less than the predetermined threshold value, the controller 10 transfers each data included in the logical address range to the second memory area 12 as data of the "small unit" which is equal to the page unit.

If the number of entries is not less than the predetermined threshold value, the controller 10 transfers a plurality of data included in the logical address range to the third memory area 13 as data of the "large unit" which is equal to the block unit.

Figure 10:
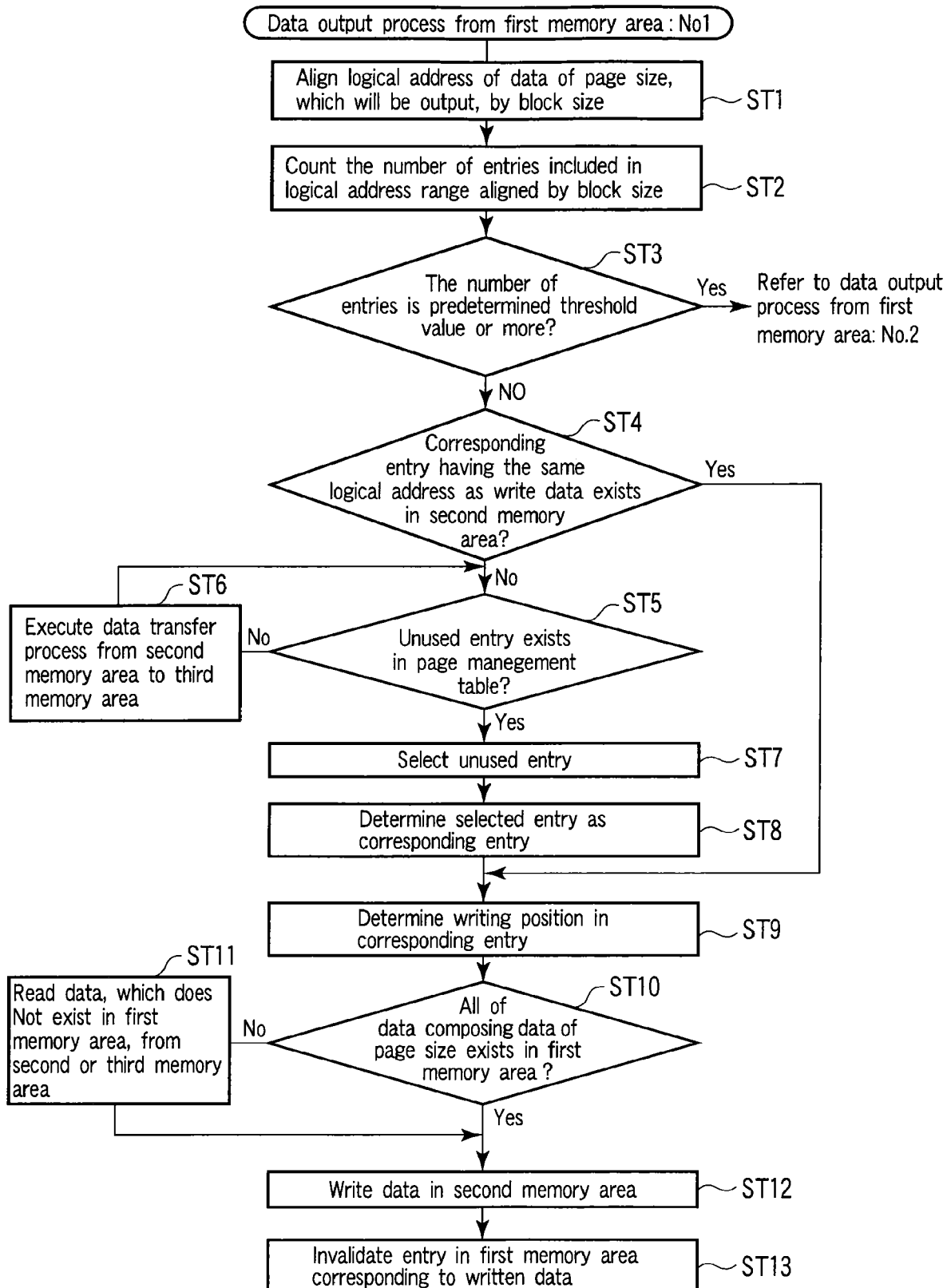
FIG. 10 is a flowchart showing a data output process from a first memory area.

"Small unit" case (see, the flowchart of FIG. 10 and FIG. 12)

The controller 10 selects the data to be outputted from the first memory area 11 and transfers the selected data to the second memory area 12 as data of the page unit. The steps on and after the step ST4 in FIG. 10 are referred.

Hereinafter, a process in the case where one page unit data is transferred from the first memory area 11 is described. When plural page unit data are transferred, the following process is repeated.

4. The controller 10 searches the page management table of FIG. 4 and judges whether there exists an entry having the same logical address LA as writing data to be transferred from the first memory area 11 (Step ST4).

If such an entry is detected, the controller 10 selects this entry and this process goes to the step ST9. If such an entry is not detected, this process goes to the step ST5.

5. The controller 10 judges whether there exists an unused entry in the page management table (Step ST5).

If the unused entry is detected, this process goes to the step ST7. If the unused entry is not detected, this process goes to the step ST6.

6. The controller 10 executes "data transfer process from the second memory area to the third memory area" (Step ST6). As a result, the entry corresponding to outputted data is set to be an unused entry. The controller 10 obtains an available unused entry and this process returns to the step ST5.
7. The controller 10 selects an unused entry as the destination of the writing data (Step ST7).
8. The controller 10 sets the logical address of the writing data of the page unit to the selected entry (Step ST8). The selected entry is to be treated as the entry corresponding to the writing data.
9. The controller 10 determines a writing position in the selected entry (Step ST9). The process for determining the writing position is described below.

9-1. The controller 10 searches the physical block management table of FIG. 7 or FIG. 8 and selects a block having an empty page with "write-enable" state used in the second memory area 12. If such a block is detected, the controller 10 selects an empty page in the block as the destination of the writing data (Step ST9-1).

In the writing of data by the page unit, if the nonvolatile semiconductor memory comprising the second memory area 12 can only perform writing of data in the ascending order of the physical address, the controller 10 selects an empty page in which data can be appended.

If the empty page is detected in the block used in the second memory area 12, this process goes to the step ST10. If the empty page is not detected in the block used in the second memory area 12, this process goes to the step ST9-2.

9-2. The controller 10 searches the physical block management table of FIG. 7 or FIG. 8 and judges whether there exists a free block (Step ST9-2). If the free block is detected, this process goes to the step ST9-4. If the free block is not detected, this process goes to the step ST9-3.

9-3. The controller 10 executes the "data transfer process from the second memory area to the third memory area" in order to create a free block (Step ST9-3). After creating the free block, this process returns to the step ST9-2.

9-4. The controller 10 gets the free block for the second memory area 12 (Step ST9-4).

9-5. The controller 10 updates the entry of the physical block management table of FIG. 7 or FIG. 8 corresponding to the obtained free block to "second memory area 12 (active)". In the second basic configuration (FIG. 8), the controller 10 acquires an area for storing the page availability, and the area is associated with the entry (Step ST9-5).

9-6. The controller 10 instructs the nonvolatile semiconductor memory to erase data in the obtained free block, and updates all the page availability to "write-enable" state. The controller 10 selects one of empty pages in the block as the destination of the writing data (Step ST9-6).

The process for determining the writing position is completed with above description.

10. The controller 10 judges whether all of sector unit data composing page unit data exist in the first memory area 11 (Step ST10).

The controller 10 scans sector flags of the entry corresponding to the writing data in the cache management table of FIG. 3. If all the sector flags are "1", this process goes to the step ST12. If any of the sector flags is "0", this process goes to the step ST11.

11. If any of the sector flags is "0", not all sector unit data are completed in the first memory area 11. Therefore, the controller 10 collects missing data corresponding to the sector position with the sector flag "0" from the second memory area 12 and/or the third memory area 13 (Step ST11).

The controller 10 attempts to read out the missing data from the second memory area 12.

The controller 10 aligns a logical address of sector unit data by a size of the page unit and searches the page management table at the aligned logical address.

If the entry is detected, the controller 10 reads out the missing data included in page unit data corresponding to the physical address recorded in the entry. If the entry is not detected, the controller 10 attempts to read out the missing data from the third memory area 13.

The controller 10 aligns a logical address of sector unit data by a size of the block unit and searches the block management table at the aligned logical address.

If the entry is detected, the controller 10 reads out the missing data included in block unit data corresponding to the physical address recorded in the entry.

The missing data read out from the second memory area 12 or the third memory area 13 is temporarily stored in a work area of the first memory area 11 or the main memory of the controller 10; however, it is not limited to this.

12. After completing all sector unit data composing page unit data, the controller 10 instructs the nonvolatile semiconductor memory to write the page unit data in the empty page selected as the destination of the writing data in the second memory area 12. The controller 10 updates the corresponding page availability in the physical block management table to "written" state (full: this storage area is filled with valid data) (Step ST12).

After writing the page unit data, the controller 10 registers the logical address of the writing data and the physical address of the page as the destination of the writing data in the selected entry of the page management table.

If a physical address is already stored in the selected entry before registering a new physical address, the controller 10 overwrites the physical address. The old data which is stored in the page indicated by the old physical address becomes invalid data.

13. The controller 10 updates the cache management table of FIG. 3. The entry corresponding to the writing data is rendered invalid state and released for input data from the host apparatus (Step ST13).

Subsequently, the controller 10 scans the physical block management table of FIG. 7 or FIG. 8 and the page management table of FIG. 4, and executes a release process for setting an "active" block, in which all page unit data are invalid data, to be a "free" block.

Specifically, an entry corresponding to a block which is set to be "active" in the physical block management table and in which a page indicated by a physical address in the page management table does not exist is set to be "free". In the configuration of FIG. 8, the area for storing the page availability is released.

Figure 11:
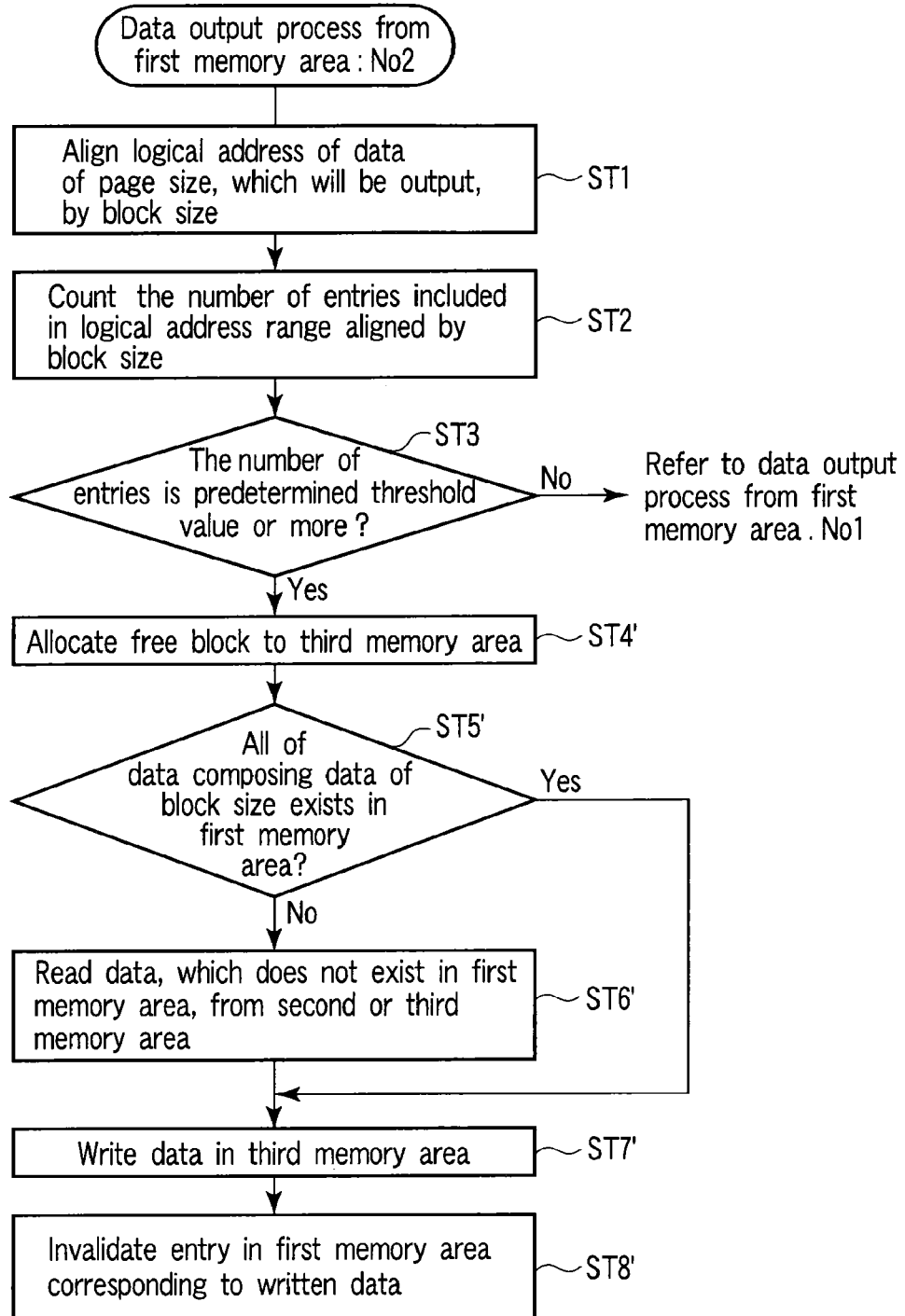
FIG. 11 is a flowchart showing a data output process from a first memory area.
Figure 13:
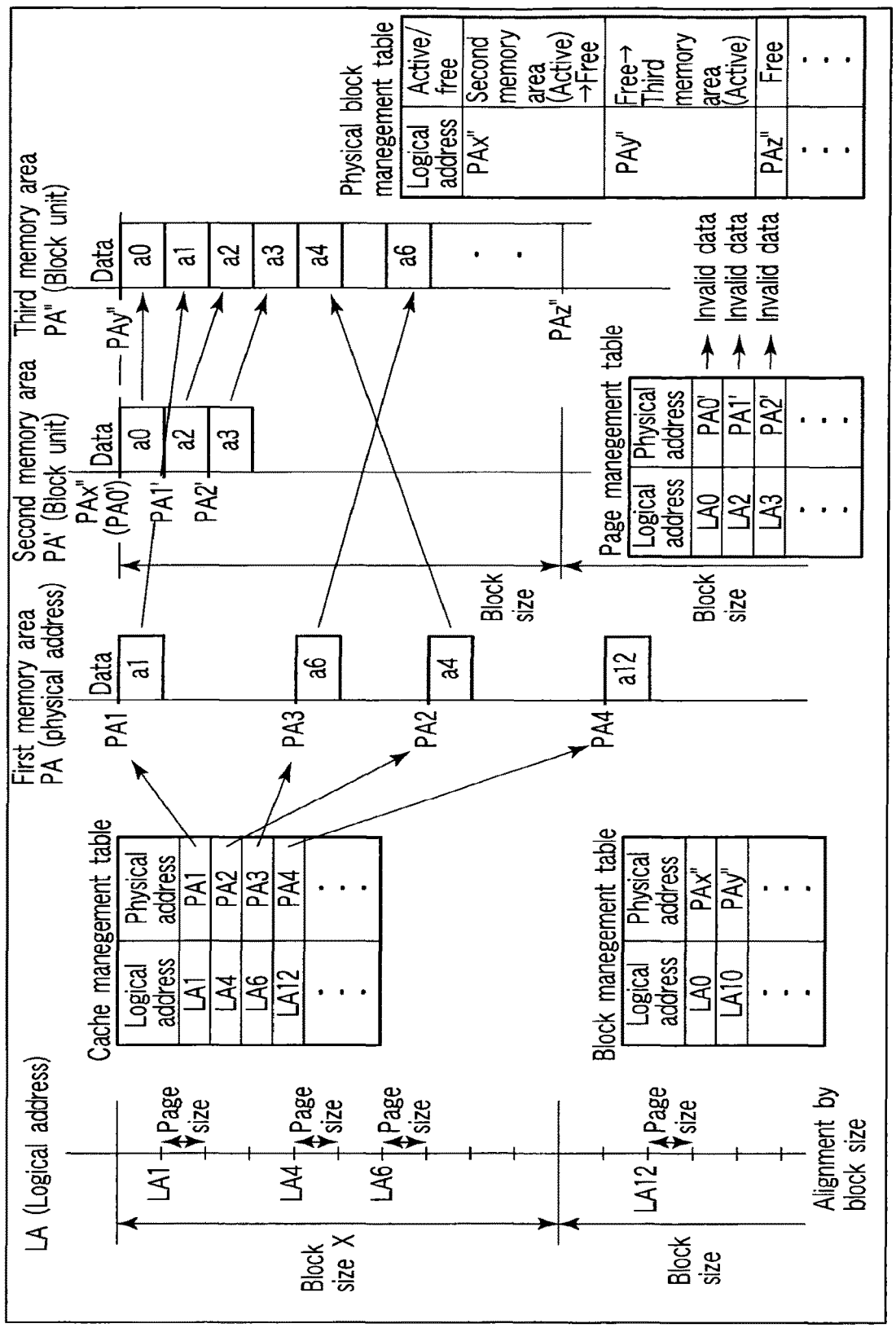
FIG. 13 is a diagram showing data transfer from the first memory area to a third memory area.
Figure 14:
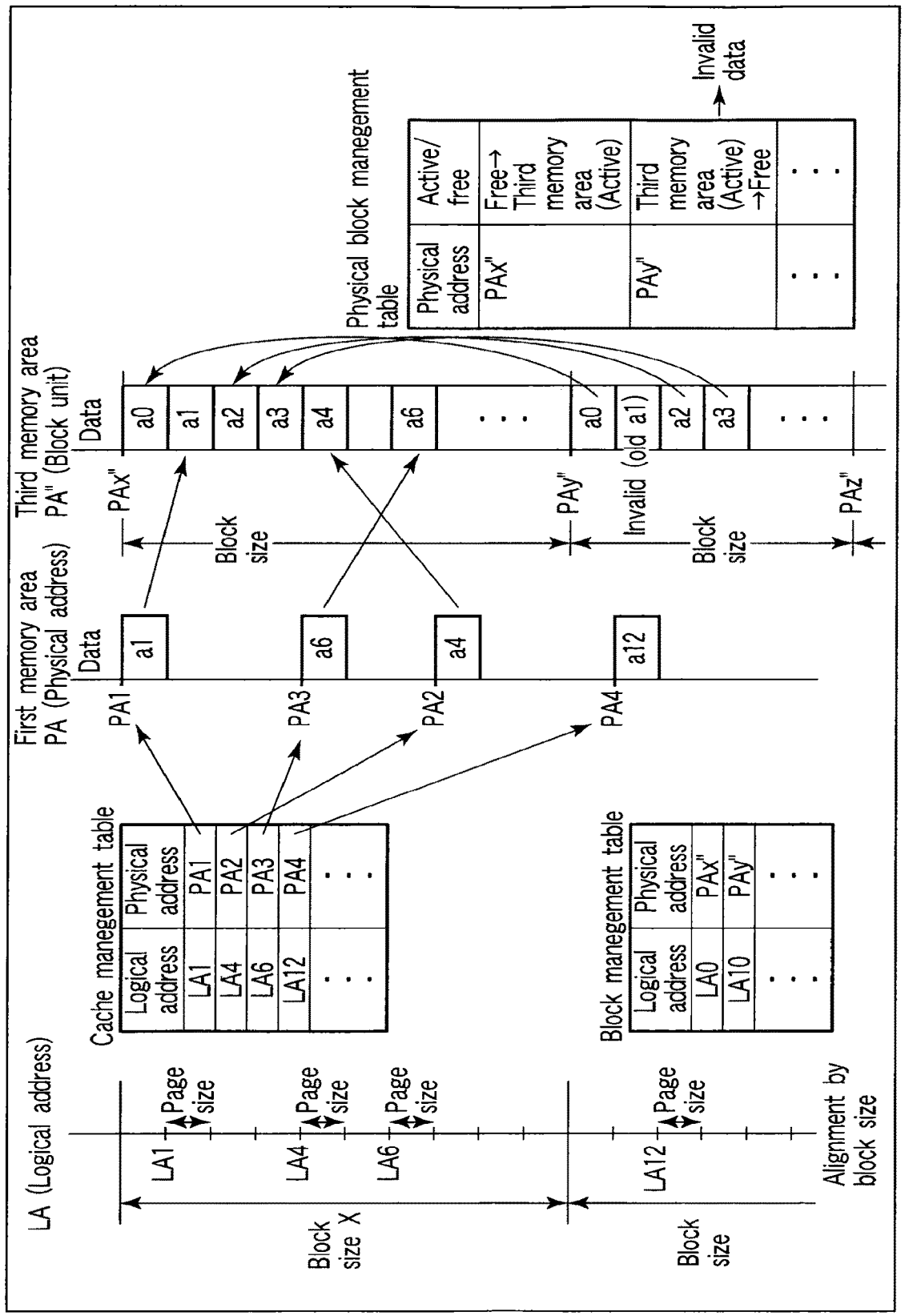
FIG. 14 is a diagram showing data transfer from the first memory area to the third memory area.

"Large Unit" Case (See, a Flowchart of FIG. 11, FIG. 13, and FIG. 14)

The controller 10 selects the data to be outputted from the first memory area 11 and transfers the selected data to the third memory area 13 as data of the block unit. The steps on and after the step ST4' in FIG. 11 are referred.

4'. The controller 10 searches the physical block management table of FIG. 7 or FIG. 8 and gets a free block. The controller 10 allocates the obtained free block to the third memory area 13 (Step ST4').

The controller 10 updates the entry of the physical block management table corresponding to the obtained free block to "third memory area 13 (active)" and instructs the nonvolatile semiconductor memory to erase data in the obtained free block.

If a size of the "large unit" is less than a size of the block unit, the controller 10 may select a block having an empty area of the "large unit" with "write-enable" state used in the third memory area 13, as the "small unit" case.

5'. The controller 10 judges whether all of sector unit data composing block unit data exist in the first memory area 11 (Step ST5').

Specifically, the controller 10 judges whether the cache management table of FIG. 3 includes all entries corresponding to page unit data included in the logical address range of a size of the block unit, and, at the same time, judges whether all the sector flags of these entries are "1".

If all of sector unit data composing block unit data are completed in the first memory area 11, this process goes to the step ST7'. If not all entries corresponding to page unit data included in the logical address range are detected, and/or any of the sector flags is "0", this process goes to the step ST6'.

6'. The controller 10 collects the missing data corresponding to the page position which is not included in the cache management table and the sector position with the sector flag "0" from the second memory area 12 and/or the third memory area 13 (Step ST6').

The controller 10 attempts to read out the missing data from the second memory area 12, as shown in FIG. 13.

The controller 10 aligns a logical address of sector unit data by a size of the page unit and searches the page management table at the aligned logical address.

If the entry is detected, the controller 10 reads out the missing data included in page unit data corresponding to the physical address recorded in the entry.

If the entry is not detected, the controller 10 attempts to read out the missing data from the third memory area 13, as shown in FIG. 14.

The controller 10 aligns a logical address of sector unit data by a size of the block unit and searches the block management table at the aligned logical address. The controller 10 reads out the missing data included in block unit data corresponding to the physical address recorded in the entry.

The missing data read out from the second memory area 12 or the third memory area 13 is temporarily stored in a work area of the first memory area 11 or the main memory of the controller 10; however, it is not limited to this.

7'. After completing all sector unit data composing block unit data, the controller 10 instructs the nonvolatile semiconductor memory to write the block unit data in the empty block selected as the destination of the writing data in the third memory area 13 (Step ST7').

After writing the block unit data, the controller 10 registers the physical address of the block as the destination of the writing data in the entry of the block management table corresponding to the logical address range of a size of the block unit.

If a physical address is already stored in the selected entry before registering a new physical address, the controller 10 overwrites the physical address. The old data which is stored in the block indicated by the old physical address becomes invalid data. 8'. The controller 10 updates the cache management table of FIG. 3. The entry corresponding to the writing data is rendered invalid state and released for input data from the host apparatus (Step ST8').

Subsequently, the controller 10 scans the physical block management table of FIG. 7 or FIG. 8 and the block management table of FIG. 6, and executes a release process for setting an "active" block, in which block unit data is invalid, to be a "free" block.

Specifically, an entry corresponding to a block which is set to be "active" in the physical block management table and which is not indicated by a physical address in the block management table is set to be "free".

Likewise, if an entry, which corresponds to a logical address included in the logical address range of the writing data of a size of the block unit, exists in the page management table of FIG. 4 or FIG. 5, the entry is rendered invalid state. On the basis of the transmission of the data stored in the second memory area 12 to the third memory area 13, in order to invalidate the data stored in the second memory area 12 for prevention of referencing, such process is performed.

Further, in the second memory area 12, the controller 10 sets an "active" block, in which all page unit data are invalid data, to be a "free" block. In the configuration of FIG. 8, the area for storing the page availability is released.

(b). The controller 10 counts the number of data in the first and second memory area 11, 12, and determines to manage the data with either the "large unit" which is equal to the block unit or the "small unit" which is equal to the page unit.

In this case, the controller 10 searches the cache management table of FIG. 3 and the page management table of FIG. 4 or FIG. 5, and counts up the total number of the entries, which are included in the logical address range calculated by aligning a logical address of data to be outputted by a size of the block unit, in the first and second memory areas 11, 12.

If the total number of the entries is a predetermined threshold value or more, such as not less than 50% of the total number of page unit ("small units") data storable in one area of the block unit ("large unit"), the data to be outputted is managed with the "large unit", and if the total number of the entries is less than the predetermined threshold value, the data to be outputted is managed with the "small unit" (Step ST1→Step ST2→Step ST3).

"Small Unit" Case (See, the Flowchart of FIG. 10)

The controller 10 stores the data outputted from the first memory area 11 in the second memory area 12 as data of the page unit, as in the above mentioned case "(a)". After writing the data outputted from the first memory area 11 in the second memory area 12, the cache management table of FIG. 3 is updated to render the entry, corresponding to the writing data, invalid state, as in the above mentioned case "(a)". In addition, the page management table of FIG. 4 or FIG. 5 and the physical block management table of FIG. 7 or FIG. 8 are updated (Step ST4 to Step ST13).

"Large Unit" Case (See, the Flowchart of FIG. 11)

The controller 10 stores the data outputted from the first memory area 11 in the third memory area 13 as data of the block unit, as in the above mentioned case "(a)". After writing the data outputted from the first memory area 11 in the third memory area 13, the cache management table of FIG. 3 is updated to render the entry, corresponding to the writing data, invalid state, as in the above mentioned case "(a)". In addition, the page management table of FIG. 4 or FIG. 5, the block management table of FIG. 6, and the physical block management table of FIG. 7 or FIG. 8 are updated (Step ST4' to Step ST8').

In the flowchart of FIG. 11, the step ST4' may be arranged immediately before the step ST7'. In this case, the controller 10 may allocates a "free" block to the third memory area 13 after determination of the data to be written in the third memory area 13.

C. Data Transfer Process from the Second Memory Area to the Third Memory Area

The data transfer process from the second memory area 12 to the third memory area 13 is described with reference to FIG. 15.

The capacity of the second memory area 12 is usually set to be smaller than the capacity of the third memory area 13, and therefore, if a certain amount of data is accumulated in the second memory area 12 (the number of blocks, occupied by data of a size of the "small unit" which is equal to the page unit, exceeds a permissive range defined as the capacity of the second memory area 12), the controller 10 selects an ejection block from the second memory area 12 under the second condition.

The controller 10 transfers, each data of a size of the "small unit" which is equal to the page unit stored in the ejection block, to the third memory area 13, as data of a size of the "large unit" which is equal to the block unit.

In other words, the controller 10 changes the data management unit from the "small unit" which is equal to the page unit to the "large unit" which is equal to the block unit. In this process, a plurality of fragment "small unit" data included in the logical address range of a size of the "large unit" are collected from the first, second, and third memory areas 11, 12, and 13 and are merged into block unit data (Defragmentation).

The second condition is defined by the writing order or the number of valid data. Specifically, the controller 10 executes following process (a) or process (b).

(a). The controller 10 selects a block having the oldest writing order from among the blocks allocated to the second memory area 12. Each page unit data included in the selected block is merged into block unit data, and then to be written in the third memory area 13. In this case, the controller 10 manages the writing order of the blocks in the second memory area 12. The writing order information is stored, for example, in the controller 10, the nonvolatile semiconductor memory, or other memory unit.

(b). The controller 10 sums, with respect to each block in the second memory area 12, the number of page unit data stored in the second memory area 12 in a logical address range calculated by aligning, a logical address of valid data of a size of the page unit ("small unit") in the block, by a size of the block unit ("large unit"). The controller 10 selects the block with the maximum summed value, and each valid data in the block is merged into block unit data and written in the third memory area 13 (Step ST1 to Step ST8).

Hereinafter, the case "(b)." is described.

Figure 16:
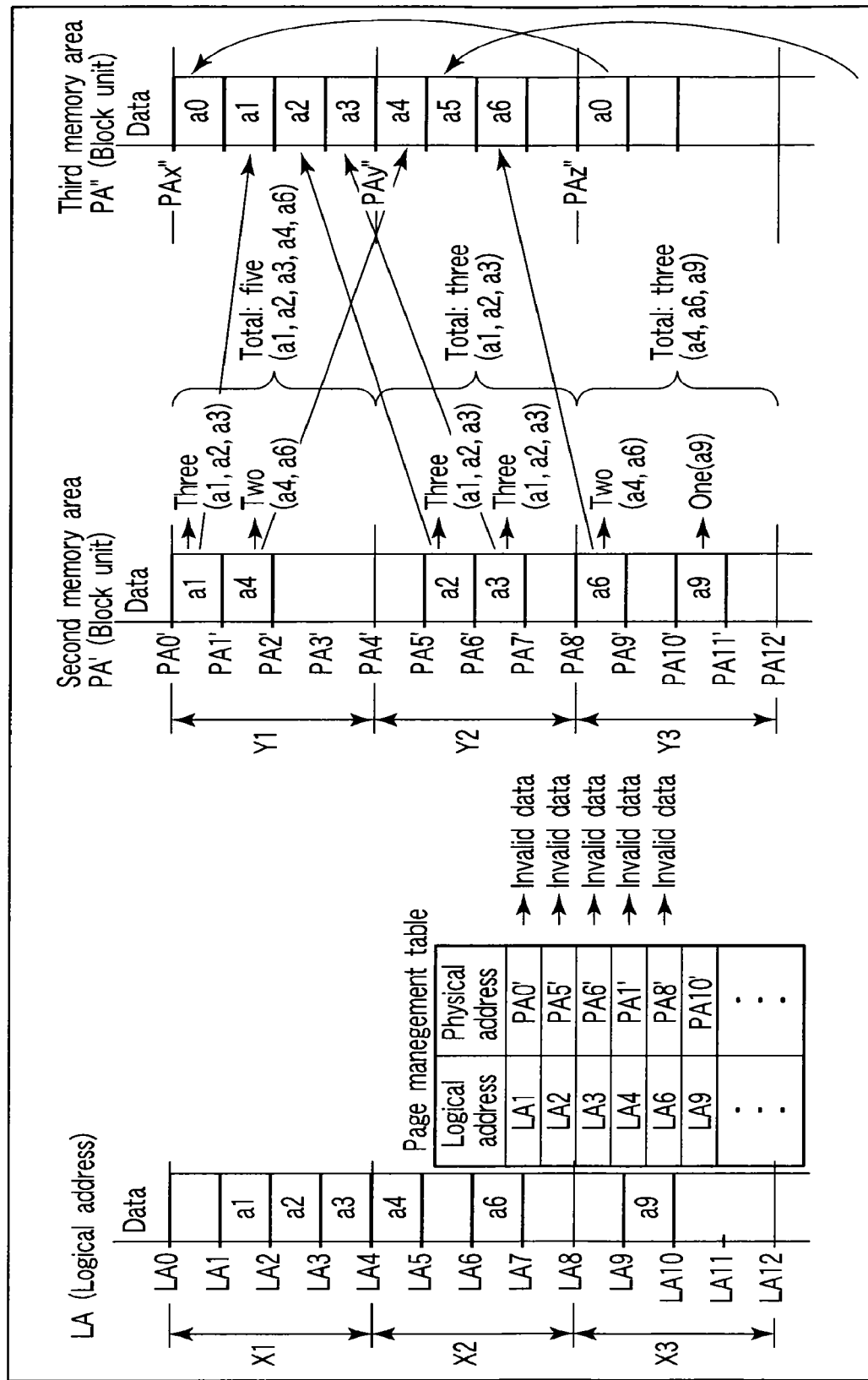
FIG. 16 is a diagram showing a condition of the data transfer from the second memory area to the third memory area.

1. For example, as shown in FIG. 16, the controller 10 aligns the logical address LA, associated with valid data of a size of the page unit in each block allocated to the second memory area 12, by a size of the block unit (Step ST1).
2. The controller 10 counts up the number of valid data stored in the second memory area 12 for each logical address range aligned by a size of the block unit (Step ST2). The number of valid data in the logical address ranges X1, X2, and X3 of a size of the block unit are respectively 3, 2, and 1.
3. The controller 10 sums the number of valid data counted at the step ST2 for each block in the second memory area 12 (Step ST3). The controller 10 does not carry out the double count of the valid data with which a logical address overlaps.

With regard to the block Y1 in the second memory area 12, the valid data in the block Y1 is a1 and a4. The valid data a1 is included in the logical address range X1 of a size of the block unit. In the logical address range X1, there are three valid data a1, a2, and a3 in the second memory area 12.

The valid data a4 is included in the logical address range X2 of a size of the block unit. In the logical address range X2, there are two valid data a4 and a6 in the second memory area 12.

As a result, with regard to the block Y1 in the second memory area 12, the total number of valid data in the logical address ranges X1 and X2 including the valid data a1 and a4 in the physical address range Y1 is 5.

With regard to the block Y2, the total number of valid data in the logical address range X1 including the valid data a2 and a3 in the physical address range Y2 is 3.

With regard to the block Y3, the total number of valid data in the logical address ranges X2 and X3 including the valid data a6 and a9 in the physical address range Y3 is 3.

4. The controller 10 selects valid data in the logical address range of a size of the block unit including valid data stored in the block in which the total number summed at the step ST3 is the largest (Step ST4).

In the case of FIG. 16, the valid data a1, a2, a3, a4, and a6 in the logical address ranges X1 and X2 of a size of the block unit, including the valid data in the physical address range Y1 with the largest total number, are to be written in the third memory area 13.

The following description shows a process for merging page unit data in the selected block into one block unit data and for writing the block unit data in the third memory area 13. The following process is repeated until all page unit data in the selected block are written in the third memory area 13.

5. The controller 10 searches the physical block management table of FIG. 7 or FIG. 8, and gets a "free" block as the destination of the writing data. This free block is allocated to the third memory area 13. The controller 10 updates the entry of the physical bock management table of FIG. 7 or FIG. 8 corresponding to the obtained free block to "third memory area 13 (active)" and instructs the nonvolatile semiconductor memory to erase data in the obtained free block (Step ST5).
6. The controller 10 merges page unit data into block unit data. Specifically, the controller 10 collects valid data, included in the logical address range calculated by aligning the logical address of the page unit data by a size of the block unit, from the first, second, and third memory areas 11, 12, and 13 (Step ST6).

The controller 10 searches the cache management table of FIG. 3. If an entry, which corresponds to a logical address of page unit data included in the logical address range aligned by a size of the block unit, is detected, the controller 10 reads out all sector unit data with the sector flag "1" in the entry from the first memory area 11.

With regard to a logical address range including valid data which is not read out from the first memory area 11, the controller 10 searches the page management table of FIG. 4 or FIG. 5. If an entry which corresponds to a logical address of page unit data associated with the logical address range is detected, the controller 10 reads out valid data, which is not read out from the first memory area 11, included in the page unit data corresponding to the physical address recorded in the entry, from the second memory area 12.

With regard to a logical address range including valid data which is not read out from the first and second memory areas 11 and 12, the controller 10 searches the block management table of FIG. 6. After detecting an entry which corresponds to the logical address aligned by a size of the block unit, the controller 10 reads out valid data, which is not read out from the first and second memory areas 11 and 12, included in the block unit data corresponding to the physical address recorded in the entry, from the third memory area 13.

The destination to which valid data read out from the first memory area 11, the second memory area 12, and/or the third memory area 13 is temporarily stored is a work area of the first memory area 11 or the main memory of the controller 10; however, it is not limited to this.

7. After completing all sector unit data composing block unit data, the controller 10 instructs the nonvolatile semiconductor memory to write the block unit data in the empty block selected as the destination of the writing data (Step ST7).

Figure 15:
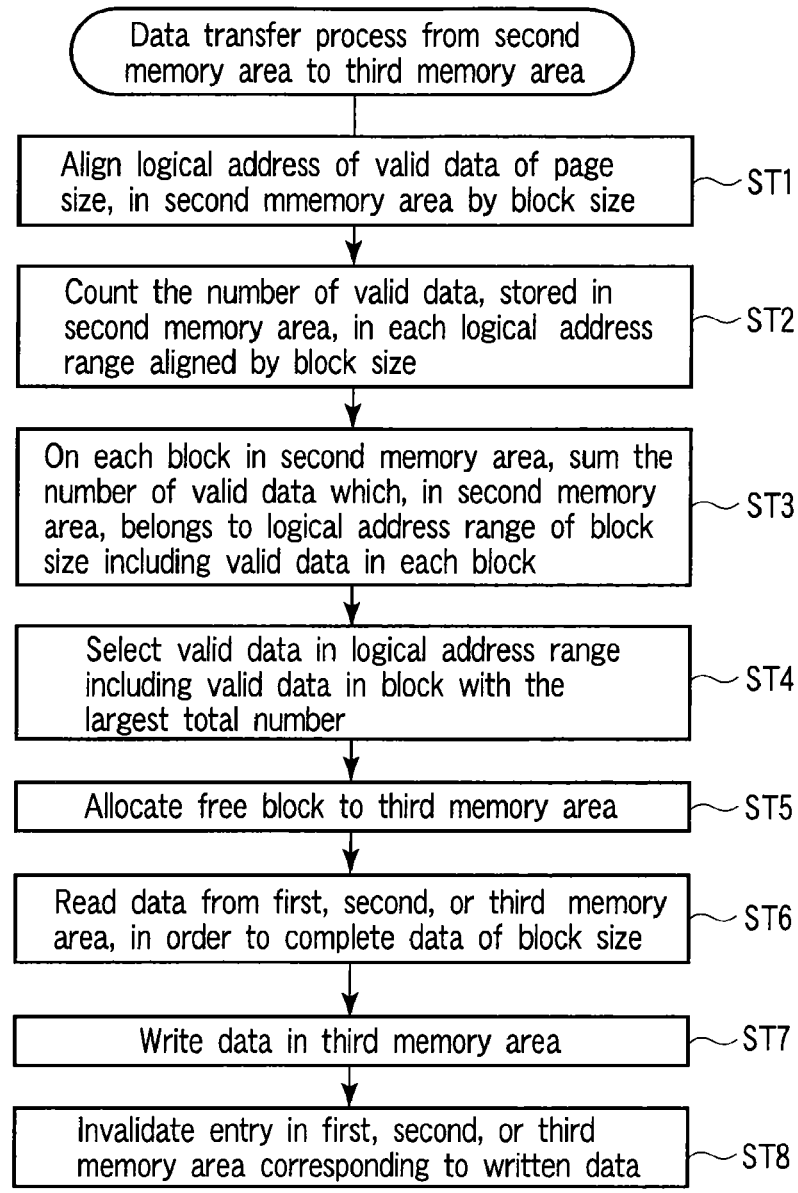
FIG. 15 is flowchart showing data transfer from the second memory area to the third memory area.

In a flowchart of FIG. 15, the step ST5 may be arranged immediately before the step ST7. In this case, the controller 10 may allocates a "free" block to the third memory area 13 after determination of the data to be written in the third memory area 13.

After writing the block unit data, the controller 10 registers the physical address of the block as the destination of the writing data in the entry of the block management table corresponding to the logical address range of a size of the block unit.

If a physical address is already stored in the selected entry before registering a new physical address, the controller 10 overwrites the physical address. The old data which is stored in the block indicated by the old physical address becomes invalid data.

8. The controller 10 invalidates the entries corresponding to the writing data collected from the first, second, and third memory areas 11, 12, and 13 (Step ST8).

The controller 10 updates the cache management table of FIG. 3. The entry corresponding to the writing data is rendered invalid state and released for input data from the host apparatus.

Subsequently, the controller 10 scans the physical block management table of FIG. 7 or FIG. 8 and the block management table of FIG. 6, and executes a release process for setting an "active" block, in which block unit data is invalid, to be a "free" block.

Specifically, an entry corresponding to a block which is set to be "active" in the physical block management table and which is not indicated by a physical address in the block management table is set to be "free".

Likewise, if an entry, which corresponds to a logical address included in the logical address range of the writing data of a size of the block unit, exists in the page management table of FIG. 4 or FIG. 5, the entry is rendered invalid state. On the basis of the transmission of the data stored in the second memory area 12 to the third memory area 13, in order to invalidate the data stored in the second memory area 12 for prevention of referencing, such process is performed.

Further, in the second memory area 12, the controller 10 sets an "active" block, in which all page unit data are invalid data, to be a "free" block. In the configuration of FIG. 8, the area for storing the page availability is released.

D. Other

The data transfer process from the first memory area 11 to the second memory area 12 and/or the third memory area 13 and the data transfer process from the second memory area 12 to the third memory area 13, in addition to the above description, may be performed at a predetermined time designated by the host apparatus.

For example, if the semiconductor storage device receives a cache flush command, the controller 10 executes the data transfer from the first memory area 11 to the second memory area 12 and/or the third memory area 13 in accordance with the first condition.

(3) System Example

FIG. 17 shows a system example corresponding to the second basic configuration.

A host apparatus 31 executes data transfer with a semiconductor storage device 32 according to this embodiment.

The host apparatus 31 is, for example, a personal computer such as a notebook computer. The semiconductor storage device 32 is, for example, an SSD as a secondary storage device mounted in the host apparatus 31.

The semiconductor storage device 32 comprises the first, second, and third memory areas 11, 12, and 13 and the controller 10 which controls these memory areas. The first memory area 11 is included in a volatile semiconductor memory 21 such as DRAM, and the second and third memory areas 12 and 13 are included in a nonvolatile semiconductor memory 22 such as a NAND type flash memory.

The controller 10 has a CPU and a main memory (for storing a program, management information, and a work area). The controller 10 manages the data location in the first, second, and third memory areas 11, 12, and 13 by translating a logical address to a physical address on the basis of the cache management table, the page management table, the block management table, and the physical block management table.

The data from the host apparatus 31 is inputted into the semiconductor storage device 32 through a host I/F (interface) 23. The host apparatus 31 executes an access to the semiconductor storage device 32 by the sector unit.

Figure 18:
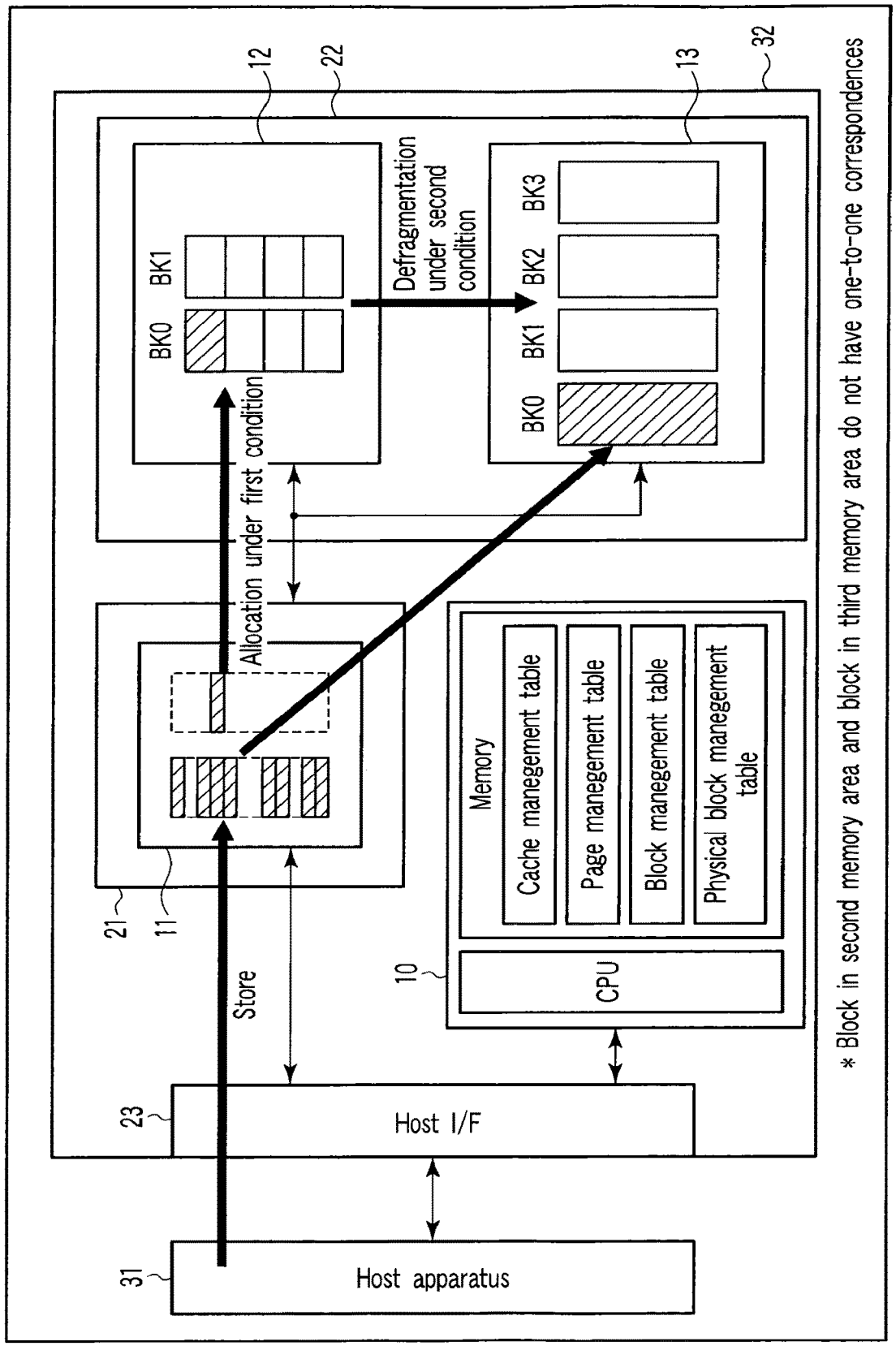
FIG. 18 is a diagram showing a system example.

FIG. 18 shows the flow of data from the host apparatus 31.

As described in the above process method, the data from the host apparatus 31 is stored in the first memory area 11, and thereafter to be transferred to the second memory area 12 or the third memory area 13 in accordance with the first condition. In addition, the data stored in the second memory area 12 is transferred to the third memory area 13 in accordance with the second condition.

A block in the second memory area 12 and a block in the third memory area 13 do not have one-to-one correspondences. On the basis of the physical block management table, a part of plural blocks in the nonvolatile semiconductor memory 22 is used as the second memory area 12, and another part is used as the third memory area 13.

(4) Operation Example

The operation example of this embodiment is described by comparing writing efficiency with reference to FIG. 18. At the same time, analysis of a size of the management table is described.

A. Comparison of Writing Efficiency

In the following description, the volatile semiconductor memory 21 is assumed to be a DRAM, and the nonvolatile semiconductor memory 22 is assumed to be a NAND type flash memory. A size of the block unit and the page unit of the NAND type flash memory are respectively assumed to be 512 kB and 4 kB, and a size of the sector unit from the host apparatus is assumed to be 512 B. The predetermined threshold value ("the number of data" or "the data amount") defined in the first condition is assumed to be 50% (256 kB) of a size of the block unit in the NAND type flash memory.

The following process is considered: 1 sector unit data Y included in the logical address range of block unit data X is updated in such a state that the block unit data X is stored in the third memory area 13, and thereafter, the data Y is written in the second memory area 12 or the third memory area 13 to be made nonvolatile data.

As viewed from the host apparatus 31, the sector unit data Y included in the logical address range of the block unit data X is rendered updated state at the time when the data Y has been stored in the second memory area 12 or the third memory area 13.

(a). Operation Example 1

When the data Y is written in the first memory area 11 in the initial state that there is no data in the first memory area 11, as a result, only sector unit data Y (512 B) exists in the first memory area 11 over the logical address range of a size of the block unit including the data Y (the logical address range is equal to the logical address range of the data X). The controller 10 can detect the data amount by searching the cash management table.

The above size 512 B is smaller than 256 kB which is defined as the predetermined threshold value in the first condition.

The controller 10 transfers the data Y stored in the first memory area 11 to the second memory area 12 as page unit data (hereinafter referred to as data P) over the logical address range calculated by aligning the logical address of the data Y by a size of the page unit.

Since a size of the sector unit data Y is smaller than a size of the page unit, the missing data is required to be read out from, for example, the third memory area 13 in order to complete the page unit data P.

The controller 10 aligns the logical address of the data P by a size of the block unit to search the block management table at the aligned logical address (which is equal to the logical address of the data X).

If an entry corresponding to the logical address is detected, the controller 10 examines the physical address at which the data X is stored.

The controller 10 reads out the page unit data, corresponding to the logical address range of the data P from the data X in the third memory area 13, onto the volatile semiconductor memory 21, and creates an image of the data P by writing the data Y over there.

The controller 10 writes the page unit data P, including the sector unit data Y, in an empty page in the second memory area 12 and updates the cache management table, the page management table, and the block management table. The data Y written in the second memory area 12 becomes nonvolatile data.

When the data having the same size as the data Y are continuously written, since 1 block unit is composed of 128 page units, the semiconductor storage device 32 erases one block unit data for the updating of the data of 128 sector units (for the writing of 128 pages). In this case, the writing efficiency is 512 kB/(512 B×128)=8, and the writing efficiency is improved in comparison with the case without using this embodiment (512 kB/512 B=1024). In this example, the 1 sector unit data is updated; however, if the one page unit data is updated, the writing efficiency is further improved.

In the technique of the patent document presented above, the data block and the log block have one-to-one correspondences, and therefore, for example if the data of 128 sectors respectively belonging to a different block is updated, 128 blocks are required to be erased.

Alternatively, in this embodiment, the block in the second memory area 12 and the block in the third memory area 13 do not have one-to-one correspondence. Therefore, even if a plurality of sector unit data stored in a different block are updated, superseding data can be stored in the same block of the second memory area 12 and data erasing amount in this case is only a size of the one block unit.

(b). Operation Example 2

The initial state that, superseding data of 384 kB included in the logical address range calculated by aligning the logical address of the data Y by a size of the block unit (the logical address range is equal to the logical address range of the data X) has been already written in the first memory area 11, is assumed.

In this initial state, when the sector unit data Y which is included in the logical address range of the data X and not stored in the first memory area 11 is written in the first memory area 11, data of (384 kB+512 B) including the data Y exists in the logical address range of the data X. The controller 10 can detect the data amount by searching the cash management table.

The above size (384 kB+512 B) is not smaller than 256 kB which is defined as the predetermined threshold value in the first condition.

The controller 10 transfers the data of (384 kB+512 B) including the data Y, which is stored in the first memory area 11, to the third memory area 13 as block unit data (hereinafter referred to as data B) over the logical address range calculated by aligning the logical address of the data Y by a size of the block unit.

Since a total size of the superseding data and the sector unit data Y is smaller than a size of the block unit, the missing data is required to be read out from, for example, the third memory area 13 in order to complete the block unit data B.

The controller 10 searches the block management table at the logical address of the data B (which is equal to the logical address of the data X) to detect the physical address at which the data X is stored. The controller 10 reads out the data X from the third memory area 13 onto the volatile semiconductor 21 and creates image of the data B by writing the superseding data and the data Y over there.

The controller 10 erases data in a "free" block and allocates the erased free block to the third memory area 13. The block unit data B including the superseding data and the sector unit data Y is written in this block. The cache management table and the block management table are updated. According to this, the superseding data and the sector unit data Y written in the third memory area 13 becomes nonvolatile data.

In this case, the semiconductor storage device 32 erases one block unit data for the updating of the data of about 384 kB (384 kB+512 B).

Therefore, the writing efficiency is 512 kB/384 kB=1.33, and the writing efficiency is improved in comparison with the case where the data of about 384 kB is updated by the sector unit (512 kB/512 B=1024).

In this example, the data of about 384 kB is updated; however, if a size of the data becomes closer to 512 kB as a size of the block unit, the writing efficiency is further improved.

B. Size of the Management Table

If the nonvolatile semiconductor memory is managed with the "small unit", the controller 10 may execute fine control of the data writing location without regard to the data size or the data amount from the host apparatus 31 and the writing efficiency may be improved. However, the management data for executing the address translation becomes a large size, whereby the processing efficiency in the controller 10 may be deteriorated.

Alternatively in this embodiment, the two management units; the "small unit" and the "large unit" are adopted. By using the management tables according to the data management resolution, the controller 10 suppress the increase of the number of data managed with the "small unit". Therefore, the semiconductor storage device 32 according to this embodiment prevents from the increase of a size of the management tables and realizes the high writing efficiency.

(5) Other

With respect to the second and third memory areas 12 and 13, the following process may be performed in addition to the process of this embodiment.

A. Compaction of Second Memory Area

When the number of invalid data in the second memory area 12 is increased, and when the number of blocks having no page with "write-enable" state is increased, as shown in FIG. 19, the controller 10 may collect only valid data and copy these valid data to a free block.

As a result, the block in which valid data are originally stored can be released, whereby the number of invalid data in the second memory area 12 is reduced, and the number of free blocks is increased. This process is called a compaction of the second memory area 12 on the basis that the valid data are collected and copied to a free block (a compaction block).

The writing efficiency may be able to be further improved by the compaction. However, in this embodiment, in the similar case, the data transfer process from the second memory area 12 to the third memory area 13 can be replaced with the compaction, and therefore, the compaction is auxiliary process.

For example, the controller 10 calculates the number of invalid data of the "small unit" for each block in the second memory area 12. The controller 10 sequentially selects a block in descending order of the number of invalid data, and thus, the valid data in the selected block are copied to an erased free block. The block filled with the valid data is allocated to the second memory area 12.

The compaction is performed in the case where the total number of invalid data included in the second memory area 12 becomes larger than a predetermined threshold value, for example.

B. Compaction of Third Memory Area

The compaction of the third memory area 13 can be applied in the case where a size of the data management unit ("large unit") in the third memory area 13 is less than a size of the block unit.

When the number of invalid data in the third memory area 13 is increased, and when the number of blocks having no page with "write-enable" state, as shown in FIG. 19, the controller 10 may collect only valid data and copy these valid data to a free block.

As a result, the block in which valid data are originally stored can be released, whereby the number of invalid data in the third memory area 13 is reduced, and the number of free blocks is increased. This process is called a compaction of the third memory area 13 on the basis that the valid data are collected and copied to a free block (a compaction block).

For example, the controller 10 calculates the number of invalid data of the "large unit" for each block in the third memory area 13. The controller 10 sequentially selects a block in descending order of the number of invalid data, and thus, the valid data in the selected block are copied to an erased free block. The block filled with the valid data is allocated to the third memory area 13.

The compaction is performed in the case where the total number of invalid data included in the third memory area 13 becomes larger than a predetermined threshold value, for example.

3. Summary

According to this embodiment, the following configuration can realize the improvement of the writing efficiency and the prevention of the performance deterioration and of the life shortening, regardless the data size or the data amount from the host apparatus.

Allocation of Storage Locations

A semiconductor storage device includes a first memory area configured in a volatile semiconductor memory which performs writing of data by a first unit or less, the first unit is an access unit to the semiconductor storage device, second and third memory areas configured in a nonvolatile semiconductor memory which performs writing of data by a second unit and performs erasing of data by a third unit, the third unit is twice or larger natural number times as large as the second unit, and a controller executing following processing.

The controller executes a first processing for storing a plurality of data by the first unit in the first memory area, and a second processing for storing data outputted from the first memory area by a first management unit in the second memory area, the first management unit is twice or larger natural number times as large as the first unit and is less than the third unit, and a third processing for storing data outputted from the first memory area by a second management unit in the third memory area, the second management unit is twice or larger natural number times as large as the first management unit.

Data Transfer from Second Memory Area to Third Memory Area (Defragmentation)

The controller further executes a fourth processing for selecting data of the first management unit to be outputted from the second memory area, and a fifth processing for storing data including the selected data by the second management unit in the third memory area.

Sharing Memory

The second and third memory areas share the same nonvolatile semiconductor memory, and the controller allocates areas of the third unit to the second and third memory areas respectively.

Allocation Condition 1 (the Number of Data in First Memory Area)

The controller calculates logical address range by aligning logical address of data to be outputted from the first memory area into the second management unit, counts a number of data which is included in the logical address range and is stored in the first memory area, executes the second processing if the number of data is less than a predetermined threshold value, and executes the third processing if the number of data is the predetermined threshold value or more.

Allocation Condition 2 (the Number of Data in First and Second Memory Areas)

The controller calculates logical address range by aligning logical address of data to be outputted from the first memory area into the second management unit, counts a number of data which is included in the logical address range and is stored in the first and second memory areas, executes the second processing if the number of data is less than a predetermined threshold value, and executes the third processing for if the number of data is the predetermined threshold value or more.

Trigger of Defragmentation

The controller executes the fourth and fifth processing if a number of areas of the third unit occupied by a plurality of valid and invalid data stored in the second memory area exceeds a permissible range.

Defragmentation Condition 1 (Old Data)

In the fourth processing, the controller detects an area of the third unit having the oldest writing order in the second memory area, and selects each valid data of the first management unit stored in the area of the third unit.

Defragmentation Condition 2 (Valid Data)

In the fourth processing, the controller calculates logical address range by aligning logical address of valid data into the second management unit for each area of the third unit in the second memory area, counts a number of valid data which is included in the logical address range and is stored in the second memory area, totals the number of valid data for each area of the third unit in the second memory area, detects an area of the third unit having the largest total number, and selects each valid data of the first management unit stored in the area of the third unit.

Defragmentation Condition 3 (Invalid Data)

In the fourth processing, the controller counts a number of invalid data for each area of the third unit in the second memory area, detects an area of the third unit having the smallest number of invalid data, and selects each valid data of the first management unit stored in the area of the third unit.

The data management unit in the second memory area: small

The second unit is twice or larger natural number times as large as the first management unit.

The data management unit in the second memory area: large

The first management unit is twice or larger natural number times as large as the second unit, and the third unit is twice or larger natural number times as large as the first management unit.

The data management unit in the third memory area: small

The third unit is twice or larger natural number times as large as the second management unit.

The data management unit in the third memory area: large

The second management unit is twice or larger natural number times as large as the third unit.

Invalidation of the Second Memory Area

In the second processing, the controller writes new data of the first management unit in empty areas of the second unit in the second memory area, sets old data stored in the second memory area invalid if logical address of the new data corresponds to logical address of the old data, treats the new data as valid data which has priority over the old data, and treats the old data as invalid data which is ignored by referring to the new data.

Compaction of the Second Memory Area

The controller judges whether a number of invalid data in the second memory area exceeds a predetermined threshold value, counts a number of invalid data for each area of the third unit in the second memory area, selects valid data in areas of the third unit in order from the one with the largest number of invalid data, rewrites the selected valid data in a first area of the third unit, the first area is empty, allocates the first area to the second memory area after rewriting the selected valid data therein, and releases a second area of the third unit in the second memory area, the second area has no valid data by rewriting the selected valid data in the first area.

Invalidation of the Third Memory Area

In the third processing, the controller writes new data of the second management unit in an empty area of the third unit in the third memory area, sets old data stored in the third memory area invalid if logical address of new data corresponds to logical address of the old data, treats the new data as valid data which has priority over the old data, and treats the old data as invalid data which is ignored by referring to the new data.

Compaction of the Third Memory Area

The controller judges whether a number of invalid data in the third memory area exceeds a predetermined threshold value, counts a number of invalid data of the second management unit for each area of the third unit in the third memory area, selects valid data in areas of the third unit in order from the one with the largest number of invalid data, rewrites the selected valid data of the second management unit in empty area of the third unit in the third memory area, and releases an area of the third unit. The second management unit is less than the third unit.

4. Application Example

The semiconductor storage device according to this embodiment may be applied to, for example, an SSD used as a secondary storage device in a personal computer such as a notebook computer. A specific example in this case is described later.

5. Conclusion

According to this embodiment, the semiconductor storage device using the nonvolatile semiconductor memory in which the unit of erasing, reading, and writing is specified can realize the improvement of the writing efficiency and the prevention of the performance deterioration and of the life shortening, regardless the data size or the data amount from the host apparatus.

The present invention is not limited to the above-described embodiments, and the components can be modified and embodied without departing from the spirit and scope of the invention. Various inventions can be formed by the appropriate combinations of a plurality of components disclosed in the above-described embodiments. For example, several components may be omitted from all the components disclosed in the embodiments, or the components over the different embodiments may be suitably combined with each other.

[II. Semiconductor Storage Device for Preventing the Increase of Erasing Count]

1. Outline

The compaction described in the section I. is excellent in the effective utilization of a storage area based on the erasure of invalid data. However, the compaction requires copy operation that the identical data is written to other block, and therefore, there generate a side effect that, when the valid data subjected to the compaction is immediately updated, the erasing count of the blocks increases.

The block newly used by the compaction is filled with valid data; however, when the data subjected to the compaction is updated, the data becomes invalid data. In addition, when the number of invalid data in the block increases, the valid data in the block again becomes to be subjected to the compaction. As a result, the erasing count of the block may increase.

According to the above configuration, the data to be subjected to the compaction preferably has a low updating frequency, and means for discriminating data is required.

On the basis of the above knowledge, in the present embodiments, means for discriminating data having a high updating frequency from data having a low updating frequency is provided, and the data having a low updating frequency becomes a target to be subjected to the compaction, whereby the data to be subjected to the compaction is prevented from being immediately updated. According to this configuration, the erasing count of the blocks is reduced in order to prevent the deterioration of memory cells.

As a specific configuration, following memory areas are provided.

a first memory area in a volatile semiconductor memory, which performs reading and writing of data by the first unit or less;

a second memory area composed of areas of the third unit in a nonvolatile semiconductor memory, which performs reading and writing of data by the second unit and performs erasing of data by the third unit, and managed with the "small unit (first management unit)", a size of the "small unit" being natural number times as large as a size of the first unit;

a third memory area composed of areas of the third unit in a nonvolatile semiconductor memory, which performs reading and writing of data by the second unit and performs erasing of data by the third unit, and managed with the "large unit (second management unit)", a size of the "large unit" being twice or larger natural number times as large as a size of the "small unit" and being natural number times as large as a size of the third unit; and a fourth memory area composed of areas of the third unit in a nonvolatile semiconductor memory, which performs reading and writing of data by the second unit and performs erasing of data by the third unit, and managed with the "small unit", a size of the "small unit" being natural number times as large as a size of the first unit.

The fourth memory area is used as means for discriminating data having a high updating frequency from data having a low updating frequency. Roughly, in addition to the basic configuration described in the section I., the fourth memory area is provided to discriminating data having a high updating frequency from data having a low updating frequency.

A plurality of data of the first unit is written in the first memory area, and then to be written in the third memory area or the fourth memory area. The fourth memory area has an FIFO (First-In First-Out) structure. When the number of "active" areas of the third unit used for the fourth memory area becomes larger than a permissive range, valid data, which satisfies a third condition and is stored in an area of the third unit having the oldest allocation order in the second memory area, is transferred to the third memory area as "large unit" data.

The area of the third unit having the oldest allocation order in the second memory area including valid data, which does not satisfy the third condition, is moved to the second memory area. When the number of "active" areas of the third unit used for the second memory area becomes larger than a permissive range and a fourth condition is satisfied, valid data in the second memory area is selected and copied to an empty area of the third unit. The area of the third unit filled with valid data is allocated to the second memory area (Compaction).

The principle that a target to be subjected to the compaction in the second memory area becomes the data having a low updating frequency is as follows.

Since the fourth memory area has the FIFO structure of the third unit, the data inputted to the fourth memory area stays in the fourth memory area for a certain period. Therefore, the data having a high updating frequency is updated in the fourth memory area. When the data is updated, the old data becomes invalid data, and since the superseding data is newly inputted to the fourth memory area, the data having a high updating frequency stays in the fourth memory area without being outputted.

The valid data in the second memory area is made a target to be subjected to the compaction, and the valid data in the fourth memory area is not made a target to be subjected to the compaction, whereby the data having a low updating frequency can be made a target to be subjected to the compaction. As a result, it is possible to prevent the increase of erasing count for blocks as a side effect of the compaction.

2. Embodiments (1) First Embodiment

FIG. 20 shows a semiconductor storage device according to a first embodiment.

A first memory area 11 temporarily stores data from a host apparatus. The data is written by the sector unit (the first unit) or less in the first memory area 11. The first memory area 11 is configured in a volatile semiconductor memory such as a DRAM.

A second memory area 12 is composed of blocks in a nonvolatile semiconductor memory 22. In the nonvolatile semiconductor memory 22, the unit in which reading/writing is executed at one time is a page (the second unit) and the unit in which erasing is executed at one time is a block (the third unit). A size of the block unit is natural number times as large as a size of the page unit. The second memory area 12 stores data by the "small unit" which is equal to the page unit.

A third memory area 13 is composed of blocks in the nonvolatile semiconductor memory 22 and stores data by the "large unit" which is equal to the block unit.

A fourth memory area 14 is composed of blocks in the nonvolatile semiconductor memory 22 and stores data by the "small unit" which is equal to the page unit.

The storage capacity of the first memory area 11 is assumed to be larger than a size of the one block unit in the nonvolatile semiconductor memory 22, and the storage capacity of the nonvolatile semiconductor memory 22 is assumed to be larger than the storage capacity provided as the product specification of the semiconductor storage device (for example, SSD).

The storage capacity of the nonvolatile semiconductor memory 22 is allocated to the second, third, and fourth memory areas 12, 13, and 14 as follows.

The storage capacity, which is the same as or larger than the storage capacity provided as the product specification of the semiconductor storage device, is allocated to the third memory area 13.

The storage capacity remaining by subtracting the storage capacity of the third memory area 13 from the storage capacity of the nonvolatile semiconductor memory 22 is allocated to the second and fourth memory areas 12 and 14. Each storage capacity of the second and fourth memory areas 12 and 14 and the rate between them are not limited.

The second, third, and fourth memory areas 12, 13, and 14 are composed of, for example, one or more blocks in the nonvolatile semiconductor memory 22, such as a NAND type flash memory.

The first, second, and third units representing a size of data do not include redundant data (ECC, internal control flag, etc.) which is added to main data from the host apparatus in the semiconductor storage device.

In general, the system including the nonvolatile semiconductor memory, for example a NAND type flash memory, executes reading/writing in the state of adding redundant data to the main data. However, for simplifying the explanation, each of the units is assumed above.

A controller 10 has a CPU and a main memory, and can operate a program for executing data management. In this embodiment, the functions realized by the controller 10 can be implemented as any of hardware and software or the combination of the both. Whether these functions are implemented as hardware or software depends on the practical embodiment or the design constraints imposed on the entire system.

When the main memory of the controller 10 is comprised of a volatile semiconductor memory such as DRAM, the first memory area 11 may be configured in the main memory of the controller 10.

The controller 10 includes a cache management table, a page management table, a block management table, a page FIFO management table, and a physical block management table in order to manage where data accessed by the logical address from the host apparatus is stored in the first, second, third and fourth memory areas 11, 12, 13, and 14. These management tables are expanded onto the main memory of the controller 10 during the operation of the semiconductor storage device.

—Cache Management Table—

Figure 21:
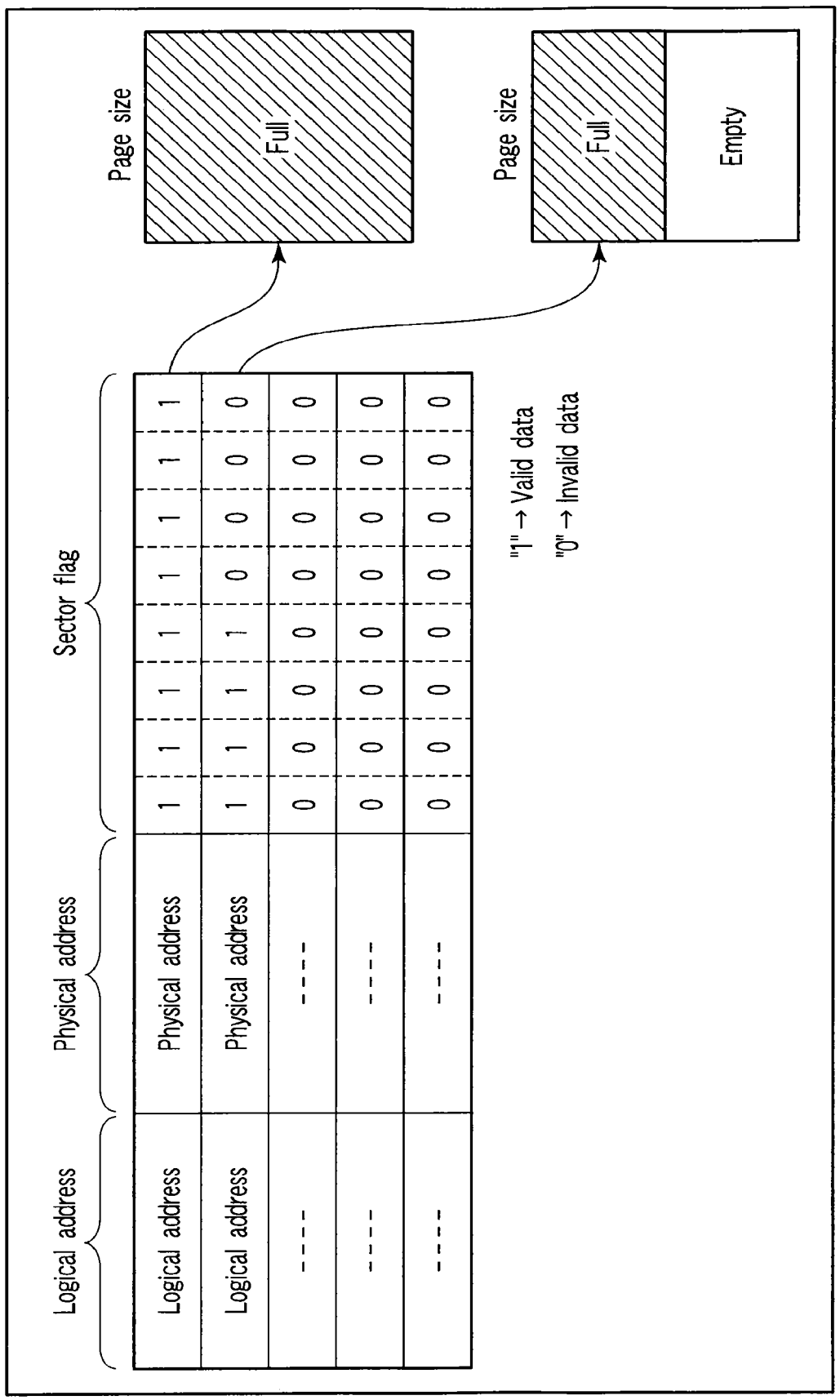
FIG. 21 is a diagram showing a cache management table.

FIG. 21 shows an example of a cache management table.

The cache management table controls data stored in the first memory area 11 of FIG. 20 by the "small unit" which is equal to the page unit. The control of the valid data is executed by the sector unit.

It is assumed that one entry is assigned to one area of one page unit in the first memory area 11.

The number of entries is assumed to be the number of page unit data which can be contained within the first memory area 11, that is, not larger than (the total capacity of the first memory area 11)/(a size of the page unit).

A logical address of page unit data, a physical address of the first memory area 11, and a sector flag indicating the location of the valid data in the relevant area of the page unit are associated with each entry.

The area of the page unit for temporarily storing data corresponded to each entry is provided in the first memory area 11, and the physical address of the area is stored in each entry. If the physical address of the area corresponding to the entry is specified, such as if the areas of the page unit are continuously disposed, the physical address is not required to be stored in the entry.

The each area of the page unit in the first memory area 11 is further divided into areas of the sector unit in the cache management table. A data status in each area of the sector unit is represented by setting the value of the sector flags as "1" or "0".

In an area with the sector flag of "1", valid data from the host apparatus is stored. In an area with the sector flag of "0", the latest data written from the host apparatus is not stored, whereby the area is treated as an invalid area. The entry in which all sector flags are "0" is regarded to be an unused entry.

The configuration of the above cache management table is based on a control method called a full associative method in which the logical address is allocated to each entry. However, the correspondence between the logical address and the physical address in the first memory area 11 may be controlled by an n-way set associative method or the like.

—Page Management Table—

Figure 22:
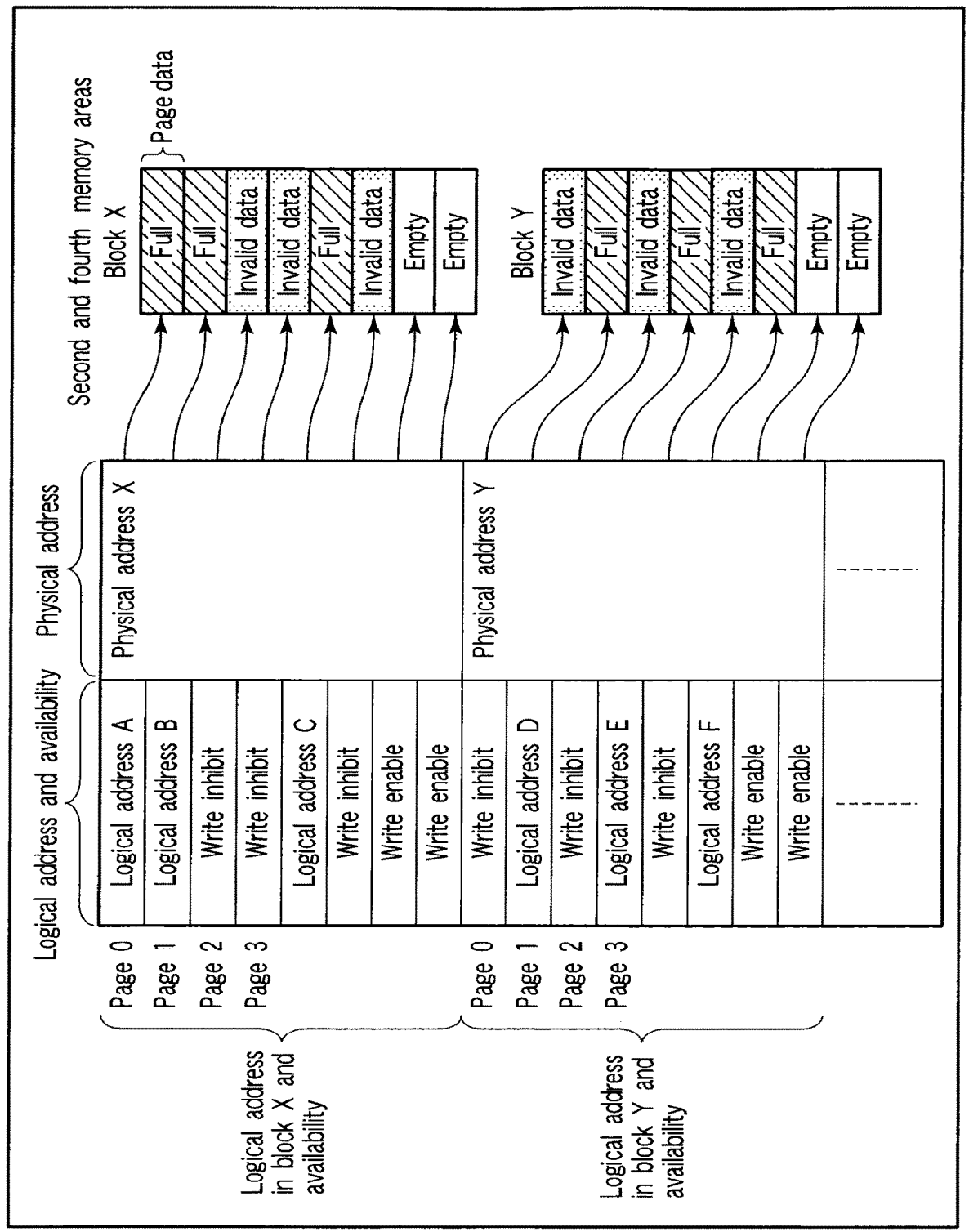
FIG. 22 is a diagram showing a page management table.

FIG. 22 shows an example of a page management table.

The page management table controls data stored in the second and fourth memory areas 12 and 14 of FIG. 20 by the "small unit" which is equal to the page unit.

It is assumed that one entry is assigned to one block in the second and fourth memory areas 12 and 14.

The number of entries is assumed to be provided with allowance, in order to register the blocks in processing, to the number of blocks which can be contained within the second and fourth memory areas 12 and 14, that is, the number providing an allowance to [(the total capacity of the second and fourth memory areas 12 and 14)/(a size of the block unit)].

The physical address of the block allocated to the second memory area 12 or the fourth memory area 14 is associated with each entry, and the logical addresses of page unit data in the block are recorded in each entry.

A page availability is configured to be able to distinguish "write-enable" state (this storage area is empty) from "write-inhibit" state (this storage area is invalid because old data has once written therein and new data is written in another storage area) for each page.

—Block Management Table—

Figure 23:
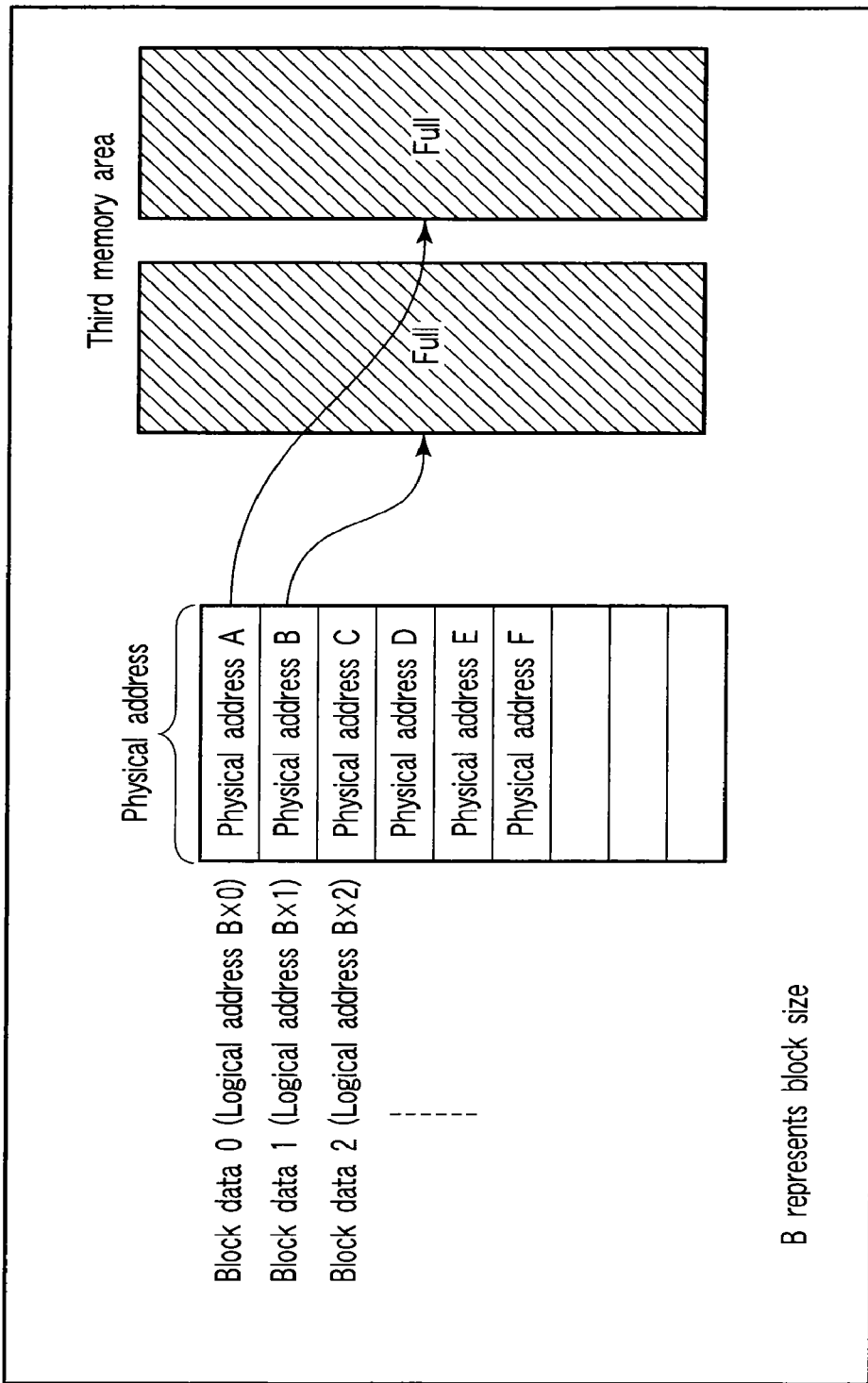
FIG. 23 is a diagram showing a block management table.

FIG. 23 shows an example of a block management table.

The block management table controls data stored in the third memory area 13 of FIG. 20 by the "large unit" which is equal to the block unit.

It is assumed that one entry is assigned to one area of one block unit in the third memory area 13.

The number of entries is assumed to be the number of block unit data which can be contained within the third memory area 13, that is, not larger than (the total capacity of the third memory area 13)/(a size of the block unit).

Each entry is arranged in order of a logical address. A Physical address which corresponds to a logical address of block unit data and designates a block in the third memory area 13 is associated with each entry.

—Page FIFO Management Table—

FIG. 24 shows an example of a page FIFO management table.

The page FIFO management table controls data in the blocks allocated to the fourth memory area 14 of FIG. 20.

It is assumed that one entry is assigned to one block in the fourth memory area 14.

The number of entries is assumed to be the number of blocks which can be allocated to the fourth memory area 14, that is, (the total capacity of the fourth memory area 14)/(a size of the block unit).

The fourth memory area 14 is managed with the FIFO (First-In First-Out) structure of the block unit by using the page FIFO management table.

An entry corresponding to a block newly allocated (inputted) to the fourth memory area 14 is added to the top (the entrance side) of the page FIFO management table, and entries originally registered in the page FIFO management table are shifted backward one by one.

When the number of entries exceeds a permissive range, the block having the oldest allocation order associated with the entry at the bottom (the exit side) of the page FIFO management table is outputted from the fourth memory area 14.

—Physical Block Management Table—

FIG. 25 shows an example of a physical block management table.

The physical block management table controls the usage of blocks in the nonvolatile semiconductor memory 22.

It is assumed that one entry is assigned to one block (physical block) in the second, third, and fourth memory area 12, 13, and 14. The number of entries is assumed to be the number of blocks which can be used as a data area.

Each entry is associated with a physical address of a block and stores the usage of the block (whether the storage area (block) is used as the second, third, and fourth memory areas (active) or is unused (free)).

A process flow executed by the controller 10 of FIG. 20 is described.

The controller 10 first writes sector unit (first unit) data from the host apparatus in the first memory area 11 and stores the data for a certain period therein. With regard to this data store process, "A. Data store process in the first memory area" described in the section I. can be applicable.

The controller 10 distinguishes whether the data stored in the first memory area 11 should be managed with the "small unit (first management unit)" or the "large unit (second management unit)", based on a predetermined condition (which may be substantially the same as the first condition of "B. Data output process from the first memory area" described in the section I.).

A size of the "small unit" is a natural number times as large as a size of the page unit or a size of the page unit is a natural number times as large as a size of the "small unit".

A size of the "large unit" is twice or larger natural number times as large as a size of the "small unit", and at the same time, is a natural number times as large as a size of the block unit.

In this embodiment, to simplify the explanation, each of the units used in management tables is assumed below:

A size of the "small unit" which is a data management unit in the second and fourth memory areas 12 and 14 is equal to a size of the page unit (second unit). A size of the "large unit" which is a data management unit in the third memory area 13 is equal to a size of the block unit (third unit).

However, a page is controlled by being divided, specifically, a size of the "small unit" may be a natural number times as large as a size of the sector unit and a size of the page unit may be twice or larger natural number times as large as a size of the "small unit".

Alternatively, plural pages are collectively controlled, specifically, a size of the "small unit" may be twice or larger natural number times as large as a size of the page unit and a size of the block unit may be twice or larger natural number times as large as a size of the "small unit".

Likewise, plural blocks are collectively controlled, specifically, a size of the "large unit" may be twice or larger natural number times as large as a size of the block unit.

The above relation between the units may be set as following example: the sector unit (first unit)<the "small unit"<the page unit (second unit)<the block unit (third unit)≤the "large unit".

If the data stored in the first memory area 11 is managed with the "small unit", the data is transferred to the fourth memory area 14. If the data stored in the first memory area 11 is managed with the "large unit", the data is transferred to the third memory area 13.

This data output process is substantially the same as "B. Data output process from the first memory area" described in the section I. However, different from the section I., the destination of the "small unit" data is the fourth memory area 14.

A. FIFO Process in the Fourth Memory Area

Figure 26:
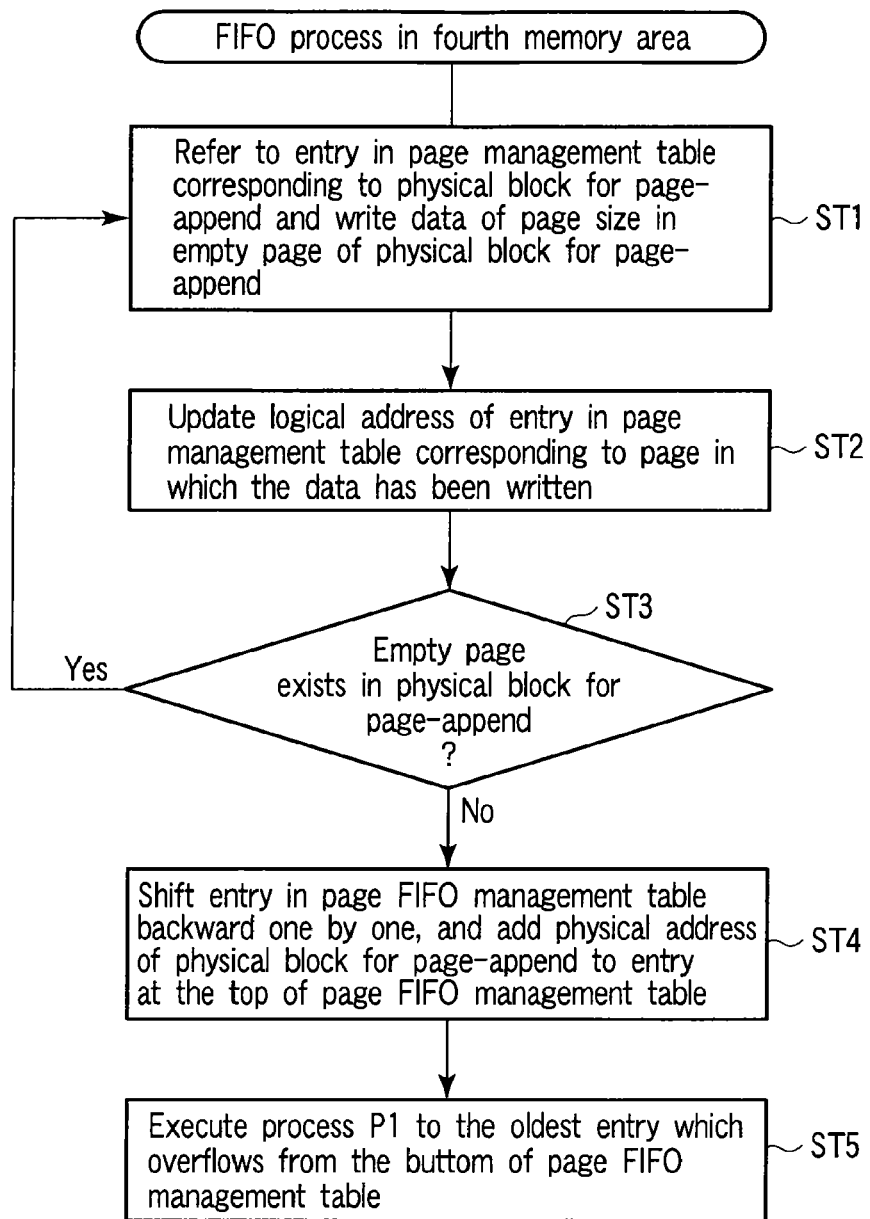
FIG. 26 is a flowchart showing a FIFO process in the fourth memory area.

As already described, the fourth memory area 14 has the FIFO structure of the block unit. FIG. 26 shows FIFO process in the fourth memory area 14.

1. The controller 10 refers to entries of the page management table corresponding to a block prepared for writing data in appending manner (hereinafter referred to as a physical block for page-append). The controller 10 stores data outputted from the first memory area 11, as data of the "small unit" which is equal to the page unit, in a page of write-enable state of the physical block for page-append (Step ST1).

The controller 10 searches the cache management table and judges whether all of sector unit data composing page unit data, which are determined to be outputted, exist in the first memory area 11.

If not all sector unit data are completed in the first memory area 11, the controller 10 collects missing data from the second, third, and fourth memory areas 12, 13, and 14.

After completing all sector unit data composing page unit data, the controller 10 instructs the nonvolatile semiconductor memory 22 to write the page unit data.

2. The controller 10 updates the logical address, recorded in the entry corresponding to the page in which the page unit data has been written, in the page management table (Step ST2). The old data included in the same logical address range, which had been written in the second and fourth memory areas 12 and 14, becomes invalid data.

3. The controller 10 judges whether there exits an empty page in the physical block for page-append (Step ST3). If the empty page is not detected, this process goes to the step ST4. If the empty page is detected, this process returns to the step ST1.

4. The controller 10 shifts the entries of the page FIFO management table backward one by one, and adds the physical address of the physical block for page-append to the entry at the top of the page FIFO management table (Step ST4). As a result, the physical block for page-append is allocated to the fourth memory area 14.

5. The controller 10 executes the following process P1 for the block having the oldest allocation order associated with the entry at the bottom of the page FIFO management table overflowing from the page FIFO management table (Step ST5).

B. Process P1

Figure 27:
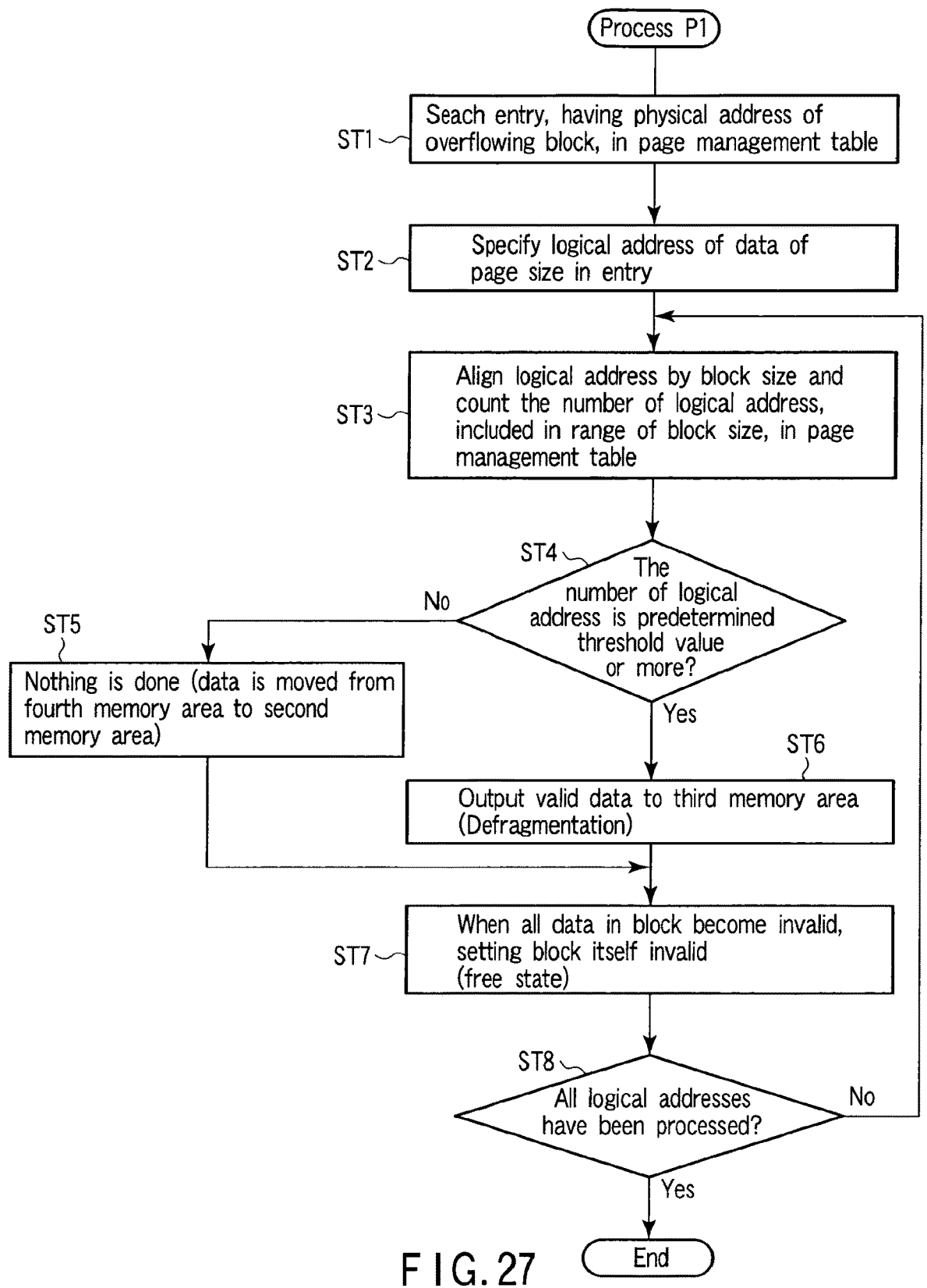
FIG. 27 is a flowchart showing process P1.

FIG. 27 shows the flowchart of process P1.
1. The controller 10 searches the page management table of FIG. 22 and detects the entry in which the physical address of the block overflowing from the fourth memory area 14 is recorded (Step ST1).
2. The controller 10 specifies the logical addresses of page unit data recorded in the entry (Step ST2). The following process is applied to each logical address.
3. The controller 10 aligns the logical address of the page unit data by a size of the "large unit" which is equal to the block unit, and counts up the number of logical addresses included in the logical address range aligned by a size of the block unit in the page management table (Step ST3).

Incidentally, "the logical address is aligned by a predetermined size (such as a size of the page unit or the block unit)" means that the logical address is rounded down to such an address that a reminder when the logical address is divided by the predetermined size is 0. For example, an address calculated by aligning the logical address A by the size S is (A−(a remainder when A is divided by S)). Similarly, "the logical address range aligned by a predetermined size" means that the range of the predetermined size from the address calculated by aligning the logical address by the predetermined size.

If the controller 10 counts up the number of logical addresses only in the entry having the physical address included in the page FIFO management table, the number of page unit data stored in the fourth memory area 14 is acquired. On the other hand, if the controller 10 does not limit the entry, the number of page unit data stored in the second and fourth memory areas 12 and 14 is acquired. The controller 10 can select either condition.

4. The controller 10 judges whether the number of logical addresses counted at the step ST3 is a predetermined threshold value or more (the third condition). For example, the predetermined threshold value may be set to be 50% of the total number of page unit ("small unit") data storable in one area of the block unit ("large unit") (Step ST4).

If the number of logical addresses counted in the step ST3 is less than the predetermined threshold value, this process goes to the step ST5. If the number of logical addresses counted in the step ST3 is not less than the predetermined threshold value, this process goes to the step ST6.

5. The controller 10 does not do anything to the page unit data. That is, the page unit data stays in the block overflowing from the fourth memory area 14 (Step ST5).
6. The controller 10 transfers the page unit data to the third memory area 13, as data of a size of the "large unit" which is equal to the block unit (Step ST6).

The controller 10 merges the page unit data into the block unit data, by collecting valid data included in the logical address range aligned by a size of the block unit, from the first, second, third, and fourth memory areas 11, 12, 13, and 14 (Defragmentation).

After completing valid data composing the block unit data, the controller 10 instructs the nonvolatile semiconductor memory 22 to write the block unit data in an empty block of the third memory area 13.

7. The controller 10 invalidates the data, which are included in the logical address range of the writing data, in the first, second, third, and fourth memory areas 11, 12, 13, and 14 (Step ST7).

If all the data in a block becomes invalid data, the controller 10 releases the block and sets the status of the block to be "free" state from "active" state in the physical block management table.

8. The controller 10 judges whether all logical addresses in the entry have been processed (Step ST8). If all logical addresses in the entry have been processed, this process is completed. If not all logical addresses in the entry have been processed, this process returns to the step ST3.

After completing the process P1, if valid data remains in the block which overflowed from the fourth memory area 14, the controller 10 sets the entry corresponding to the block to be "second memory area 12 (active)" in the physical block management table.

In the data transfer from the fourth memory area 14 to the second memory area 12, the controller 10 only updating the page FIFO management table and the physical block management table without instructing the nonvolatile semiconductor memory 22 to read/write data (Move process).

If there exits no empty page in the physical block for page-append, the controller 10 gets a free block by searching the physical block management table. After erasing data in the free block, this block is newly allocated to a physical block for page-append. The controller 10 searches an unused entry in the page management table. The physical address corresponding to the physical block for page-append is recorded in the unused entry.

According to the movement of the blocks from the fourth memory area 14, the number of blocks managed with the page unit is increased in the second memory area 12.

If the number of blocks in the second memory area 12 exceeds a permissive range, that is, the predetermined number of blocks defined as the capacity of the second memory area 12, the controller 10 executes the compaction or the data transfer process from the second memory area 12 to the third memory area 13 by the following procedures.

C. Process Example 1

Figure 28:
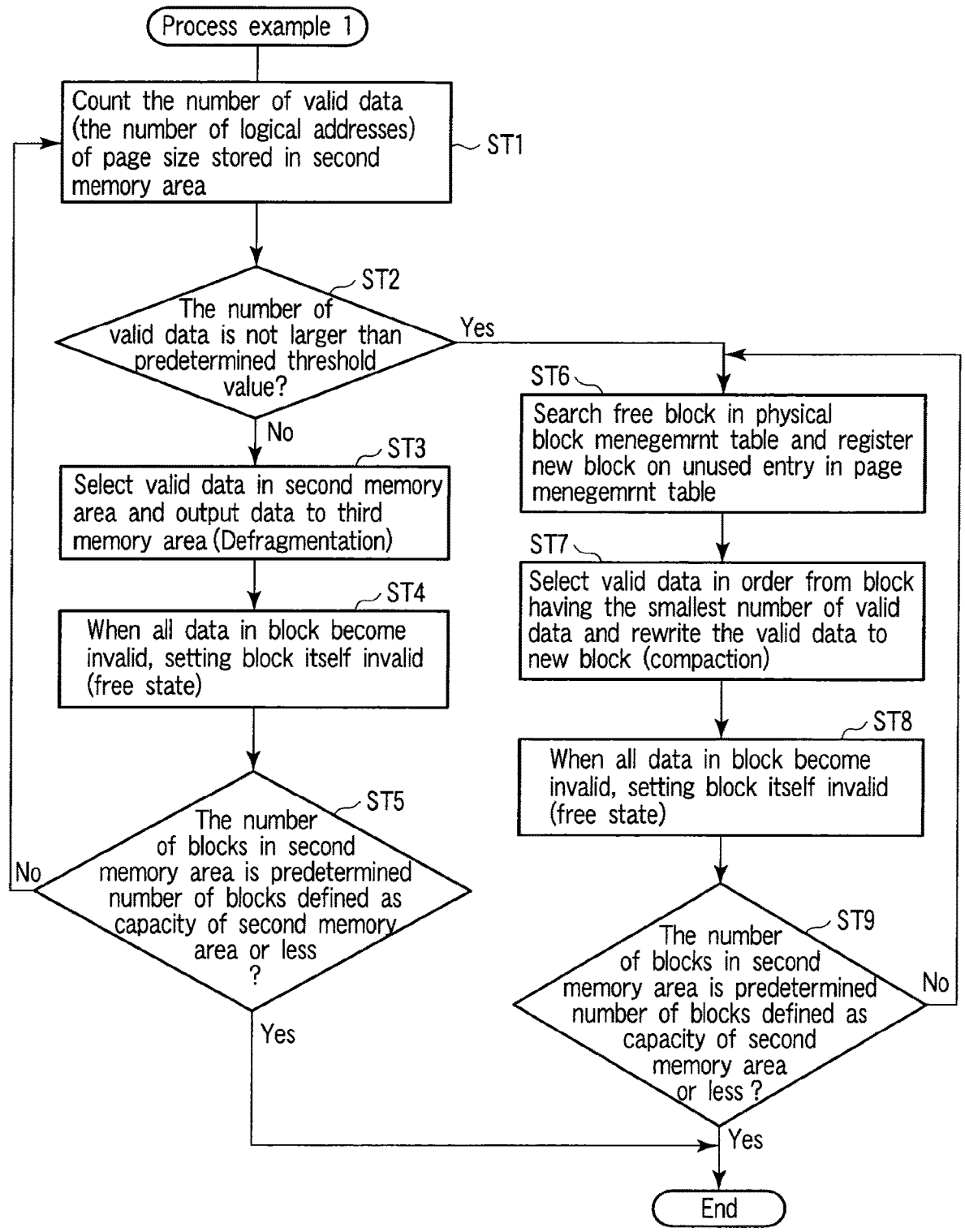
FIG. 28 is a flowchart showing a process example 1 of compaction.

FIG. 28 shows the flowchart of process example 1.
1. The controller 10 scans the page management table and counts up the number of data (the number of logical addresses) of the "small unit" which is equal to the page unit stored in the second memory area 12 (Step ST1).

At the step ST1, the entry with the physical address included in the page FIFO management table and the entry corresponding to the physical block for page-append are not targets to be scanned. Namely, the controller 10 only scans the second memory area 12.

2. The controller 10 judges whether the total number of the valid data of the page unit stored in the second memory area 12 is not larger than a predetermined threshold value (the fourth condition). For example, the predetermined threshold value may be the number of page unit data storable in the second memory area 12 (Step ST2).

If the total number of the valid data is larger than the predetermined threshold value, since the number of blocks in the second memory area 12 can not be decreased, by the compaction, to the permissive range, this process goes to the step ST3. If the total number of the valid data is not larger than the predetermined threshold value, this process goes to the step ST6.

3. The controller 10 selects valid data in the second memory area 12 based on a predetermined condition and transfers the selected data to the third memory area 13 as data of the "large unit" which is equal to the block unit (Step ST3). For example, the predetermined condition may be substantially the same as the second condition of "C. Data transfer process from the second memory area to the third memory area" (described in the section I.).

The controller 10 merges the valid data of the page unit into the block unit data, by collecting valid data included in the logical address range aligned by a size of the block unit, from the first, second, third, and fourth memory areas 11, 12, 13, and 14 (Defragmentation).

After completing valid data composing the block unit data, the controller 10 instructs the nonvolatile semiconductor memory 22 to write the block unit data in an empty block of the third memory area 13.

4. The controller 10 invalidates the data, which are included in the logical address range of the writing data, in the first, second, third, and fourth memory areas 11, 12, 13, and 14 (Step ST4).

If all the data in a block becomes invalid data, the controller 10 releases the block and sets the status of the block to be "free" state from "active" state in the physical block management table.

5. The controller 10 judges whether the number of blocks in the second memory area 12 is the predetermined number of blocks defined as the capacity of the second memory area 12 or less (Step ST5).

If the number of blocks in the second memory area 12 is the predetermined number of blocks defined as the capacity of the second memory area 12 or less, this process is completed. If the number of blocks in the second memory area 12 is larger than the predetermined number of blocks defined as the capacity of the second memory area 12, this process returns to the step ST1.

6. The controller 10 gets a free block by searching the physical block management table. After erasing data in the free block, this block is allocated to a compaction block. The controller 10 searches an unused entry in the page management table. The physical address of the compaction block is associated with the unused entry (Step ST6).

7. The controller 10 sequentially selects valid data of the page unit in order from the block with the smallest number of the valid data in the second memory area 12 (Step ST7). The selected valid data is copied to the compaction block and the logical addresses in the entry of the page management table corresponding to the compaction block are updated to the logical addresses of the copied data.

The controller 10 allocates the compaction block filled with the valid data to the second memory area 12 by updating the entry of the physical block management table to "second memory area 12 (active)".

At the step ST7 (the compaction), the latest valid data included in the logical address range of the copied data may be read out from the first memory area 11 and the copied data may be overwritten with the latest valid data. The sector unit data in the first memory area 11 taken into the copied data is rendered invalid state.

8. The controller 10 invalidates the data, which has the same logical address as the copied data, in the second memory area 12 (Step ST8). If all the data in a block becomes invalid data, the controller 10 releases the block and sets the status of the block to be "free" state from "active" state in the physical block management table.

9. The controller 10 judges whether the number of blocks in the second memory area 12 is the predetermined number of blocks defined as the capacity of the second memory area 12 or less (Step ST9).

If the number of blocks in the second memory area 12 is the predetermined number of blocks defined as the capacity of the second memory area 12 or less, this process is completed. If the number of blocks in the second memory area 12 is larger than the predetermined number of blocks defined as the capacity of the second memory area 12, this process returns to the step ST6.

D. Process Example 2

Figure 29:
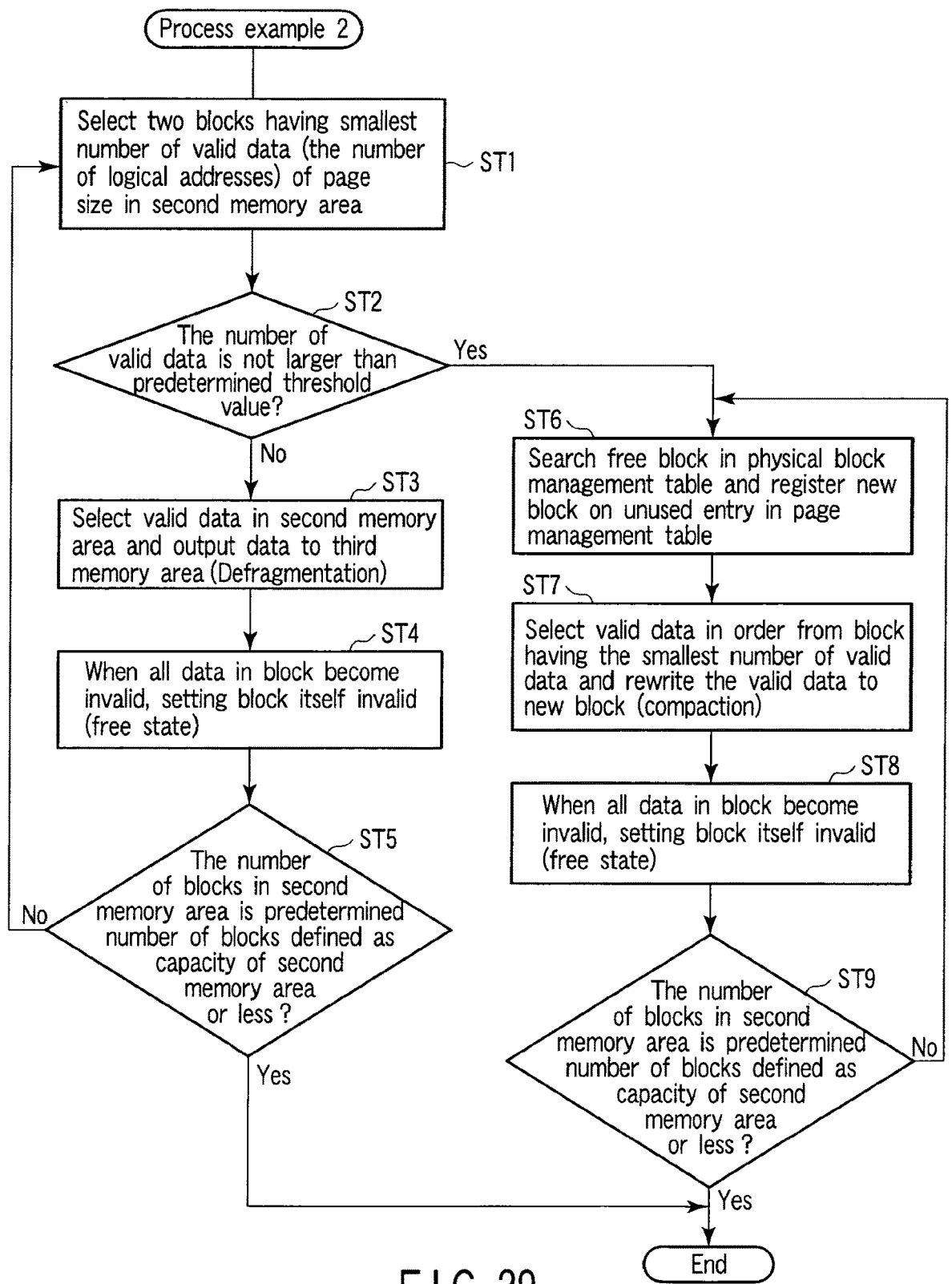
FIG. 29 is a flowchart showing a process example 2 of compaction.

FIG. 29 shows the flowchart of process example 2.

1. The controller 10 scans the page management table and selects two blocks with the smallest number of the valid data (the number of logical addresses) of the "small unit" which is equal to the page unit (Step ST1).

At the step ST1, the entry with the physical address included in the page FIFO management table and the entry corresponding to the physical block for page-append are not targets to be scanned. Namely, the controller 10 only scans the second memory area 12.

2. The controller 10 judges whether the total number of the valid data of the page unit in the selected two blocks is not larger than a predetermined threshold value (for example, the number of page unit data contained in the third unit) (the fourth condition) (Step ST2).

If the total number of the valid data is larger than the predetermined threshold value, since the number of blocks in the second memory area 12 may not be decreased, by the compaction, to the permissive range, this process goes to the step ST3. If the total number of the valid data is not larger than the predetermined threshold value, this process goes to the step ST6.

3. The controller 10 selects valid data in the second memory area 12 based on a predetermined condition and transfers the selected data to the third memory area 13 as data of the "large unit" which is equal to the block unit (Step ST3). For example, the predetermined condition may be substantially the same as the second condition of "C. Data transfer process from the second memory area to the third memory area" (described in the section I.).

The controller 10 merges the valid data of the page unit into the block unit data, by collecting valid data included in the logical address range aligned by a size of the block unit, from the first, second, third, and fourth memory areas 11, 12, 13, and 14 (Defragmentation).

After completing valid data composing the block unit data, the controller 10 instructs the nonvolatile semiconductor memory 22 to write the block unit data in an empty block of the third memory area 13.

4. The controller 10 invalidates the data, which are included in the logical address range of the writing data, in the first, second, third, and fourth memory areas 11, 12, 13, and 14.

If all the data in a block becomes invalid data, the controller 10 releases the block and sets the status of the block to be "free" state from "active" state in the physical block management table (Step ST4).

5. The controller 10 judges whether the number of blocks in the second memory area 12 is the predetermined number of blocks defined as the capacity of the second memory area 12 or less (Step ST5).

If the number of blocks in the second memory area 12 is the predetermined number of blocks defined as the capacity of the second memory area 12 or less, this process is completed. If the number of blocks in the second memory area 12 is larger than the predetermined number of blocks defined as the capacity of the second memory area 12, this process returns to the step ST1.

6. The controller 10 gets a free block by searching the physical block management table. After erasing data in the free block, this block is allocated to a compaction block. The controller 10 searches an unused entry in the page management table. The physical address of the compaction block is associated with the unused entry (Step ST6).

7. The controller 10 sequentially selects valid data of the page unit in order from the block with the smallest number of the valid data in the second memory area 12 (Step ST7). The selected valid data is copied to the compaction block and the logical addresses in the entry of the page management table corresponding to the compaction block are updated to the logical addresses of the copied data.

The controller 10 allocates the compaction block filled with the valid data to the second memory area 12 by updating the entry of the physical block management table to "second memory area 12 (active)".

At the step ST7, the latest valid data included in the logical address range of the copied data may be read out from the first memory area 11 and the copied data may be overwritten with the latest valid data. The sector unit data in the first memory area 11 taken into the copied data is rendered invalid state.

8. The controller 10 invalidates the data, which has the same logical address as the copied data, in the second memory area 12 (Step ST8). If all the data in a block becomes invalid data, the controller 10 releases the block and sets the status of the block to be "free" state from "active" state in the physical block management table.

9. The controller 10 judges whether the number of blocks in the second memory area 12 is the predetermined number of blocks defined as the capacity of the second memory area 12 or less (Step ST9).

If the number of blocks in the second memory area 12 is the predetermined number of blocks defined as the capacity of the second memory area 12 or less, this process is completed. If the number of blocks in the second memory area 12 is larger than the predetermined number of blocks defined as the capacity of the second memory area 12, this process returns to the step ST6.

In the step ST1 of the process example 2, although the two blocks with the smallest number of valid data are selected, the number is not limited to two, and two or more blocks may be selected.

In addition, the "predetermined threshold value" in the step ST2 of the process example 2, may be set the number of page unit data storable in the blocks smaller by one than the number of the selected blocks.

(2) Second Embodiment

Figure 30:
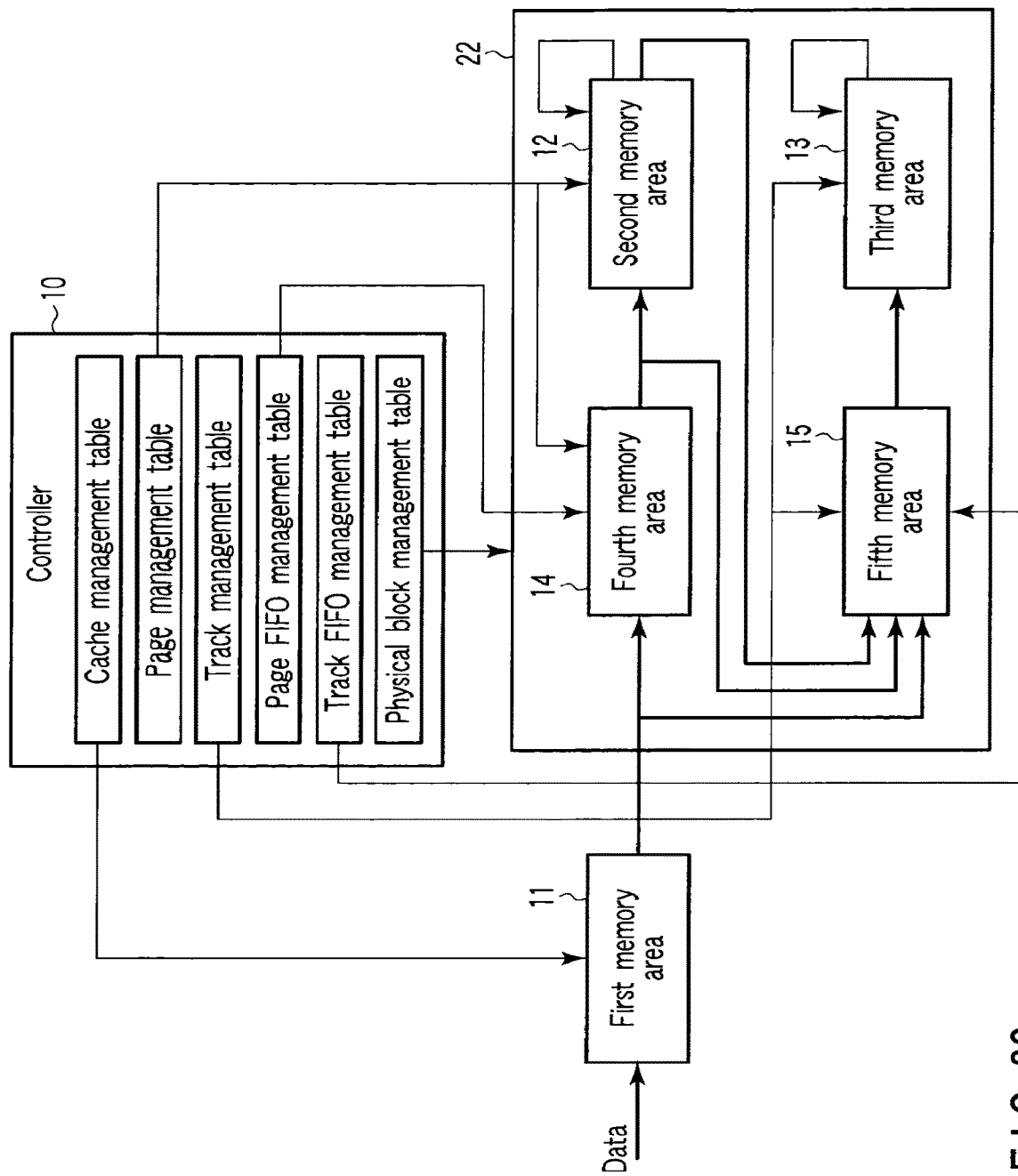
FIG. 30 is a diagram showing a configuration of a second embodiment.

FIG. 30 shows a semiconductor storage device according to a second embodiment.

A size of the "small unit" is a natural number times as large as a size of the page unit or a size of the page unit is a natural number times as large as a size of the "small unit".

A size of the "large unit" is twice or larger natural number times as large as a size of the "small unit", and at the same time, a size of the block unit is twice or larger natural number times as large as a size of the "large unit".

However, a page is controlled by being divided, specifically, a size of the "small unit" may be a natural number times as large as a size of the sector unit and a size of the page unit may be twice or larger natural number times as large as a size of the "small unit".

The above relation between the units may be set as following example: the sector unit (first unit)<the "small unit"<the page unit (second unit)<the "large unit"<the block unit (third unit).

In the second embodiment, a track unit is used as the "large unit". A size of the track unit is twice or larger natural number times as large as a size of the page unit and a size of the block unit is twice or larger natural number times as large as a size of the track unit.

According to using the track unit, the data management that uses the track management table and the track FIFO management table instead of the block management table is performed.

As with the first embodiment, in order to simplify the explanation, the page unit is used as the "small unit". However, a cluster unit may be used as the "small unit". A size of the cluster unit is twice or lager natural number times as large as a size of the sector unit and a size of the page unit is twice or larger natural number times as large as a size the cluster unit. The data management using the cluster unit is described later.

A first memory area 11 temporarily stores data from a host apparatus. The data is written by the sector unit (the first unit) or less in the first memory area 11. The first memory area 11 is included in a volatile semiconductor memory such as a DRAM.

A second memory area 12 is composed of blocks in a nonvolatile semiconductor memory 22. In the nonvolatile semiconductor memory 22, the unit in which reading/writing is executed at one time is a page (the second unit) and the unit in which erasing is executed at one time is a block (the third unit). A size of the block unit is natural number times as large as a size of the page unit. The second memory area 12 stores data by the "small unit" which is equal to the page unit.

A third memory area 13 is composed of blocks in the nonvolatile semiconductor memory 22 and stores data by the "large unit" which is equal to the track unit.

A fourth memory area 14 is composed of blocks in the nonvolatile semiconductor memory 22 and stores data by the "small unit" which is equal to the page unit.

A fifth memory area 15 is composed of blocks in the nonvolatile semiconductor memory 22 and stores data by the "large unit" which is equal to the track unit.

The storage capacity of the first memory area 11 is assumed to be larger than a size of the one block unit in the nonvolatile semiconductor memory 22, and the storage capacity of the nonvolatile semiconductor memory 22 is assumed to be larger than the storage capacity provided as the product specification of the semiconductor storage device (for example, SSD).

The storage capacity of the nonvolatile semiconductor memory 22 is allocated to the second, third, fourth, and fifth memory areas 12, 13, 14, and 15 as follows.

The storage capacity is allocated to the third and fifth memory areas 13 and 15 so that the total of the storage capacities of the third and fifth memory areas 13 and 15 is larger than the storage capacity provided as the product specification of the semiconductor storage device (for example, the capacity larger by about 1 to 5% than the storage capacity provided as the product specification of the semiconductor storage device is allocated).

Although the rate of the capacity between the third and fifth memory areas 13 and 15 is not limited, for example, the storage capacity of the third memory area 13 is set to be the same as the storage capacity provided as the product specification of the semiconductor storage device, and the storage capacity of the fifth memory area 15 is set to be about 1 to 5% of the storage capacity of the third memory area 13.

The storage capacity remaining by subtracting the storage capacities of the third and fifth memory areas 13 and 15 from the storage capacity of the nonvolatile semiconductor memory 22 is allocated to the second and fourth memory areas 12 and 14. Each storage capacity of the second and fourth memory areas 12 and 14 and the rate between them are not limited.

The second, third, fourth, and fifth memory areas 12, 13, 14 and 15 are composed of, for example, one or more blocks in the nonvolatile semiconductor memory 22, such as a NAND type flash memory.

In the second embodiment, in addition to the first, second, third, and fourth memory areas 11, 12, 13, and 14 described in the first embodiment, the fifth memory area is provided by allocating one or more block thereto.

As in the first embodiment, the first, second, and third units representing a size of data do not include redundant data (ECC, internal control flag, etc.) which is added to main data from the host apparatus in the semiconductor storage device.

The controller 10 operates a program for executing data management. The functions realized by the controller 10 can be implemented as any of hardware and software or the combination of the both. Whether these functions are implemented as hardware or software depends on the practical embodiment or the design constraints imposed on the entire system.

When the main memory of the controller 10 is comprised of a volatile semiconductor memory such as DRAM, the first memory area 11 may be configured in the main memory of the controller 10.

The controller 10 includes a cache management table, a page management table, a track management table, a page FIFO management table, a track FIFO management table, and a physical block management table in order to manage where data accessed by the logical address from the host apparatus is stored in the first, second, third, fourth, and fifth memory areas 11, 12, 13, 14, and 15.

—Cache Management Table—

The cache management table of FIG. 30 controls data stored in the first memory area 11 by the "small unit" which is equal to the page unit. The control of valid data is executed by the sector unit.

The configuration of the cache management table is shown in FIG. 21, as in the first embodiment. Since the cache management table has already been described in the first embodiment, the description is omitted here.

—Page Management Table—

The page management table of FIG. 30 controls data stored in the second and fourth memory areas 12 and 14 by the "small unit" which is equal to the page unit.

The configuration of the page management table is shown in FIG. 22, as in the first embodiment. Since the page management table has already been described in the first embodiment, the description is omitted here.

—Track Management Table—

FIG. 31 shows an example of a track management table.

The track management table controls data stored in the third and fifth memory areas 13 and 15 by the "large unit" which is equal to the track unit.

It is assumed that one entry is assigned to one block in the third and fifth memory areas 13 and 15.

The number of entries is assumed to be provided with allowance, in order to register the blocks in processing, to the number of blocks which can be contained within the third and fifth memory areas 13 and 15, that is, the number providing an allowance to [(the total capacity of the third and fifth memory areas 13 and 15)/(a size of the block unit)].

The physical address of the block allocated to the third memory area 13 or the fifth memory area 15 is associated with each entry, and the logical addresses of track unit data in the block are recorded in each entry.

A page availability is configured to be able to distinguish "write-enable" state (this storage area is empty) from "write-inhibit" state (this storage area is invalid because old data has once written therein and new data is written in another storage area) for pages in the area of the track unit.

In this example, the entry is configured by the block unit; however, in order to search the physical address of the block at high speed, from the logical address of the data, the entry of the track management table may be configured by the track unit arranged in order of the logical addresses.

—Page FIFO Management Table—

The page FIFO management table of FIG. 30 controls data in the blocks allocated to the fourth memory area 14.

The configuration of the page FIFO management table is shown in FIG. 24, as in the first embodiment. Since the page FIFO management table has already been described in the first embodiment, the description is omitted here.

—Track FIFO Management Table—

Figure 32:
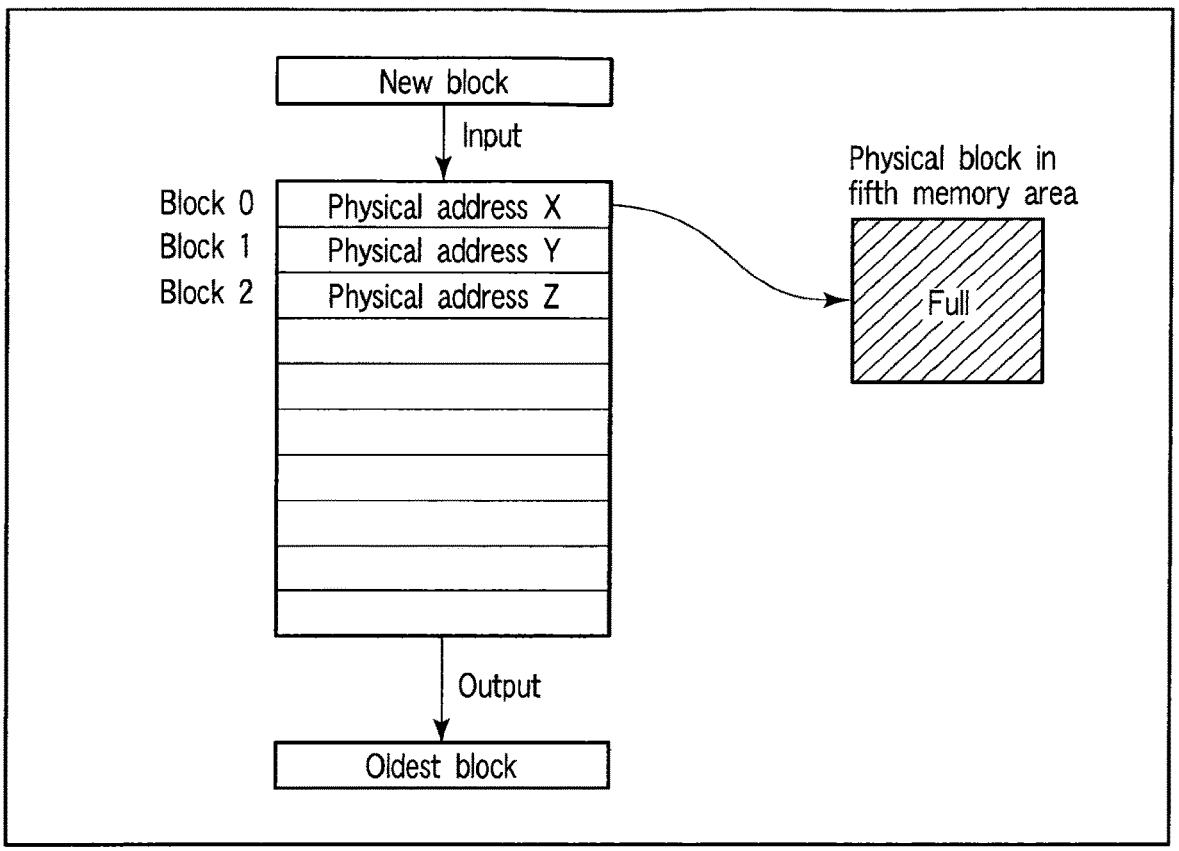
FIG. 32 is a diagram showing a track FIFO management table.

FIG. 32 shows an example of a track FIFO management table.

The track FIFO management table controls data in the blocks allocated to the fifth memory area 15.

It is assumed that one entry is assigned to one block in the fifth memory area 15. The number of entries is assumed to be the number of blocks which can be allocated to the fifth memory area 15, that is, (the total capacity of the fifth memory area 15)/(a size of the block unit).

The fifth memory area 15 is managed with FIFO (First-In First-Out) structure of the block unit by using the track FIFO management table.

An entry corresponding to a block newly allocated (inputted) to the fifth memory area 15 is added to the top (the entrance side) of the track FIFO management table, and entries originally registered in the track FIFO management table are shifted backward one by one.

When the number of entries exceeds a permissive range, the block having the oldest allocation order associated with the entry at the bottom (the exit side) of the track FIFO management table is outputted from the fifth memory area 15.

—Physical Block Management Table—

Figure 33:
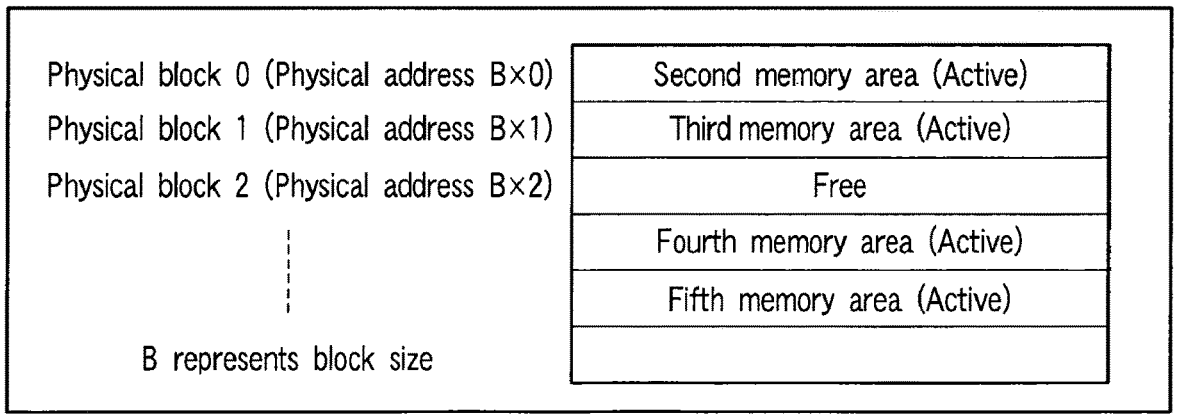
FIG. 33 is a diagram showing a physical block management table.

FIG. 33 shows an example of the physical block management table.

The physical block management table controls the usage of the blocks in the nonvolatile semiconductor memory 22.

It is assumed that one entry is assigned to one block (physical block) in the second, third, fourth, and fifth memory area 12, 13, and 14. The number of entries is assumed to be the number of blocks which can be used as a data area. Each entry is associated with the physical address of the block and stores the usage of the block (whether the storage area (block) is used as the second, third, fourth, and fifth memory areas (active) or is unused (free)).

A processing flow executed by the controller 10 of FIG. 30 is described.

The data stored in the first memory area 11 classified into the "small unit" or the "large unit", and the "small unit" data is outputted to the fourth memory area 14. The operation of the FIFO process in the fourth memory area 14 is the same as the first embodiment.

Namely, the FIFO process in the fourth memory area 14 is the same as the flow of FIG. 26. The process applied for the block which overflows from the fourth memory area 14 is substantially the same as the flow of FIG. 27 (however, the destination of the "large unit" data is the fifth memory area 15).

According to this configuration, as shown in the flows of FIG. 28 or 29, a target to be subjected to the compaction in the second memory area 12 is data having a low updating frequency outputted from the fourth memory area 14. Therefore, the erasing count is reduced to prevent the deterioration of memory cells.

However, in the second embodiment, the data which is determined to be outputted as "large unit" data from the first memory area 11 and the data which is determined to be outputted as "large unit" data from the second and fourth memory areas 12 and 14 are divided into data having a high updating frequency and data having a low updating frequency. The technique that only for the data having a low updating frequency is, in principle, a target to be subjected to the compaction is described.

In this embodiment, the track unit which has smaller size than the block unit is used as the "large unit", and the data management in the third and fifth memory areas 13 and 15 is performed in the track unit. Namely, a size of the management unit is smaller than a size of the block unit (the minimum erase unit) in the third and fifth memory areas 13 and 15, and therefore, the invalid data is generated in the blocks, whereby the compaction process is required to be performed.

Here, the data having a high updating frequency and the data having a low updating frequency are discriminated from each other, and in order to improve the efficiency of the compaction, the fifth memory area 15 having FIFO structure of the block unit is disposed before the third memory area 13.

The following operation will be described. The data which is determined to be outputted as "large unit" data from the first memory area 11 and the data which is determined to be outputted as "large unit" data from the second and fourth memory areas 12 and 14 are subjected to the FIFO process in the fifth memory area 15.

A. FIFO Process in the Fifth Memory Area

Figure 34:
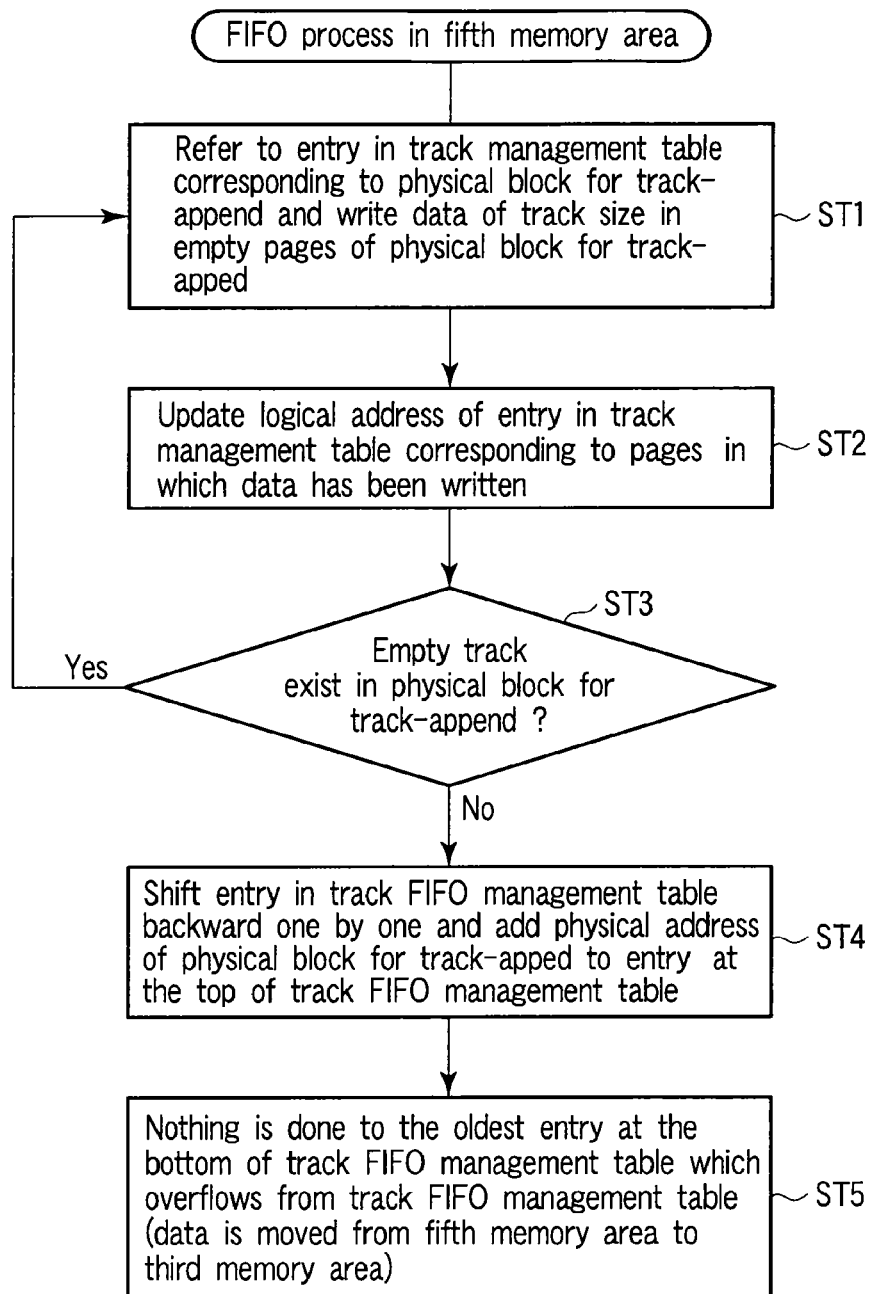
FIG. 34 is a flowchart showing a FIFO process in a fifth memory area.

FIG. 34 shows FIFO process in the fifth memory area 15. To simplify the explanation, the data which is determined to be outputted as "large unit" data from the first memory area 11 is particularly considered.

1. The controller 10 refers to entries of the track management table corresponding to a block prepared for writing data in appending manner (hereinafter referred to as a physical block for track-append). The controller 10 stores data outputted from the first memory areas 11 as data of the "large unit" which is equal to the track unit, in an area of the track unit with write-enable state in the physical block for track-append (Step ST1).

The controller 10 searches the cache management table and judges whether all of sector unit data composing track unit data, which are determined to be outputted, exist in the first memory area 11.

If not all sector unit data are completed in the first memory area 11, the controller 10 collects missing data from the second, third, fourth, and fifth memory areas 12, 13, 14, and 15.

After completing all sector unit data composing track unit data, the controller 10 instructs the nonvolatile semiconductor memory 22 to write the track unit data in the physical block for track-append.

2. The controller 10 updates the logical address, recorded in the entry corresponding to the area of the track unit (pages) in which the track unit data has been written, in the track management table (Step ST2). The old data included in the same logical address range, which had been written in the second, third, fourth, and fifth memory areas 12, 13, 14, and 15 becomes invalid data.

3. The controller 10 judges whether there exits an empty area of the track unit (empty pages) in the physical block for track-append (Step ST3). If the empty pages are not detected, this process goes to the step ST4. If the empty pages are detected, this process returns to the step ST1.

4. The controller 10 shifts the entries of the track FIFO management table backward one by one, and adds the physical address of the physical block for track-append to the entry at the top of the track FIFO management table (Step ST4). As a result, the physical block for track-append is allocated to the fifth memory area 15.

5. The controller 10 updates the entry corresponding to a block, which overflows from the fifth memory area 15, to be "third memory area 13 (active)" in the physical block management table (Step ST5).

In the data transfer from the fifth memory area 15 to the third memory area 13, the controller only updating the track FIFO management table and the physical block management table without instructing the nonvolatile semiconductor memory 22 to read/write data (Move process).

B. Process Example 1

Figure 35:
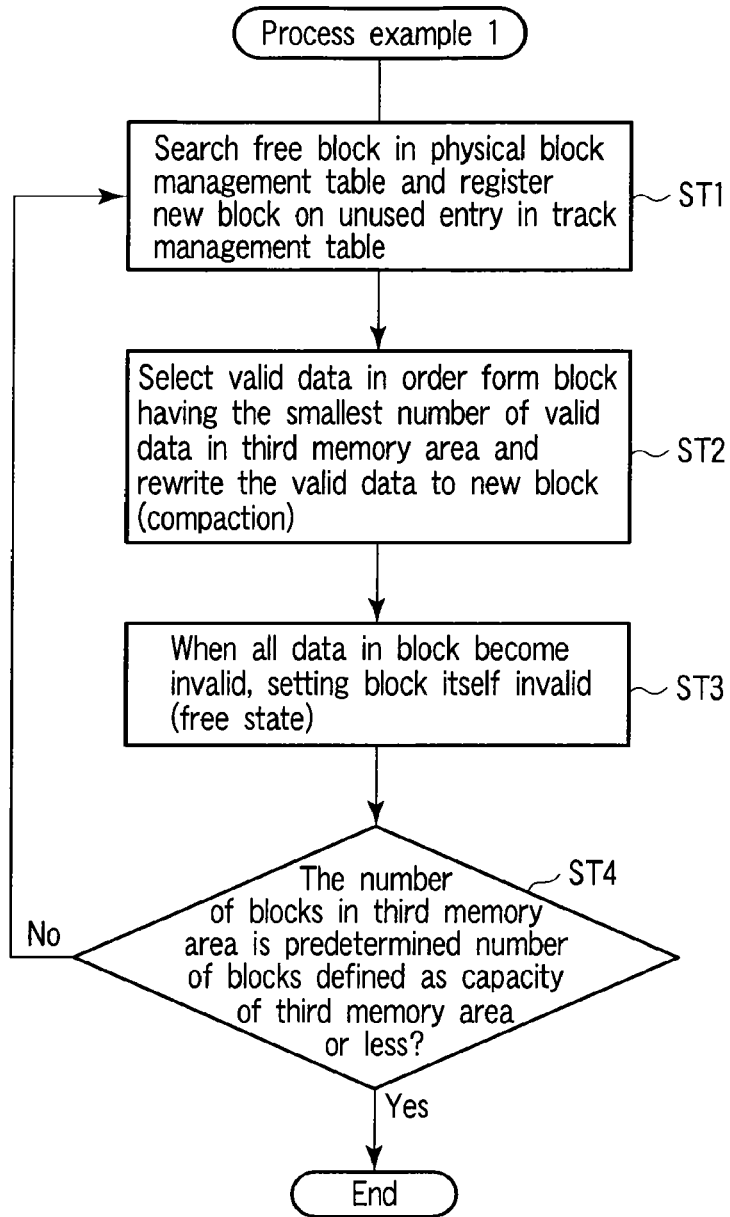
FIG. 35 is a flowchart showing a process example 1 of compaction.

FIG. 35 shows the flowchart of process example 1.

1. The controller 10 gets a free block by searching the physical block management table. After erasing data in the free block, this block is allocated to a compaction block. The controller 10 searches an unused entry in the track management table. The physical address of the compaction block is associated with the unused entry (Step ST1).

2. The controller 10 sequentially selects valid data of the track unit in order from the block with the smallest number of valid data by scanning the track management table. The selected valid data is copied to the compaction block and the logical addresses in the entry of the track management table associated with the compaction block are updated to the logical addresses of the copied data (Step ST2).

In the scanning of the track management table, the entries associated with the physical addresses included in the track FIFO management table and the entry corresponding to the physical block for track-append are not scanned. Namely, the third memory area 13 is scanned, but the fifth memory area 15 is not scanned.

At the step ST2 (the compaction), the valid data included in the logical address range of the copied data may be read out from the first, second, and fourth memory areas 11, 12, and 14 and the copied data may be overwritten with the valid data. The valid data in the first, second, and fourth memory areas 11, 12, and 14 involved in the compaction is rendered invalid state.

3. If all the data in a block becomes invalid data, the controller 10 releases the block and sets the status of the block to be "free" state from "active" state in the physical block management table (Step ST3).
4. The controller 10 judges whether the number of blocks in the third memory area 13 is the predetermined number of blocks defined as the capacity of the third memory area 13 or less (Step ST4).

If the number of blocks in the third memory area 13 is the predetermined number of blocks defined as the capacity of the third memory area 13 or less, this process is completed. If the number of blocks in the third memory area 13 is larger than the predetermined number of blocks defined as the capacity of the third memory area 13, this process returns to the step ST1.

C. Process Example 2

The compaction might not be able to be performed simply by using the blocks in the third memory area 13. Specifically, when the storage capacity as the product specification of the semiconductor storage device is larger than the storage capacity of the third memory area 13 and smaller than the total storage capacity of the third and fifth memory areas 13 and 15, the compaction might not be able to be performed.

Such a situation may occurs due to demand that the capacity as the product specification is made as close as possible to the total capacity of the NAND type flash memories in the semiconductor storage device.

In this case, when the total size (storage capacity) of the invalid data existing in the third memory area 13 does not reach a size of the block unit, a free block cannot be newly generated no matter how many times the compaction is performed in the third memory area 13.

Thus, in the above situation, the compaction is applied to both the third memory area 13 and the fifth memory area 15 only on an exceptional basis (the fifth condition).

Figure 36:
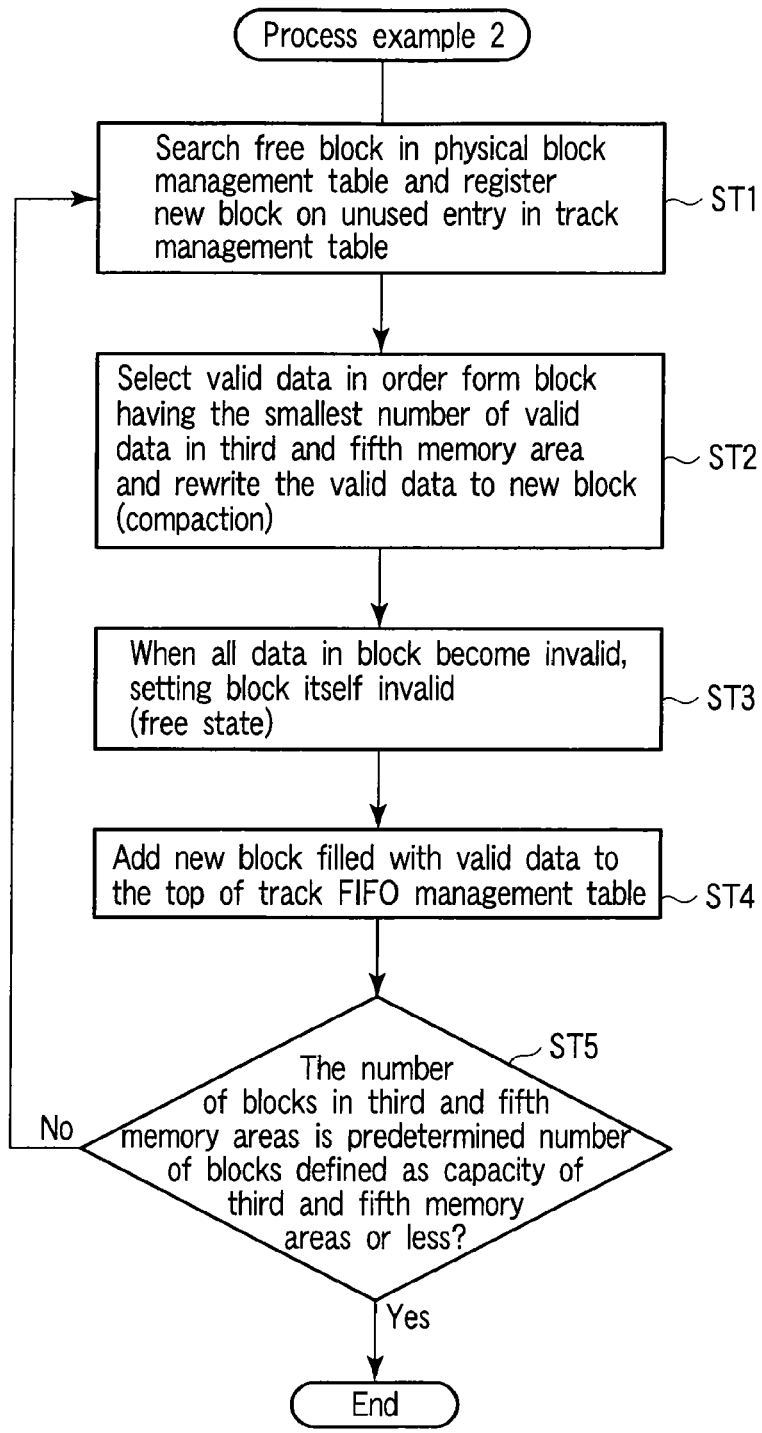
FIG. 36 is a flowchart showing a process example 2 of compaction.

FIG. 36 shows the flowchart of process example 2.

1. The controller 10 gets a free block by searching the physical block management table. After erasing data in the free block, this block is allocated a compaction block. The controller 10 searches an unused entry in the track management table. The physical address of the compaction block is associated with the unused entry (Step ST1).
2. The controller 10 sequentially selects valid data of the track unit in order from the block with the smallest number of valid data by scanning the track management table. The selected valid data is copied to the compaction block and the logical addresses in the entry of the track management table associated with the compaction block are updated to the logical addresses of the copied data (Step ST2).

In the scanning of the track management table, the entries associated with the physical addresses included in the track FIFO management table are also scanned. Namely, the third memory area 13 and the fifth memory area 15 are scanned.

At the step ST2 (the compaction), the valid data included in the logical address range of the copied data may be read out from the first, second, and fourth memory areas 11, 12, and 14 and the copied data may be overwritten with the valid data. The valid data in the first, second, and fourth memory areas 11, 12, and 14 involved in the compaction is rendered invalid state.

3. If all the data in a block becomes invalid data, the controller 10 releases the block and sets the status of the block to be "free" state from "active" state in the physical block management table (Step ST3).
4. The controller 10 adds the compaction block to the top of the track FIFO management table (Step ST4). This is because the invalid data in the fifth memory area 15 is required to be reduced.

If the number of invalid data in the fifth memory area 15 is reduced, the number of invalid data in the third memory area 13 is increased. Therefore, the compaction is applied only to the third memory area 13 as shown in the above process example 1, whereby the valid data in the third memory area 13 are collected, and a free block can be generated in the third memory area 13.

5. The controller 10 judges whether the number of blocks in the third and fifth memory areas 13 and 15 is the predetermined number of blocks defined as the capacity of the third and fifth memory areas 13 and 15 or less (Step ST5).

If the number of blocks in the third and fifth memory areas 13 and 15 is the predetermined number of blocks defined as the capacity of the third and fifth memory areas 13 and 15 or less, this process is completed. If the number of blocks in the third and fifth memory areas 13 and 15 is larger than the predetermined number of blocks defined as the capacity of the third and fifth memory areas 13 and 15, this process returns to the step ST1.

In each step ST1 in the process examples 1 and 2, as the process example 2 in the first embodiment (FIG. 29), two or more blocks with the smallest number of valid data of the track unit may be selected and the valid data may be copied to the compaction block.

In the second embodiment, the controller 10 allocates the storage area (the blocks) to the second memory area 12, the third memory area 13, the fourth memory area 14, and the fifth memory area 15, whereby the data management in the nonvolatile semiconductor memory is performed. However, it is not limited to this.

For example, the data management may be performed by configuring the second memory area 12, the third memory area 13, and the fifth memory area 15 without configuring the fourth memory area 14. Otherwise, the data management may be performed by configuring the third memory area 13 and the fifth memory area 15 without configuring the second memory area 12 and the fourth memory area 14.

(3) Third Embodiment

A third embodiment relates to data management configuration in the second and fourth memory areas 12 and 14, for reducing the implementation cost and the verification cost.

Figure 37:
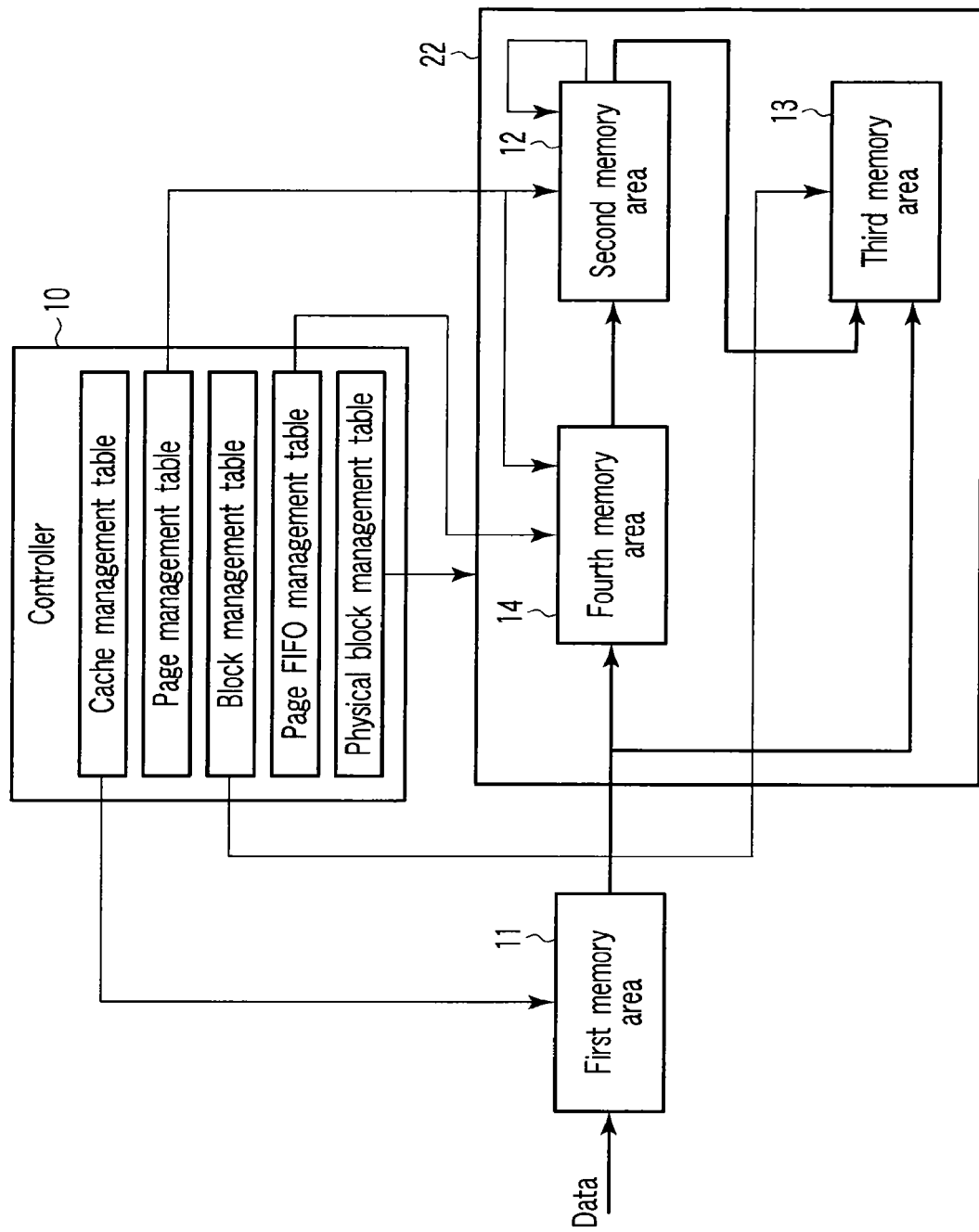
FIG. 37 is a diagram showing a configuration of a third embodiment.

FIG. 37 shows a semiconductor storage device according to the third embodiment.

A first memory area 11 temporarily stores data from a host apparatus. The data is written by the sector unit (the first unit) or less in the first memory area 11. The first memory area 11 is included in a volatile semiconductor memory such as a DRAM.

A second memory area 12 is composed of blocks in a nonvolatile semiconductor memory 22. In the nonvolatile semiconductor memory 22, the unit in which reading/writing is executed at one time is a page (the second unit) and the unit in which erasing is executed at one time is a block (the third unit). A size of the block unit is a natural number times as large as a size of the page unit. The second memory area 12 stores data by the "small unit" which is equal to the page unit.

A third memory area 13 is composed of blocks in the nonvolatile semiconductor memory 22 and stores data by the "large unit" which is equal to the block unit.

A fourth memory area 14 is composed of blocks in the nonvolatile semiconductor memory 22 and stores data by the "small unit" which is equal to the page unit.

The storage capacity of the first memory area 11 is assumed to be larger than a size of the one block unit in the nonvolatile semiconductor memory 22, and the storage capacity of the nonvolatile semiconductor memory 22 is assumed to be larger than the storage capacity provided as the product specification of the semiconductor storage device (for example, SSD).

The storage capacity of the nonvolatile semiconductor memory 22 is allocated to the second, third, and fourth memory areas 12, 13, and 14 as follows.

The storage capacity, which is the same as or larger than the storage capacity provided as the product specification of the semiconductor storage device, is allocated to the third memory area 13.

The storage capacity remaining by subtracting the storage capacity of the third memory area 13 from the storage capacity of the nonvolatile semiconductor memory 22 is allocated to the second and fourth memory areas 12 and 14. Each storage capacity of the second and fourth memory areas 12 and 14 and the rate are not limited.

The second, third, and fourth memory areas 12, 13, and 14 are composed of, for example, one or more blocks in the nonvolatile semiconductor memory 22, such as a NAND type flash memory.

The first, second, and third units representing a size of data do not include redundant data (ECC, internal control flag, etc.) which is added to main data from the host apparatus in the semiconductor storage device.

A controller 10 has a CPU and a main memory, and can operate a program for executing data management. In this embodiment, the functions realized by the controller 10 can be implemented as any of hardware and software or the combination of the both. Whether these functions are implemented as hardware or software depends on the practical embodiment or the design constraints imposed on the entire system.

When the main memory of the controller 10 is comprised of a volatile semiconductor memory such as DRAM, the first memory area 11 may be configured in the main memory of the controller 10.

The controller 10 includes a cache management table, a page management table, a block management table, a page FIFO management table, and a physical block management table in order to manage where data accessed by the logical address from the host apparatus is stored in the first, second, third and fourth memory areas 11, 12, 13, and 14. These management tables are expanded onto the main memory of the controller 10 during the operation of the semiconductor storage device.

—Cache Management Table—

The cache management table of FIG. 37 controls data stored in the first memory area 11 by the "small unit" which is equal to the page unit. The control of the valid data is executed by the sector unit.

The configuration of the cache management table is shown in FIG. 21 as in the first embodiment. Since the cache management table has already been described in the first embodiment, the detailed description is omitted here.

—Page Management Table—

The page management table of FIG. 37 controls data stored in the second and fourth memory areas 12 and 14 by the "small unit" which is equal to the page unit.

The configuration of the page management table is shown in FIG. 22 as in the first embodiment. Since the page management table has already been described in the first embodiment, the detailed description is omitted here.

—Block Management Table—

The block management table of FIG. 37 controls data stored in the third memory area 13 by the "large unit" which is equal to the block unit.

The configuration of the block management table is shown in FIG. 23 as in the first embodiment. Since the block management table has already been described in the first embodiment, the detailed description is omitted here.

—Page FIFO Management Table—

The page FIFO management table of FIG. 37 controls data in the blocks allocated to the fourth memory area 14.

The configuration of the page FIFO management table is shown in FIG. 24 as in the first embodiment. Since the page FIFO management table has already been described in the first embodiment, the detailed description is omitted here.

—Physical Block Management Table—

The physical block management table of FIG. 37 controls the usage of blocks in the nonvolatile semiconductor memory 22.

The configuration of the physical block management table is shown in FIG. 25 as in the first embodiment. Since the physical block management table has already been described in the first embodiment, the detailed description is omitted here.

A process flow executed by the controller 10 of FIG. 37 is described.

The controller 10 first writes sector unit (first unit) data from the host apparatus in the first memory area 11 and stores the data for a certain period therein. With regard to this data store process, "A. Data store process in the first memory area" described in the section I. can be applicable.

The controller 10 distinguishes whether the data stored in the first memory area 11 should be managed with the "small unit (first management unit)" or the "large unit (second management unit)", based on a predetermined condition (which may be substantially the same as the first condition of "B. Data output process from the first memory area" described in the section I.).

A size of the "small unit" is a natural number times as large as a size of the page unit or a size of the page unit is a natural number times as large as a size of the "small unit".

A size of the "large unit" is twice or larger natural number times as large as a size of the "small unit", and at the same time, is a natural number times as large as a size of the block unit.

In this embodiment, to simplify the explanation, each of the units used in management tables is assumed below:

A size of the "small unit" which is a data management unit in the second and fourth memory areas 12 and 14 is equal to a size of the page unit (second unit). A size of the "large unit" which is a data management unit in the third memory area 13 is equal to a size of the block unit (third unit).

However, a page is controlled by being divided, specifically, a size of the "small unit" may be a natural number times as large as a size of the sector unit and a size of the page unit may be twice or larger natural number times as large as a size of the "small unit".

Alternatively, plural pages are collectively controlled, specifically, a size of the "small unit" may be twice or larger natural number times as large as a size of the page unit and a size of the block unit may be twice or larger natural number times as large as a size of the "small unit".

Likewise, a block is controlled by being divided, specifically, a size of the "large unit" may be twice or larger natural number times as large as a size of the "small unit" and a size of the block unit may be twice or larger natural number times as large as a size of the "large unit".

Alternatively, plural blocks are collectively controlled, specifically, a size of the "large unit" may be twice or larger natural number times as large as a size of the block unit.

The above relation between the units may be set as following example: the sector unit (first unit)<the "small unit"<the page unit (second unit)<the block unit (third unit)≤the "large unit".

If the data stored in the first memory area 11 is managed with the "small unit", the data is transferred to the fourth memory area 14. If the data stored in the first memory area 11 is managed with the "large unit", the data is transferred to the third memory area 13.

This data output process is substantially the same as "B. Data output process from the first memory area" described in the section I. However, different from the section I., the destination of the "small unit" data is the fourth memory area 14.

A. FIFO Process in the Fourth Memory Area

Figure 38:
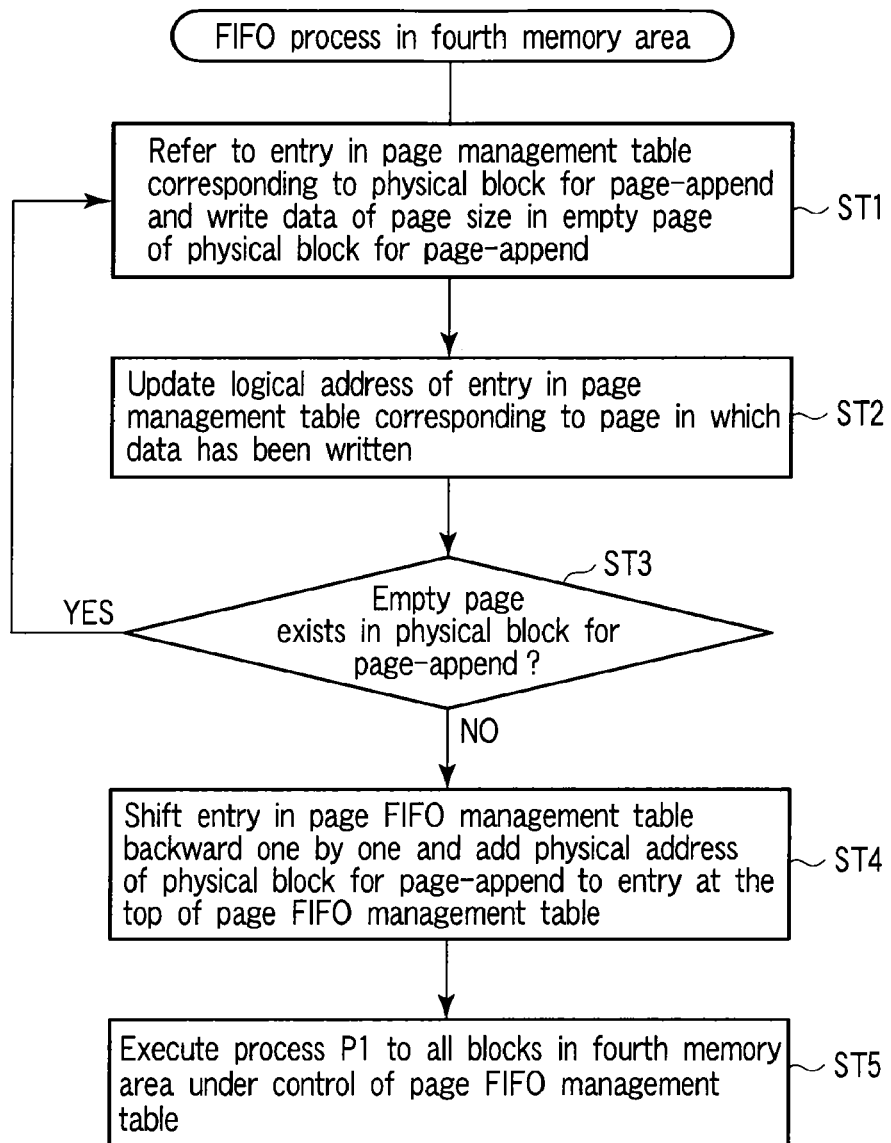
FIG. 38 is a flowchart showing a FIFO process in the fourth memory area.

As already described, the fourth memory area 14 has the FIFO structure of the block unit. FIG. 38 shows the FIFO process in the fourth memory area 14.

1. The controller 10 refers to entries of the page management table corresponding to a block prepared for writing data in appending manner (hereinafter referred to as a physical block for page-append). The controller 10 stores data outputted from the first memory area 11, as data of the "small unit" which is equal to the page unit, in a page of write-enable state of the physical block for page-append (Step ST1).
2. The controller 10 updates the logical address, recorded in the entry corresponding to the page in which the page unit data has been written, in the page management table (Step ST2). The old data included in the same logical address range, which had been written in the second and fourth memory areas 12 and 14, becomes invalid data.
3. The controller 10 judges whether there exits an empty page in the physical block for page-append (Step ST3). If the empty page is not detected, this process goes to the step ST4. If the empty page is detected, this process returns to the step ST1.
4. The controller 10 shifts the entries of the page FIFO management table backward one by one, and adds the physical address of the physical block for page-append to the entry at the top of the page FIFO management table (Step ST4). As a result, the physical block for page-append is allocated to the fourth memory area 14.
5. The controller 10 executes the following process P1 for all the blocks in the fourth memory area 14 of which physical addresses are recorded in the page FIFO management table (Step ST5).

The process P1 is different from the first embodiment and the second embodiment in the point of adopting the compaction. This point is effective in the case where the utilization efficiency of blocks in the fourth memory area 14 is bad. In order to suppress the increase of writing operation, the block with much valid data is excluded from the object of the compaction.

B. Process P1

Figure 39:
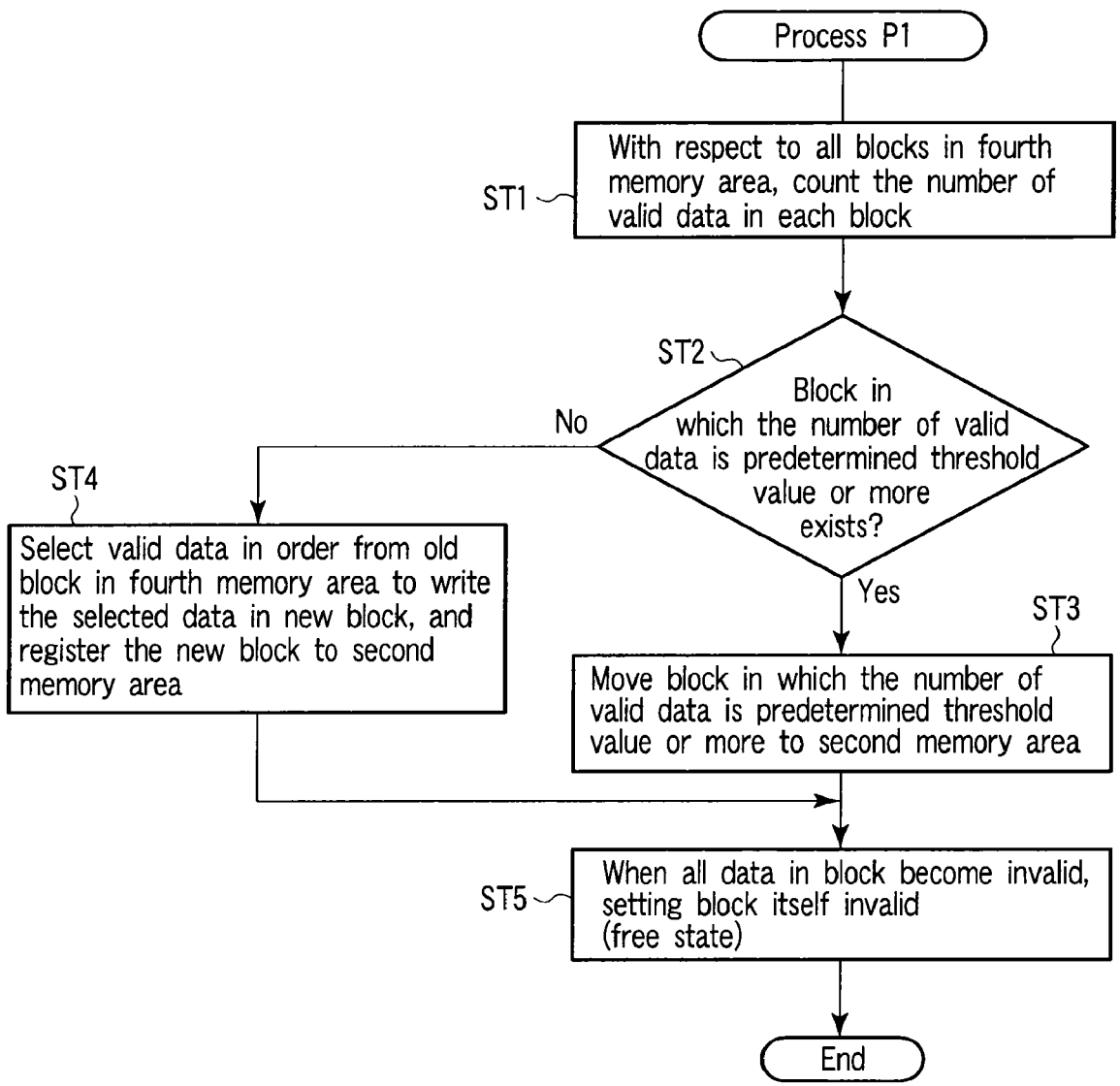
FIG. 39 is a flowchart showing a process P1.
Figure 40:
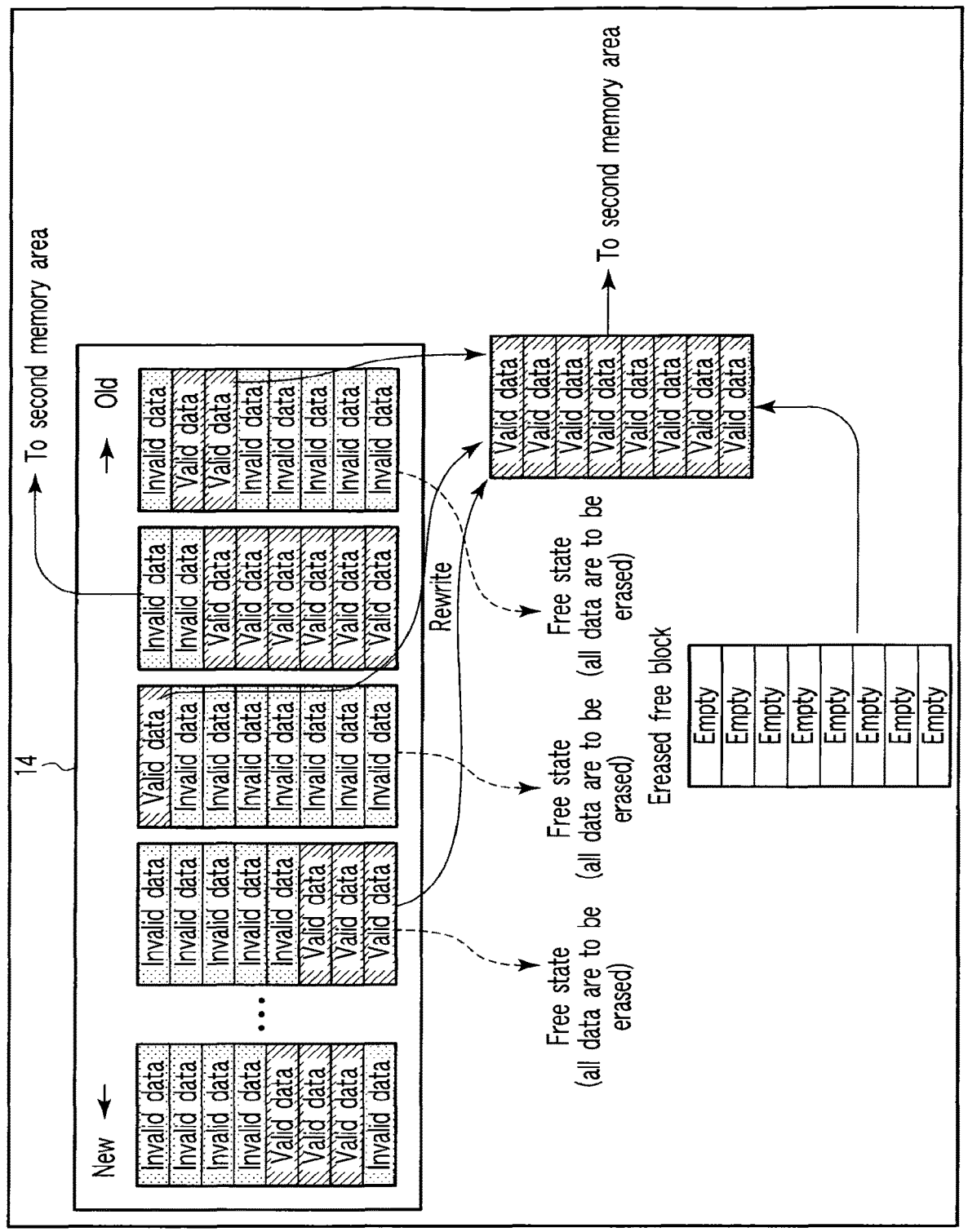
FIG. 40 is a diagram showing a state of the fourth memory area.

FIG. 39 shows the flowchart of process P1. FIG. 40 shows the state of the blocks in the fourth memory area 14 during executing the process P1. Each of the blocks is composed of plural pages. Each of the pages is rendered to be any of three states including "valid", "invalid", and "empty" by referring page availability in the page management table.

1. The controller 10 counts up the number of valid data stored in each block, with respect to all the blocks in the fourth memory area 14, by searching the page management table at the physical addresses recorded in the page FIFO management table (Step ST1).
2. The controller 10 judges whether there exits a block in which the number of valid data counted at the step ST1 is a predetermined threshold value or more. For example, the predetermined threshold value may be set to be 50% of the total number of page unit ("small unit") data storable in one block (Step ST2).

If the block, in which the number of valid data is the predetermined threshold value or more, is detected, this process goes to the step ST3. If the block is not detected, this process goes to the step ST4.

3. The controller 10 moves the blocks, in which the number of valid data is the predetermined threshold value or more, to the second memory area 12 (Step ST3). That is, with respect to the physical address of the block, the controller 10 invalidates the entry of the page FIFO management table and updates the entry of the physical block management table to be "second memory area (active)".

In the data transfer from the fourth memory area 14 to the second memory area 12, the controller only updating the page FIFO management table and the physical block management table without instructing the nonvolatile semiconductor memory 22 to read/write data (Move process).

4. The controller 10 sequentially selects valid data in order from the block with the oldest allocation order in the fourth memory area 14. The selected valid data is copied to an erased free block (compaction block). The controller 10 allocates the compaction block filled with valid data to the second memory area 12 (Step ST4).
5. The controller 10 invalidates the data, which has the same logical address as the copied data, in the fourth memory area 14. If all the data in a block becomes invalid data, the controller 10 releases the block and sets the status of the block to be "free" state from "active" state in the physical block management table (Step ST5).

If there exits no empty page in the physical block for page-append, the controller 10 gets a free block by searching the physical block management table. After erasing data in the free block, this block is newly allocated to a physical block for page-append. The controller 10 searches an unused entry in the page management table. The physical address corresponding to the physical block for page-append is recorded in the unused entry.

According to the movement of the blocks from the fourth memory area 14, the number of blocks managed with the page unit is increased in the second memory area 12. If the number of blocks in the second memory area 12 exceeds a permissive range, that is, the predetermined number of blocks defined as the capacity of the second memory area 12, the controller 10 executes the compaction or the data transfer process from the second memory area 12 to the third memory area 13 by the following procedures.

In addition, different from the first embodiment, the process P1 does not include the data transfer process (Defragmentation) to the third memory area 13. This simplifies the data transfer process from the fourth memory area 14 to the second memory area 12.

C. Process Example

Figure 41:
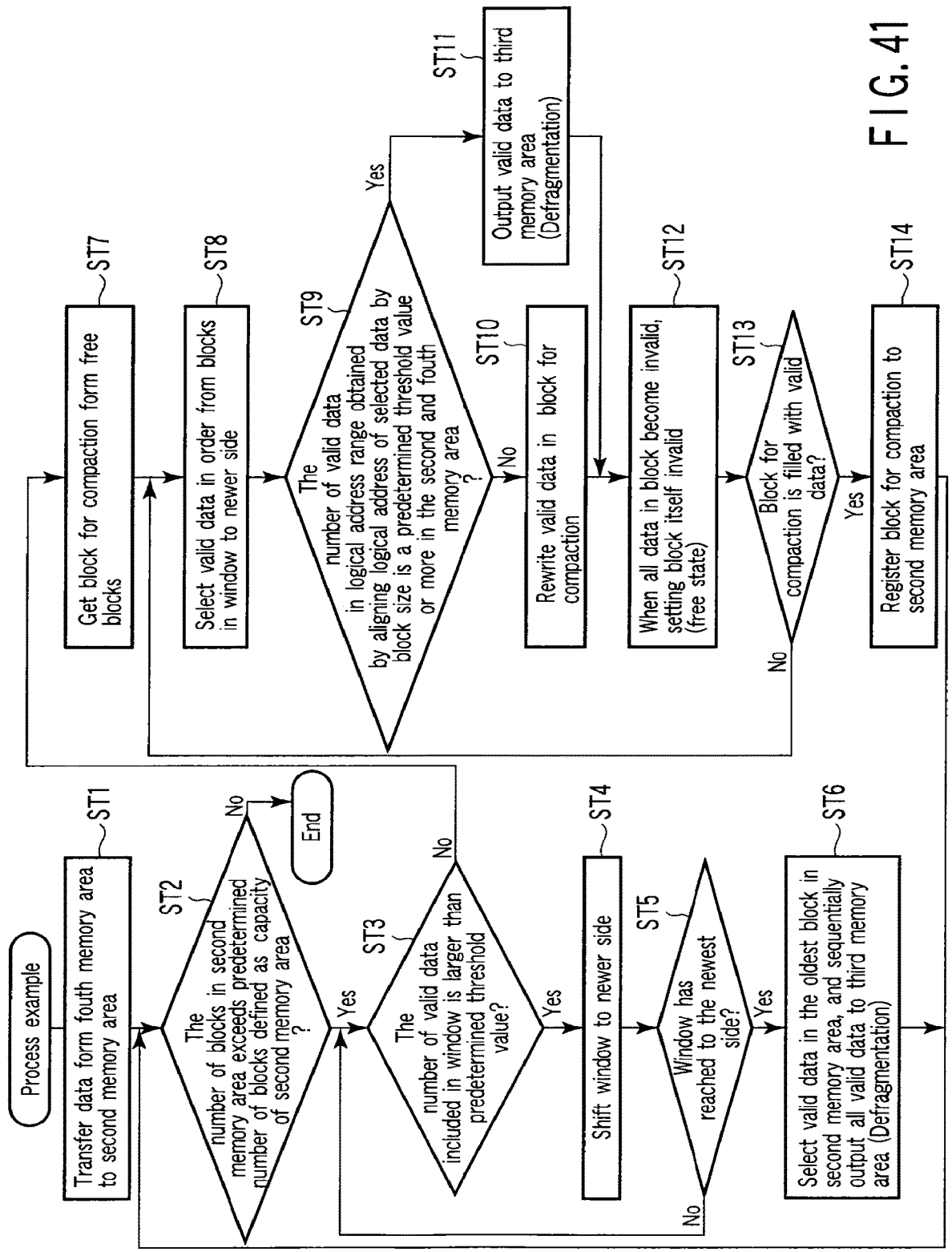
FIG. 41 is a flowchart showing a process example of a data transfer process from the second memory area to the third memory area, and a compaction process.

FIG. 41 shows the flowchart of process example. FIGS. 42 to 46 show the state of the blocks in the second memory area 12 during executing the process of FIG. 41. As illustrated in FIGS. 42 to 46, the allocation order of the blocks in the second memory area 12 is managed by the controller 10.

Each of the blocks is composed of plural pages. Each of the pages is rendered to be any of three states including "valid", "invalid", and "empty" by referring to page availability in the page management table.

1. According to the above process P1, the controller 10 transfers data from the fourth memory area 14 to the second memory area 12 (Step ST1).
2. The controller 10 judges whether the number of blocks in the second memory area 12 exceeds a permissive range (Step ST2). The permissive range may be the predetermined number of blocks defined as the capacity of the second memory area 12.

If the number of blocks does not exceed the permissive range, this process is completed. If the number of blocks exceeds the permissive range, this process goes to the step ST3.

3. The controller 10 counts up the number of valid data (the number of entries) stored in a specified range of the blocks by referring to the page management table and judges whether the total number of valid data stored in the specified range is larger than a predetermined threshold value (Step ST3).

Figure 42:
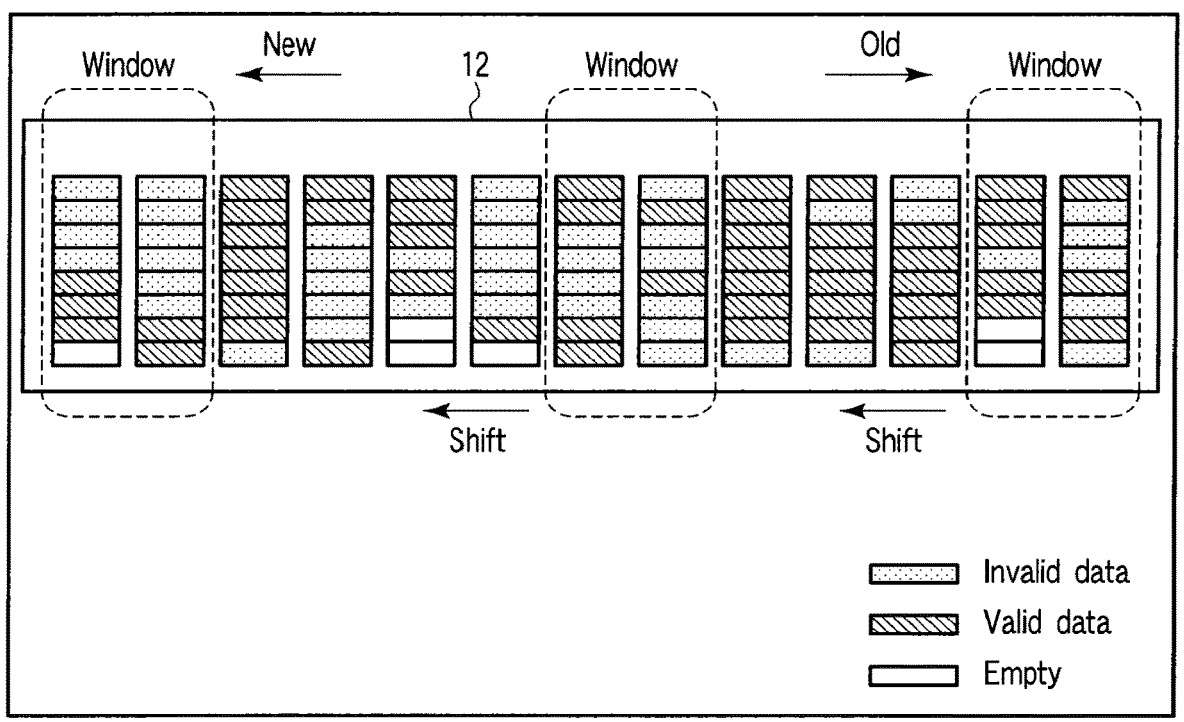
FIG. 42 is a diagram showing a state of the second memory area.

The specified range includes two adjacent blocks in the second memory area 12, for example. "Adjacent blocks" means the blocks of which allocation order is successive. A "window" of FIG. 42 shows the specified range of the blocks. A starting position of the "window" is set so as to include the block with the oldest allocation order.

The predetermined threshold value at the step ST3 may be the number of page unit data storable in the half of the blocks included in the specified range. FIG. 42 shows the two blocks included in the specified range, and the predetermined number is set to be the number of page unit data storable in one block which is the half of the two blocks.

If the number of valid data is larger than the predetermined threshold value, this process goes to the step ST4. If the number of valid data is the predetermined threshold value or less, this process goes to the step ST7 and the controller 10 executes the defragmentation and the compaction (FIGS. 43 and 44) for the present "window".

4. The controller 10 shifts the "window" from older side to the newer side (Step ST4). Specifically, the controller 10 shifts the "window" one by one from the side of the block with the oldest allocation order to the block with the newest allocation order, in the second memory area 12.
5. The controller 10 judges whether the "window" has exceeded the block with the newest allocation order in the second memory area 12 (Step ST5). If the "window" has exceeded the block with the newest allocation order, this process goes to the step ST6. If the "window" has not exceeded the block with the newest allocation order, this process returns to the step ST3.
6. The controller 10 selects all valid data in the block with the oldest allocation order and transfers the selected valid data to the third memory area 13 as data of the "large unit" which is equal to the block unit (Defragmentation) (Step ST6). The step ST6 is executed in the case where the controller 10 cannot detect the target of the compaction in the second memory area 12.

Figure 45:
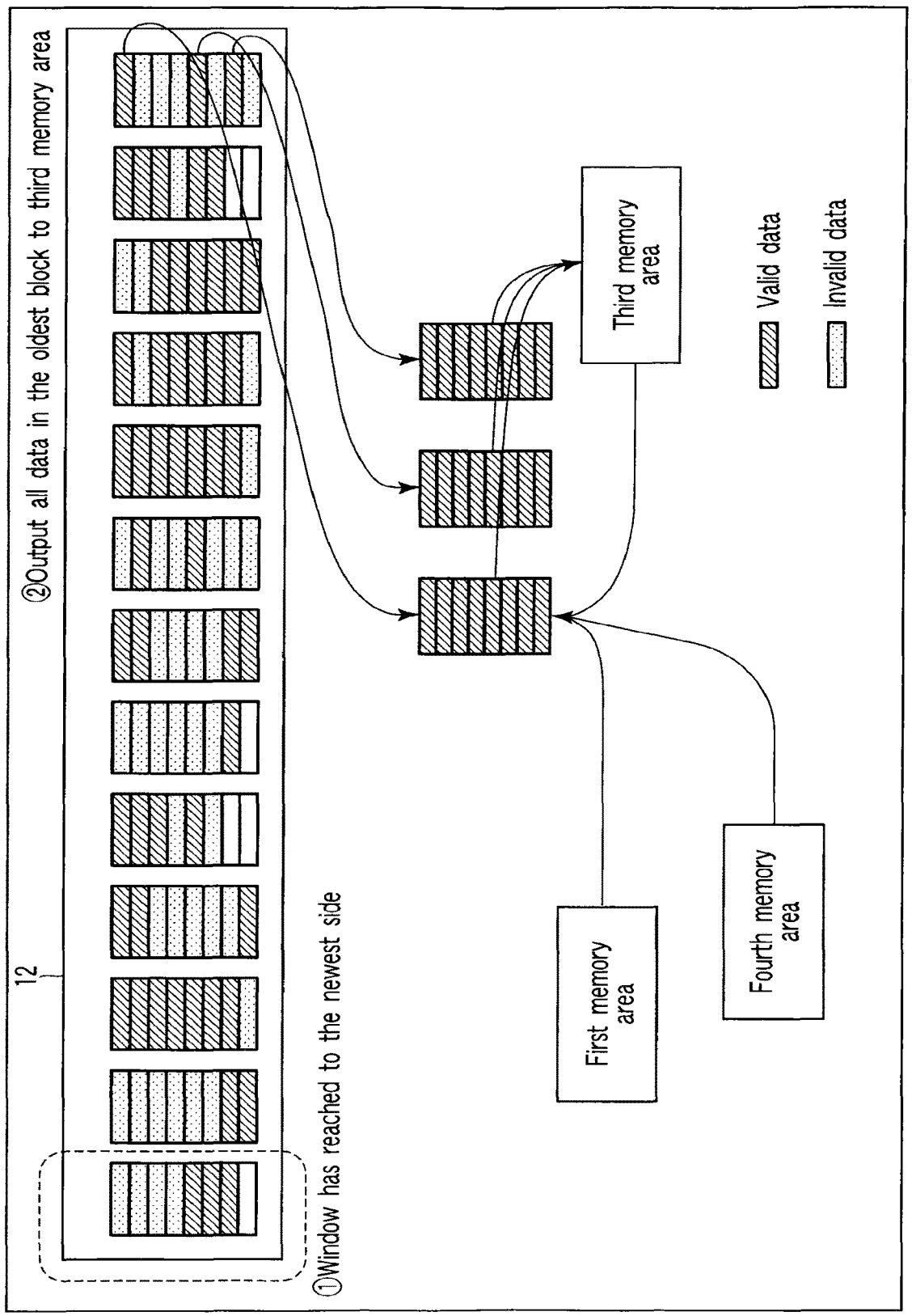
FIG. 45 is a diagram showing a state of the second memory area.

As shown in FIG. 45, valid data included in the logical address range, which is calculated by aligning the logical address of the valid data stored in the block with the oldest allocation order by a size of the block unit ("large unit"), are collected from the first, second, third, and fourth memory areas 11, 12, 13, and The controller 10 instructs the nonvolatile semiconductor memory 22 to write the block unit data in the third memory area 13. After writing the block unit data, the controller 10 releases the block with oldest allocation order, and this process returns to the step ST2. A position of the "window" is reset to the starting position.

7. The controller 10 searches the physical block management table and gets free blocks (compaction blocks) (Step ST7). The free blocks are provided for the compaction and the number of free blocks required at the step ST7 is the half of the blocks included in the specified range. In FIG. 44, one free block is provided for the compaction. The controller 10 instructs the nonvolatile semiconductor memory 22 to erase data in the free blocks.
8. The controller 10 sequentially selects valid data stored in the "window" (Step ST8). If all valid data stored in the "window" has been processed, the blocks positioned at newer side than that of the "window" are further searched in order of allocation to the fourth memory area 14, and the controller 10 continues to select valid data.
9. The controller 10 judges whether the total number of valid data included in the logical address range, which is calculated by aligning the logical address of the selected valid data by a size of the block unit ("large unit"), is a predetermined threshold value or more in the second and fourth memory areas 12 and 14 (Step ST9). The predetermined threshold value at the step ST9 may be set to be 50% of the total number of page unit ("small unit") data storable in one area of the block unit ("large unit").

If the total number of valid data is less than the predetermined threshold value, this process goes to the step ST10. If the total number of valid data is the predetermined threshold value or more, this process goes to the step ST11.

Figure 43:
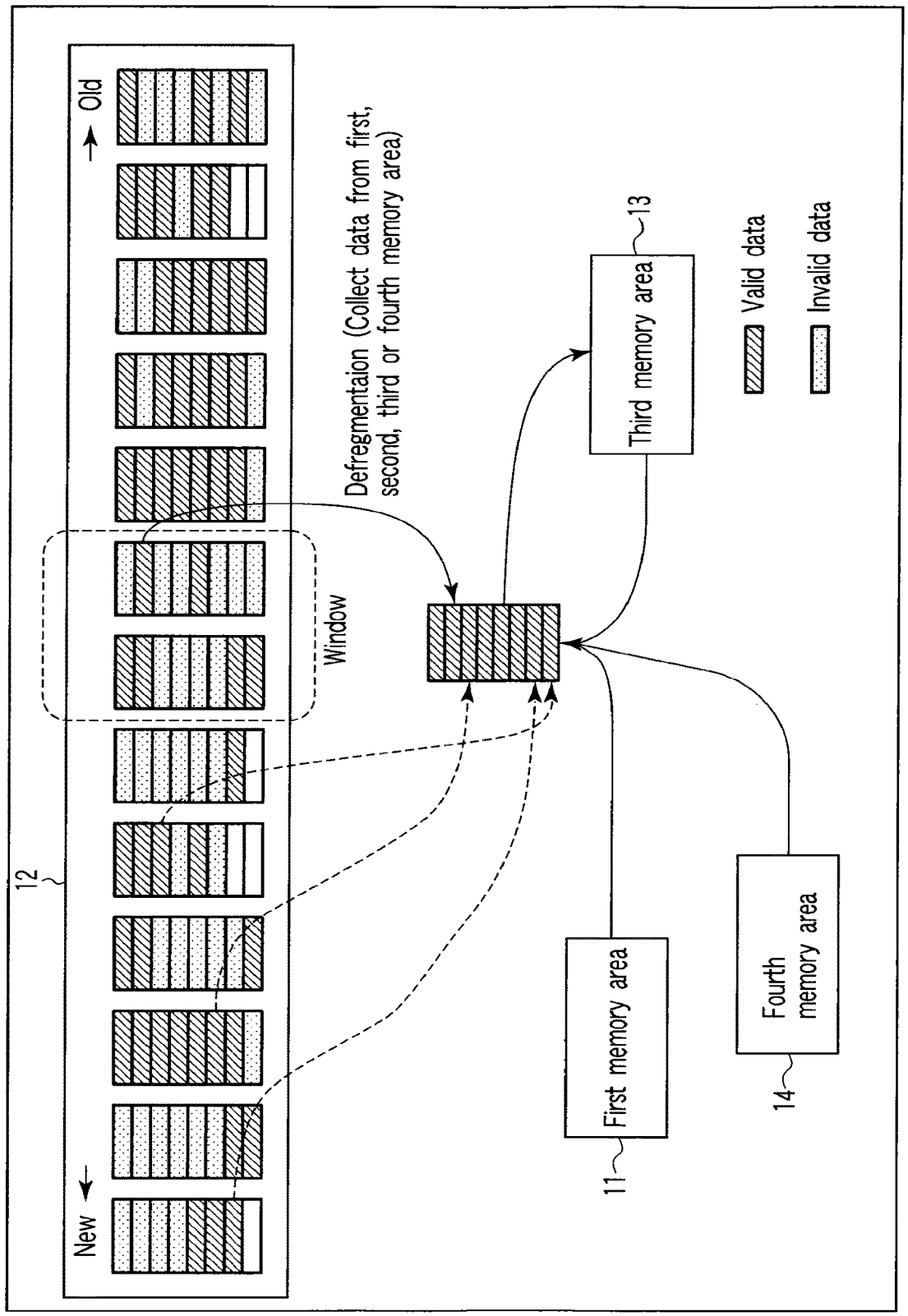
FIG. 43 is a diagram showing a state of the second memory area.

10. The controller 10 copies (rewrites) the selected valid data to the compaction blocks, as shown in FIG. 44 (Step ST10). The logical address of the copied valid data is newly recorded on the entry associated with the compaction block in the page management table. The logical address of the copied valid data originally recorded on the entry associated with the blocks allocated to the second memory area 12 is set to be invalid state in the page management table.
11. The controller 10 collects valid data included in the logical address range aligned by a size of the block unit ("large unit") from the first, second, third, and fourth memory areas 11, 12, 13, and 14, as shown in FIG. 43, and transfers the selected valid data to the third memory area 13 as data of the "large unit" which is equal to the block unit (Defragmentation) (Step ST11).

Figure 46:
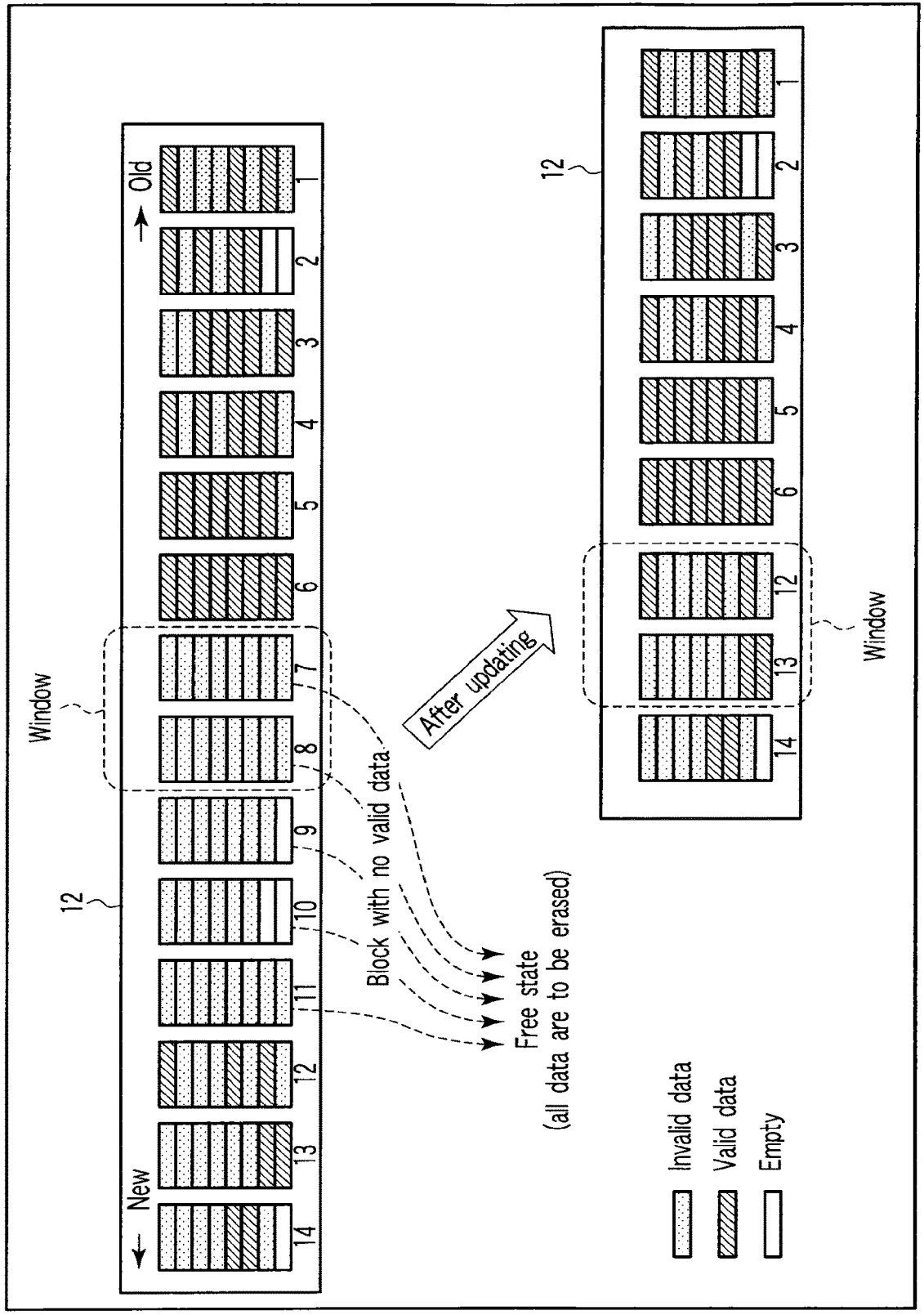
FIG. 46 is a diagram showing a state of the second memory area.

12. The controller 10 releases the block in which all of data is rendered invalid according to the compaction at the step ST10 or the defragmentation at the step ST11 (Step ST12). The controller 10 sets the status of the block to be "free" state from "active" state in physical block management table, as shown in FIG. 46.

13. The controller 10 judges whether the compaction block is filed with valid data of the page unit (Step ST13). If the compaction block is not filed with valid data, this process returns to the step ST8. If the compaction block is filed with valid data, this process goes to the step ST14.

However, in the case where the compaction block cannot be filled with valid data even if all valid data is selected at the step ST8, this process goes to the step ST 14. In this case, the compaction block having empty pages therein may be allocated to the second memory area 12.

14. The controller 10 inserts the compaction block immediately before the "window" in the second memory area 12, as shown in FIG. 44. That is, the compaction block is inserted on the older side than the "window", whereby the block newly allocated to the second memory area 12 is prevented from being subject to the target of the compaction again.

After updating the page management table and the physical block management table, this process returns to the step ST2. When this process returns to the step ST2 and new compaction process is triggered, a position of the "window" is kept at the present position, as shown in FIG. 46.

In the present process example, the controller 10 judges whether or not the compaction is applicable, only for the specified range ("window"), whereby the searching process to detect the target of the compaction can be simplified and the implementation cost and the verification cost can be reduced.

The number of blocks included in the specified range is not limited to the two. The controller 10 may defines the three or more blocks as the specified range. The controller 10 may judge whether valid data stored in the specified range is larger than the number of page unit data storable in the blocks decreased by one from the number of the blocks included in the specified range.

3. Application Example

The semiconductor storage device according to the above embodiments can be applied to an SSD (Solid State Drive) used as a secondary storage device for a personal computer such as a notebook computer. The specific example in this case is described below.

4. Conclusion

The semiconductor storage device according to the first, second, and third embodiments subjects the data having a low updating frequency to the compaction process, whereby reduces the erasing count of the blocks in the nonvolatile semiconductor memory. In addition, the semiconductor storage device uses two data management units; the "large unit" and the "small unit" as described in the section I., whereby realizes the improvement of the writing efficiency.

The present invention is not limited to the above-described embodiments, and the components can be modified and embodied without departing from the spirit and scope of the invention. Further, the suitable combination of the plurality of components disclosed in the above-described embodiments can form various inventions. For example, several components may be omitted from all the components disclosed in the above embodiments. Still further, the components over the different embodiments may be suitably combined with each other.

[III. Relation Between Data Management Units and Reading/Writing/Erasing Units]

1. Outline

In the above description, the semiconductor storage device according to the section I. and the section II. are respectively described. In this section, the first, second, and third units and the "small unit" and the "large unit" used in the above description will be specifically described.

The first unit is specified as data input and/or output unit with respect to a volatile or nonvolatile semiconductor memory which includes the first memory area 11. The first memory area 11 performs reading/writing of data by the first unit or less. The first unit may be a sector unit, for example. The host apparatus, such as a personal computer, executes an access to the semiconductor storage device by the sector unit.

The second unit is specified as the minimum data reading and/or writing unit in a nonvolatile semiconductor memory which includes the second, third, fourth, and fifth memory areas 12, 13, 14, and 15.

The third unit is specified as the minimum data erasing unit in a nonvolatile semiconductor memory which includes the second, third, fourth, and fifth memory areas 12, 13, 14, and 15.

If the second, third, fourth, and fifth memory areas 12, 13, 14, and 15 are configured in a NAND type flash memory, the second unit may be a page unit, and the third unit may be a block unit.

The second and third units are physically specified as the data reading/writing/erasing unit with respect to the second, third, fourth, and fifth memory areas 12, 13, 14, and 15 configured in the nonvolatile semiconductor memory.

On the other hand, the data management units (the "small unit" and the "large unit") in the semiconductor storage device may correspond to the physical reading/writing/erasing unit in the nonvolatile semiconductor memory, or may be different therefrom.

In the following embodiment, the "small unit" which is the data management unit with respect to the second and fourth memory areas 12 and 14 is the cluster unit. A size of the cluster unit is a natural number times as large as a size of the sector unit, and a size of the page unit is twice or larger natural number times as large as a size of the cluster unit. A size of the cluster unit may be equal to a size of the file management unit used in the file system of the host apparatus.

2. Embodiment

An embodiment of the invention will be described.

FIG. 47 shows a semiconductor storage device according to the embodiment of the present invention.

A first memory area 11 temporarily stores data from a host apparatus. The data is written by the sector unit (the first unit) or less in the first memory area 11. The first memory area 11 is configured in a volatile semiconductor memory such as a DRAM.

A second memory area 12 is composed of blocks in a nonvolatile semiconductor memory 22. In the nonvolatile semiconductor memory 22, the unit in which reading/writing is executed at one time is a page (the second unit) and the unit in which erasing is executed at one time is a block (the third unit). A size of the block unit is a natural number times as large as a size of the page unit. The second memory area 12 stores data by the "small unit" which is equal to the cluster unit.

A third memory area 13 is composed of blocks in the nonvolatile semiconductor memory 22 and stores data by the "large unit" which is equal to the block unit.

A fourth memory area 14 is composed of blocks in the nonvolatile semiconductor memory 22 and stores data by the "small unit" which is equal to the cluster unit.

The storage capacity of the first memory area 11 is assumed to be larger than a size of the one block unit in the nonvolatile semiconductor memory 22, and the storage capacity of the nonvolatile semiconductor memory 22 is assumed to be larger than the storage capacity provided as the product specification of the semiconductor storage device (for example, SSD).

The storage capacity of the nonvolatile semiconductor memory 22 is allocated to the second, third, and fourth memory areas 12, 13, and 14 as follows.

The storage capacity, which is the same as or larger than the storage capacity provided as the product specification of the semiconductor storage device, is allocated to the third memory area 13.

The storage capacity remaining by subtracting the storage capacity of the third memory area 13 from the storage capacity of the nonvolatile semiconductor memory 22 is allocated to the second and fourth memory areas 12 and 14. Each storage capacity of the second and fourth memory areas 12 and 14 and the rate between them are not limited.

A controller 10 has a CPU and a main memory, and can operate a program for executing data management. In this embodiment, the functions realized by the controller 10 can be implemented as any of hardware and software or the combination of the both. Whether these functions are implemented as hardware or software depends on the practical embodiment or the design constraints imposed on the entire system.

When the main memory of the controller 10 is comprised of a volatile semiconductor memory such as DRAM, the first memory area 11 may be configured in the main memory of the controller 10.

The controller 10 includes a cache management table, a cluster management table, a block management table, a cluster FIFO management table, and a physical block management table in order to manage where data accessed by the logical address from the host apparatus is stored in the first, second, third and fourth memory areas 11, 12, 13, and 14. These management tables are expanded onto the main memory of the controller 10 during the operation of the semiconductor storage device.

—Cache Management Table—

The cache management table of FIG. 47 controls data stored in the first memory area 11 by the "small unit" which is equal to the cluster unit. The control of the valid data is executed by the sector unit.

The configuration of the cache management table is shown in FIG. 21, as in the first embodiment of the section II. However, in this embodiment, it is assumed that one entry is assigned to one area of the cluster unit in the first memory area 11.

The number of entries is assumed to be the number of cluster unit data which can be contained within the first memory area 11, that is, not larger than (the capacity of the first memory area 11)/(a size of the cluster unit).

A logical address of cluster unit data, a physical address of the first memory area 11, and a sector flag indicating the location of valid data in the relevant area of the cluster unit are associated with each entry.

—Cluster Management Table—

The cluster management table of FIG. 47 controls data stored in the second and fourth memory areas 12 and 14 by the "small unit" which is equal to the cluster unit. A size of the cluster unit is a natural number times as large as a size of the sector unit, and a size of the page unit is twice or larger natural number times as large as a size of the cluster unit.

Figure 48:
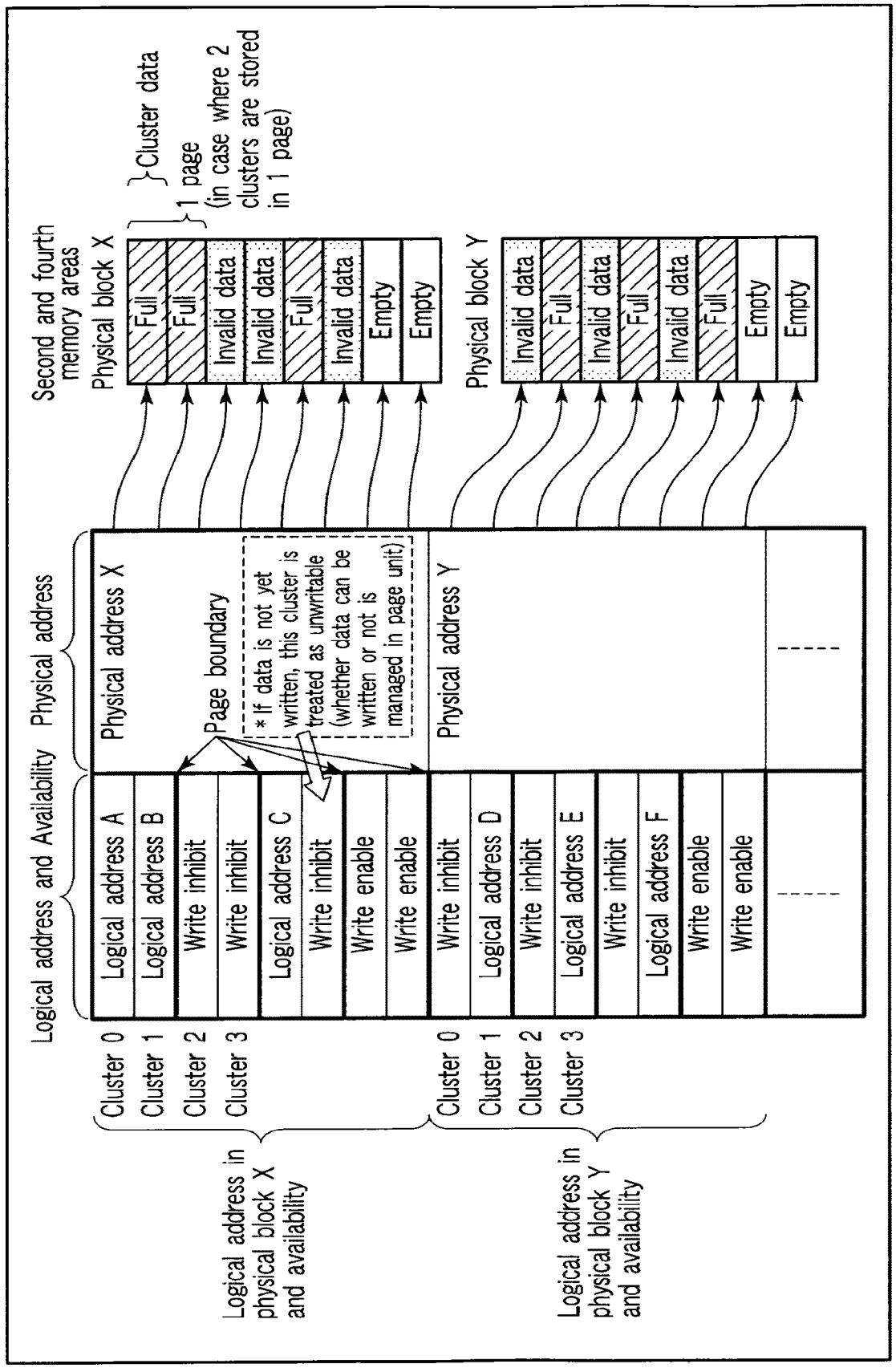
FIG. 48 is a diagram showing a cluster management table.

FIG. 48 shows an example of the cluster management table.

It is assumed that one entry is assigned to one block in the second and fourth memory areas 12 and 14.

The number of entries is assumed to be provided with allowance, in order to register the blocks in processing, to the number of blocks which can be contained within the second and fourth memory areas 12 and 14, that is, the number providing an allowance to [(the total capacity of the second and fourth memory areas 12 and 14)/(a size of the block unit)].

The physical address of the block allocated to the second memory area 12 or the fourth memory area 14 is associated with each entry, and the logical addresses of cluster unit data in the block are recorded in each entry.

In FIG. 48, it is assumed that a size of the page unit is twice as large as a size of the cluster unit. A cluster availability is configured to be able to distinguish "write-enable" state (this storage area is empty) from "write-inhibit" state (this storage area is invalid because old data has once written therein and new data is written in another storage area) for each cluster.

In addition, in the case where cluster unit data which does not fulfill the page boundary is written in the fourth memory area 14, the cluster availability corresponding to the remaining area of the cluster unit in the identical page is set to be "write-inhibit" state. Although the remaining area of the cluster unit does not store valid data, since the data writing unit is the page unit and the nonvolatile semiconductor memory 22 cannot use the remaining area, the controller 10 treats the remaining area as invalid data.

—Block Management Table—

The block management table of FIG. 47 controls data stored in the third memory area 13 by the "large unit" which is equal to the block unit. The configuration of the block management table is shown in FIG. 23, as in the first embodiment of the section II.

—Cluster FIFO Management Table—

The cluster FIFO management table of FIG. 47 controls data in the blocks allocated to the fourth memory area 14. The configuration of the cluster FIFO management table is shown in FIG. 24, as in the first embodiment of the section II.

—Physical Block Management Table—

The physical block management table of FIG. 47 controls the usage of blocks in the nonvolatile semiconductor memory 22. The configuration of the physical block management table is shown in FIG. 25, as in the first embodiment of the section II.

A process flow executed by the controller 10 of FIG. 47 is described.

The controller 10 first writes sector unit (first unit) data from the host apparatus in the first memory area 11 and stores the data for a certain period therein. With regard to this data store process, "A. Data store process in the first memory area" described in the section I. can be applicable.

The controller 10 distinguishes whether the data stored in the first memory area 11 should be managed with the "small unit (first management unit)" or the "large unit (second management unit)", based on a predetermined condition (which may be substantially the same as the first condition of "B. Data output process from the first memory area" described in the section I.).

A size of the "small unit" is a natural number times as large as a size of the page unit or a size of the page unit is a natural number times as large as a size of the "small unit".

A size of the "large unit" is twice or larger natural number times as large as a size of the "small unit", and at the same time, is a natural number times as large as a size of the block unit.

In this embodiment, a size of the "small unit" which is a data management unit in the second and fourth memory areas 12 and 14 is twice or larger natural number times as large as a size of the sector unit, and a size of the page unit is twice or larger natural number times as large as a size of the "small unit". The "small unit" which satisfies this relation is called the cluster unit. To simplify the explanation, a size of the "large unit" which is a data management unit in the third memory area 13 is equal to a size of the block unit.

The above relation between the units may be set as following example: the sector unit (first unit)<the cluster unit ("small unit")<the page unit (second unit)<the block unit (third unit)≤the "large unit".

If the data stored in the first memory area 11 is managed with the "small unit", the data is transferred to the fourth memory area 14. If the data stored in the first memory area 11 is managed with the "large unit", the data is transferred to the third memory area 13.

This data output process is substantially the same as "B. Data output process from the first memory area" described in the section I. However, different from the section I., the destination of the "small unit" data is the fourth memory area 14. Since a size of the cluster unit is smaller than a size of the page unit, a plurality of cluster unit data may be involved and transferred to the fourth memory area 14.

A. FIFO Process in the Fourth Memory Area

Figure 49:
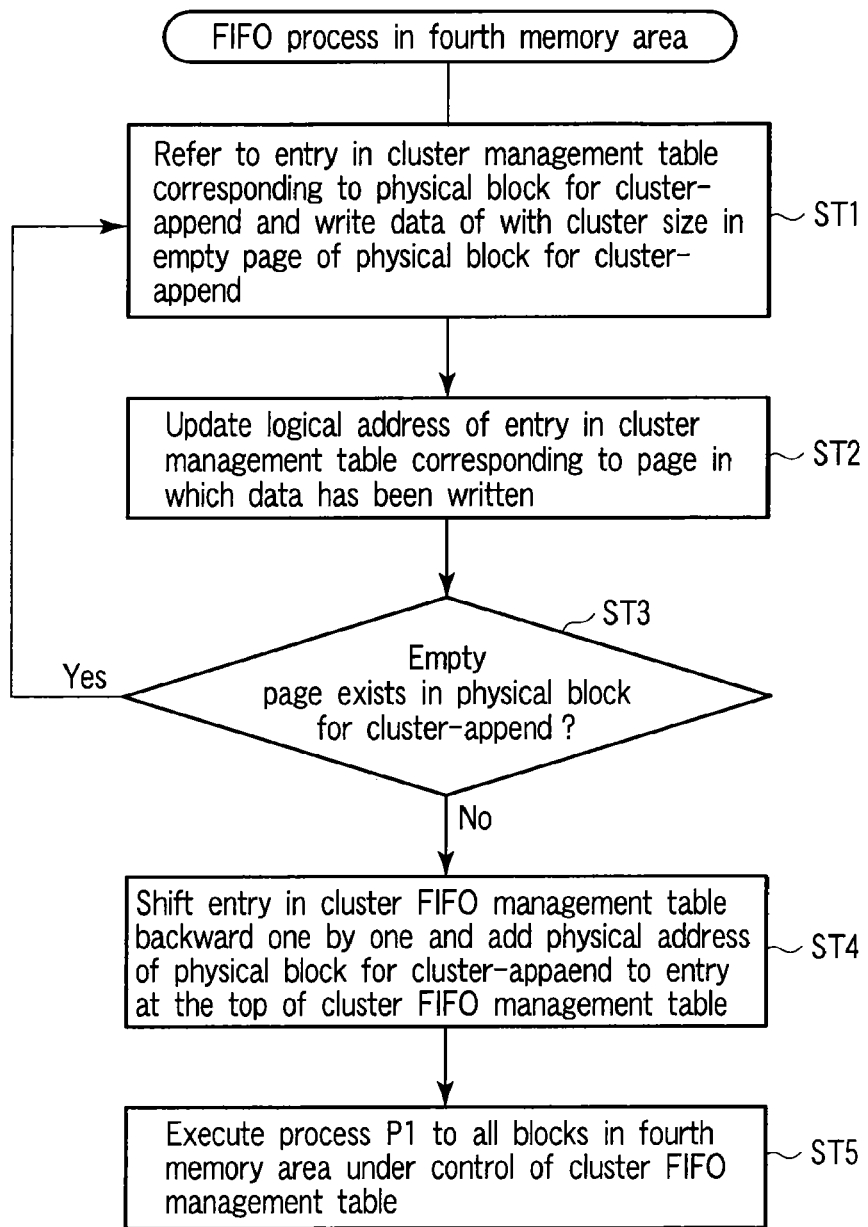
FIG. 49 is a flowchart showing a FIFO process in the fourth memory area.

As already described, the fourth memory area 14 has the FIFO structure of the block unit. FIG. 49 shows FIFO process in the fourth memory area 14.

1. The controller 10 refers to entries of the cluster management table corresponding to a block prepared for writing data in appending manner (hereinafter referred to as a physical block for cluster-append). The controller 10 stores data outputted from the first memory area 11, as data of the "small unit" which is equal to the cluster unit, in an area of the cluster unit with write-enable state in the physical block for cluster-append (Step ST1).

The controller 10 searches the cache management table and judges whether all of sector unit data composing cluster unit data, which are determined to be outputted, exist in the first memory area 11.

If not all sector unit data are completed in the first memory area 11, the controller 10 collects missing data from the second, third, and fourth memory areas 12, 13, and 14.

After completing all sector unit data composing cluster unit data, the controller 10 instructs the nonvolatile semiconductor memory 22 to write the cluster unit data. In the writing process at the step ST1, it is preferable that a plurality of cluster unit data storable in the identical page is written together.

2. The controller 10 updates the logical address, recorded in the entry corresponding to the page in which the cluster unit data has been written, in the cluster management table (Step ST2). The old data included in the same logical address range, which had been written in the second and fourth memory areas 12 and 14, becomes invalid data.

3. The controller 10 judges whether there exits an empty area of the cluster unit in the physical block for cluster-append (Step ST3). If the empty area of the cluster unit is not detected, this process goes to the step ST4. If the empty area of the cluster unit is detected, this process returns to the step ST1.

4. The controller 10 shifts the entries of the cluster FIFO management table backward one by one, and adds the physical address of the physical block for cluster-append to the entry at the top of the cluster FIFO management table (Step ST4). As a result, the physical block for cluster-append is allocated to the fourth memory area 14.

5. The controller 10 executes the process P1 for all the blocks in the fourth memory area 14 of which physical addresses are recorded in the cluster FIFO management table (Step ST5).

The process P1 may be substantially the same as "B. Process P1" of FIG. 39 described in the section II. However, valid data is managed with the cluster unit.

3. Conclusion

The data management units (the "small unit" and the "large unit") in the semiconductor storage device may correspond to the physical reading/writing/erasing unit in the nonvolatile semiconductor memory, or may be different therefrom.

The semiconductor storage device may adopt following data management units. The two data management units satisfy the relation that a size of the "large unit" is twice or larger natural number times as large as a size of the "small unit".

(1) A size of the "small unit" is equal to a size of the page unit, and a size of the "large unit" is equal to a size the block unit.

(2) A size of the "small unit" is equal to a size of the page unit, and a size of the "large unit" is equal to a size of the track unit which is smaller than the block init.

(3) A size of the "small unit" is equal to a size of the cluster unit which is smaller than the page unit, and a size of the "large unit" is equal to a size of the block unit.

(4) A size of the "small unit" is equal to a size of the cluster unit which is smaller than the page unit, and a size of the "large unit" is equal to a size of the track unit which is smaller than the block unit.

Naturally, the semiconductor storage device may adopt other data management units which satisfy the certain relation described in the above embodiments, based on the specification (a size of the page unit, or a size of the block unit) of the nonvolatile semiconductor memory, or file management unit in the host apparatus, for example.

IV. Application Example

Application examples according to the semiconductor storage devices shown in the above embodiments are described.

Those semiconductor storage devices are applied to, for example, an SSD used as a secondary storage device for a personal computer such as a notebook computer.

FIG. 50 shows a configuration example of the SSD.

The SSD 100 includes plural NAND type flash memories (NAND memories) 10 for data storage, a DRAM 101 for data cache or for a work area, a drive control circuit 102 for controlling the NAND memories 10 and the DRAM 101, and a power circuit 103.

The first memory area 11 of the above embodiments may be configured in the DRAM 101. The first memory area 11 configured in the DRAM 101 functions as the write cache for the NAND memory 10. The drive control circuit 102 may comprise the controller 10 in the above embodiment.

The drive control circuit 102 outputs a control signal for controlling a state display LED provided outside the SSD 100. A FeRAM (Ferro electric Random Access Memory), a MRAM (Magnetic Random Access Memory), or a NOR type flash memory may be used instead of the DRAM 20. That is, the first memory area 11 may be configured in a nonvolatile random access memory which has higher writing speed than the NAND memory 10.

The SSD 100 sends and receives data with a host apparatus such as a personal computer through an ATA interface (ATA I/F), such as a serial ATA I/F. The SSD 100 sends and receives data with an equipment for debug through an RS232C interface (RS232C I/F).

The power circuit 104 receives the external power source, and generates plural internal power sources using the external power source. These plural internal power sources are supplied to each part in the SSD 100. The power circuit 103 detects the rising of the external source and generates a power on reset signal. The power on reset signal is sent to the drive control circuit 102.

The NAND memory 10 is composed of a plurality of blocks. Each of the blocks is the minimum unit of data erasing. FIG. 51 shows a configuration example of one block in the NAND memory 10.

Each block includes (m+1) NAND strings sequentially aligned along the X direction (m: integer≥0). In each select transistor ST1 included in the (m+1) NAND strings, the drain is connected to bit lines BL0 to BLm, and the gate is commonly connected to a select gate line SGD. In a select transistor ST2, the source is commonly connected to a source line SL, and the gate is commonly connected to a select gate line SGS.

Each memory cell transistor MT is comprised of an MOSFET (Metal Oxide Semiconductor Field Effect Transistor) having a stacked gate structure formed on a semiconductor substrate. The stacked gate structure includes a charge storage layer (floating gate electrode) formed on a semiconductor substrate through a gate insulating film and a control gate electrode formed on the charge storage layer through an inter-gate insulation film. The memory cell transistor MT is changed in its threshold voltage in accordance with the number of electrons injected into a floating gate electrode and stores data in accordance with the difference in the threshold voltage.

The memory cell transistor MT may be comprised so as to store 1 bit (SLC: Single Level Cell) or 2 or higher bits (MLC: Multi Level Cell).

In each NAND string, the (n+1) memory cell transistors MT are arranged between the source of the selection transistor ST1 and the drain of the selection transistor ST2 so that the respective current pathways are connected in series. Namely, the plural memory cell transistors MT are connected in series in the Y direction so that the adjacent memory cell transistors share a diffusion region (source region or drain region).

The control gate electrodes are respectively connected to word lines WL0 to WLn in the order from the memory cell transistor MT which is the closest to the drain side. Thus, the drain of the memory cell transistor MT connected to the word line WL0 is connected to the source of the selection transistor ST1, and the source of the memory cell transistor MT connected to the word line WLn is connected to the drain of the selection transistor ST2.

The word lines WL0 to WLn are connected between the NAND strings in the block, sharing the control gate electrode in the memory cell transistor MT. Namely, the control gate electrodes in the memory cell transistor MT, which are on the same line in the block, are connected to the same word line WL. The (m+1) memory cell transistors MT connected to the same word line WL are treated as the page, and the data writing and the data reading are performed by the page unit.

The bit lines BL0 to BLm are connected between the block, sharing the drains of the selection transistor ST1. Namely, the NAND strings on the same line in the plural blocks are connected to the same bit line BL.

The second, third, fourth, and fifth memory areas 12, 13, 14, and 15 of the above embodiments may be configured in the NAND memory (memories) 10. Each one of the memory areas may be configured over plural NAND memories 10. Otherwise, each one of the memory areas may be configured in separate NAND memory 10. Still further, each NAND memory 10 may have a different performance. For example, the fourth memory area 14 may be configured in the SLC type NAND memory, and other memory areas may be configured in the MLC type NAND memory, and so on.

The plural NAND memories 10 are connected in parallel to the drive control circuit 102. The plural blocks in the NAND memories 10 connected in parallel may be simultaneously erased and may form the expanded block unit which is the minimum erasing unit in the SSD 100. The plural pages in the NAND memories 10 connected in parallel may be simultaneously written and read and may form the expanded page unit which is the minimum writing and reading unit in the SSD 100.

The memory cell transistor MT having a structure with a floating gate electrode may have a structure which can realize the adjustment of a threshold value by trapping electrons on a nitride film interface as the charge storage layer, such as an MONOS (Metal Oxide Nitride Oxide Silicon) type. Likewise, the memory cell transistor MT having the MONOS structure may be comprised so as to store 1 bit or 2 or higher bits.

FIG. 52 shows an example of a threshold distribution in a four-level system in which one memory cell stores 2 bits data.

The memory cell stores one of the four-level data "xy" defined by an upper page data "x" and an lower page data "y" in the four-level system. The four-level data is "11", "01", "00" and "10". Data "11" (erase state) has a state in which the threshold voltage of the memory cell transistor MT is negative.

In the writing operation of the lower page data, data "11" is selectively programmed to data "10" by writing of the lower page data "y". Before the writing of the upper page data, the threshold distribution of data "10" is located between the threshold distributions of data "01" and data "00", and may be broader than the threshold distribution obtained after the writing of the upper page data. In the write operation of the upper page data, data "11" is selectively programmed to data "01", and data "10" is selectively programmed to data "00", by writing of the upper page data "x".

The threshold distribution of the memory cell transistors MT is required to be finely controlled, when multi-level data storing system is applied. The threshold distribution is affected a deterioration of the memory cell transistors MT. Therefore, the improvement of the writing efficiency and the decrease of the erasing count are essentially effective, when the nonvolatile semiconductor memories in the semiconductor storage device adopt the multi-level data storing system.

In addition, as shown in FIG. 52, if the threshold distribution in the state that only the lower page data is written is different from the one in the state that the upper page data is written, the lower page data previously written may be lost caused by the power supply interruption when executing the upper page programming.

Against the above problem, the fourth memory area 14, in which "small unit" data is written in appending manner, may be composed of the pseudo-SLC blocks. The pseudo-SLC block is a block in which only the lower page is used for the data writing. This configuration prevents the loss of lower page data. Further, the lower page programming does not require fine control, the writing speed is improved.

If the fourth memory area 14 is composed of the pseudo-SLC blocks, the pseudo-SLC blocks and the regular blocks (MLC blocks) may intermingle with each other in the second memory area 12. In the four-level system, a storage capacity of the pseudo-SLC block is a half of a storage capacity of the MLC block. Therefore, at the compaction process in the second memory area 12, valid data in the pseudo-SLC blocks is copied to the MLC block.

FIG. 53 shows a configuration example of the drive control circuit.

The drive control circuit 102 includes a bus 104 for data access, a first circuit control bus 105, and a second circuit control bus 106.

A processor 107 for controlling the entire drive control circuit 102 is connected to the first circuit control bus 105. Alternatively, a boot ROM 108 storing a boot program in each control program (FW: firmware) therein is connected to the first circuit control bus 105 through a ROM controller 109. Further, a clock controller 110 for receiving the power on reset signal from the power circuit 103 and supplying a reset signal and a clock signal to each section is connected to the first circuit control bus 105.

The second circuit control bus 106 is connected to the first control circuit bus 105. A parallel IO (PIO) circuit 111 for supplying a status display signal to the state display LED and a serial IO (SIO) circuit 112 for controlling the RS232C interface are connected to the second circuit control bus 106.

An ATA interface controller (ATA controller) 113, a first ECC (Error Check and Correct) circuit 114, a NAND controller 115, and a DRAM controller 119 are connected to both the data access bus 104 and the first circuit control bus 105. The ATA controller 113 sends and receives data with a host apparatus through an ATA interface. An SRAM 102 used as a data work area is connected to the data access bus 104 through an SRAM controller 121.

The NAND controller 115 includes a NAND I/F 118 for performing interface process with the four NAND memories 10, a second ECC circuit 117, and a DMA controller 116 for DMA transfer control for controlling the access between the NAND memory and the DRAM.

Figure 54:
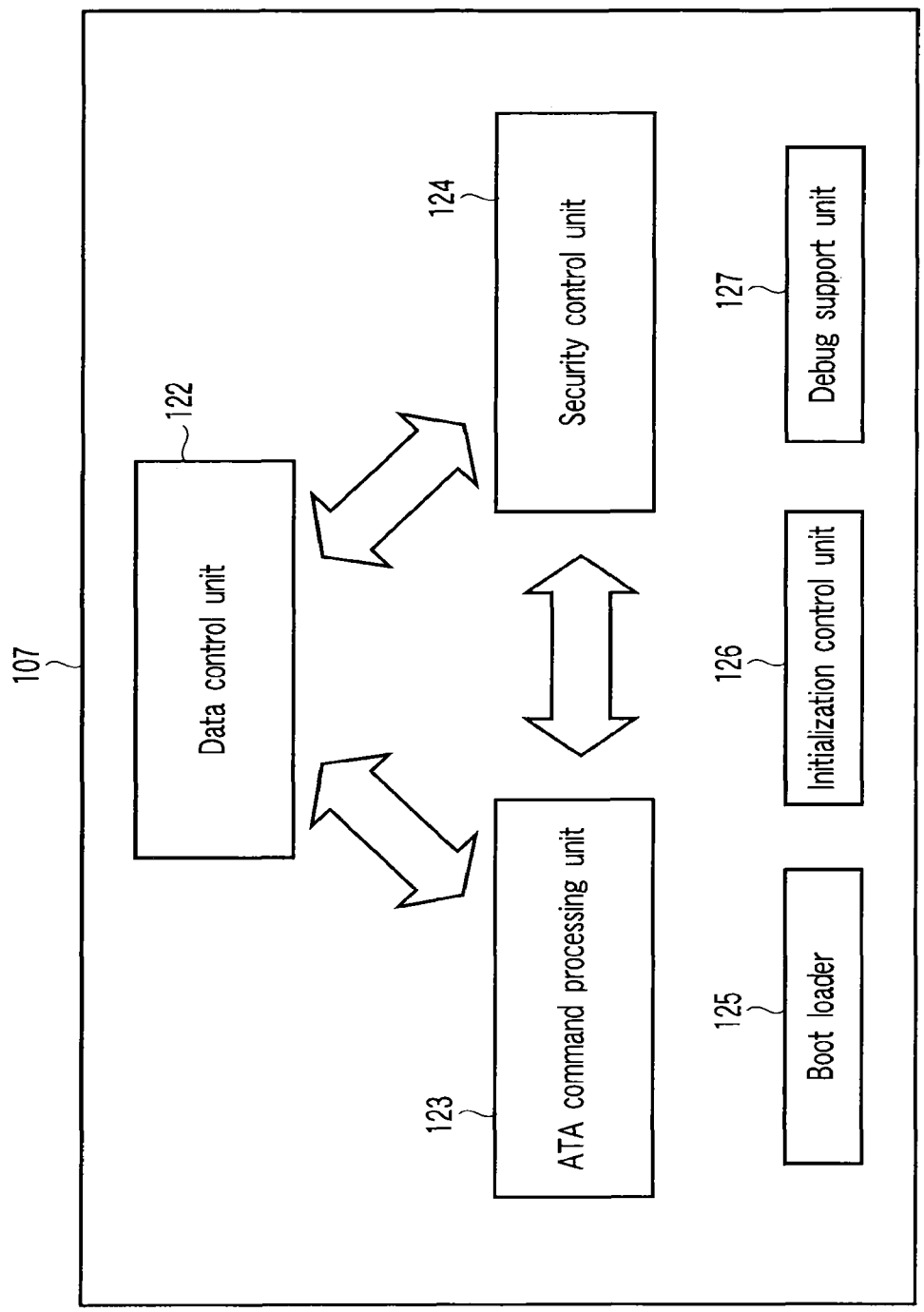
FIG. 54 is a diagram showing a configuration example of a processor.

FIG. 54 shows a configuration example of a processor.

The processor 107 includes a data control unit 122, and an ATA command processing unit 123, a security control unit 124, a boot loader 125, an initialization control unit 126, and a debug support unit 127.

The data control unit 122 controls the data transfer between the NAND memory and the DRAM and various functions with regard to a NAND chip through the NAND controller 115 and the first ECC circuit 114.

The ATA command processing unit 123 performs the data transfer process in cooperation with the data control unit 122 through the ATA controller 113 and the DRAM controller 119. The security control unit 124 controls various security information in cooperation with the data control unit 122 and the ATA command processing unit 123. The boot loader 125 loads each control program (FW) from the NAND memory 10 to the SRAM 120 when powered on.

The initialization control unit 126 initializes each controller and circuit in the drive control circuit 102. The debug support unit 127 processes data for debug which is supplied from the outside through the RS232C interface.

FIG. 55 shows an example of a portable computer with an SSD mounted therein.

A portable computer 200 includes a main body 201 and a display unit 202. The display unit 202 includes a display housing 203 and a display device 204 accommodated in the display housing 203.

The main body 201 includes a chassis 205, a keyboard 206, and a touch pad 207 as a pointing device. The chassis 205 includes a main circuit board, an ODD unit (Optical Disk Device), a card slot, and the SSD 100.

The card slot is provided so as to be adjacent to the peripheral wall of the chassis 205. The peripheral wall has an opening 208 facing the card slot. A user can insert and remove an additional device into and from the card slot from outside the chassis 205 through the opening 208.

The SSD 100 may be used instead of the prior art HDD in the state of being mounted in the portable computer 200 or may be used as an additional device in the state of being inserted into the card slot of the portable computer 200.

Figure 56:
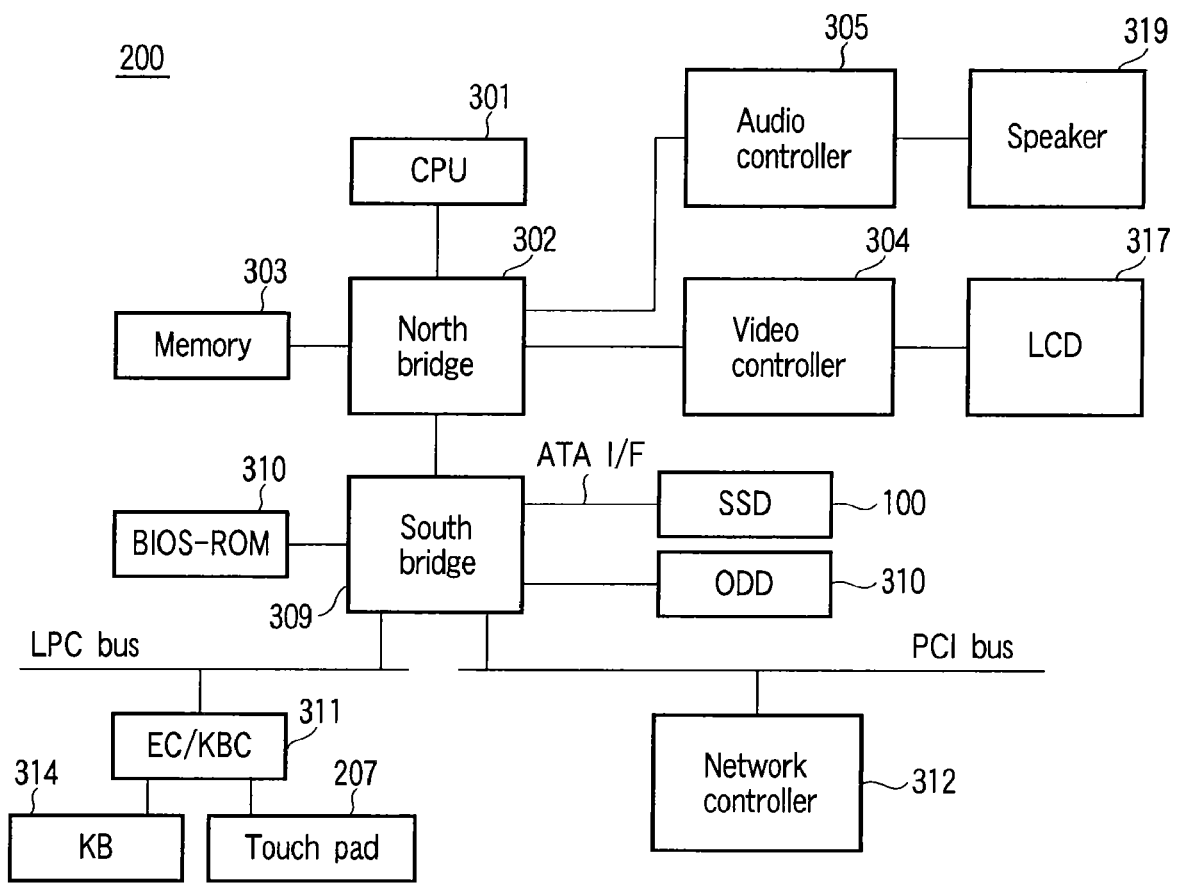
FIG. 56 is a diagram showing an example of a system of a portable computer.

FIG. 56 shows an example of a system of a portable computer with an SSD mounted therein.

The portable computer 200 is comprised of CPU 301, a north bridge 302, a main memory 303, a video controller 304, an audio controller 305, a south bridge 309, BIOS-ROM 310, SSD 100, ODD unit 310, an embedded controller/keyboard controller (EC/KBC) IC 311, and a network controller 312.

The CPU 301 is a processor for controlling an operation of the portable computer 200, and executes an operating system (OS) loaded from the SSD 100 to the main memory 303. The CPU 301 executes these processes, when the ODD unit 311 executes one of reading process and writing process to an optical disk.

The CPU 301 executes a system BIOS (Basic Input Output System) stored in BIOS-ROM 310. The system BIOS is a program for controlling a hard ware of the portable computer 200.

The north bridge 302 is a bridge device which connects the local bus of CPU 301 to the south bridge 309. The north bridge 302 has a memory controller for controlling an access to the main memory 303.

The north bridge 302 has a function which executes a communication between the video controller 304 and the audio controller 305 through the AGP (Accelerated Graphics Port) bus.

The main memory 303 stores program or data temporary, and functions as a work area of the CPU 301. The main memory 303 is comprised of, for example, DRAM.

The video controller 304 is a video reproduce controller for controlling a display unit which is used for a display monitor (LCD) 317 of the portable computer 200.

The Audio controller 305 is an audio reproduce controller for controlling a speaker 319 of the portable computer 200.

The south bridge 309 controls devices connected to the LPC (Low Pin Count) bus, and controls devices connected to the PCI (Peripheral Component Interconnect) bus. The south bridge 309 controls the SSD 100 which is a memory device storing software and data, through the ATA interface.

The portable computer 200 executes an access to the SSD 100 in the sector unit. The write command, the read command and the flash command is input through the ATA interface.

The south bridge 309 has a function which controls BIOS-ROM 310 and ODD unit 310.

EC/KBC 311 is one chip microcomputer which is integrated the embedded controller for controlling power supply, and the key board controller for controlling the key board (KB) 314 and touch pad 207.

EC/KBC 311 has a function which sets on/off of the power supply of the portable computer 200 based on the operation of the power button by user. The network controller 312 is, for example, a communication device which executes the communication to the network, for example, the internet.

Although the semiconductor storage device in the above embodiments is comprised as an SSD, it can be comprised as, for example, a memory card typified by an SD™ card. When the semiconductor storage device is comprised as the memory card, it can be applied not only to a portable computer but also to various electronic devices such as a cell phone, a PDA (Personal Digital Assistant), a digital still camera, and a digital video camera.

The semiconductor storage device of the invention is effective for a secondary storage device for a personal computer such as an SSD and a memory card such as an SD™ card.

What is claimed is:

1. A storage device comprising:
a nonvolatile memory including a plurality of blocks, each of the plurality of blocks being a unit of data erasing and configured to store a first data of a first bit; and
a controller configured to:
allocate a first set of the plurality of blocks as a first memory area, the first set of the plurality of blocks each including a first block having a memory cell configured to store a second data of a second bit, the second bit being less than the first bit;
allocate a second set of the plurality of blocks as a second memory area, the second set of the plurality of blocks each including a second block having a memory cell configured to store the first data;
receive data from an external host apparatus;
store the received data into the first block in the first set of the plurality of blocks by a first management unit, the first management unit being less than the unit of data erasing;
copy valid data stored in the first block to the second block by a second management unit, the second management unit being corresponding to the unit of data erasing and being larger than the first management unit; and
release the first block in which no valid data is stored, after copying the valid data stored in the first block,
wherein the first block includes a pseudo block configured to be capable of storing the first data but storing the second data.

2. The storage device according to claim 1, wherein the controller is configured to allocate the second set of the plurality of blocks to the second memory area when a number of valid data stored in the first block included in the first memory area is a first threshold or more.

3. The storage device according to claim 2, wherein the controller is configured to copy valid data stored in the first block to the second block when the number of valid data stored in the first block is less than the first threshold.

4. The storage device according to claim 1, wherein a programming time for the first block is shorter than that for the second block.

5. The storage device according to claim 1, wherein a capacity of the first block is smaller than that of the second block.

6. The storage device according to claim 5, wherein the controller is configured to invalidate first data, the first data having the same logical address as data newly stored to the first memory area, stored in the first or second memory area.

7. The storage device according to claim 6, wherein the controller is configured to manage the first set of the plurality of blocks allocated to the first memory area with FIFO (First In First Out) data structure sorted by an allocation order.

8. The storage device according to claim 7, wherein the controller is configured to, when storing data to the first memory area, allocate a new first block to the first memory area at an input side of the FIFO data structure.

9. The storage device according to claim 8, wherein the controller is configured to allocate the first block having an oldest allocation order at an output side of the FIFO data structure to the second memory area.

10. The storage device according to claim 1, wherein a number of blocks allocatable to the first memory area has an upper limit.

11. The storage device according to claim 10, wherein the controller is configured to allocate the first block to the second memory area when a number of the first set of the plurality of blocks allocated to the first memory area exceeds the upper limit.

12. The storage device according to claim 1, wherein the nonvolatile memory is a NAND type flash memory.

13. The storage device according to claim 1, wherein the nonvolatile memory includes a plurality of memory chips.

14. The storage device according to claim 1, further comprising a first memory configured to store data by a first unit or less, the first unit being an access unit from the external host apparatus, the first memory being a DRAM (Dynamic Random Access Memory).

15. A method of controlling a storage device, the storage device including a nonvolatile memory including a plurality of blocks, each of the plurality of blocks being a unit of data erasing and configured to store a first data of a first bit, the method comprising:
allocating a first set of the plurality of blocks as a first memory area, the first set of the plurality of blocks each including a first block having a memory cell configured to store a second data of a second bit, the second bit being less than the first bit;
allocating a second set of the plurality of blocks as a second memory area, the second set of the plurality of blocks each including a second block having a memory cell configured to store the first data;

receiving data from an external host apparatus;

storing the received data into the first block in the first set of the plurality of blocks by a first management unit, the first management unit being less than the unit of data erasing;

copying valid data stored in the first block to the second block by a second management unit, the second management unit being corresponding to the unit of data erasing and being larger than the first management unit; and releasing the first block in which no valid data is stored, after copying the valid data stored in the first blocks, wherein the first block includes a pseudo block configured to be capable of storing the first data but storing the second data.

16. The method according to claim 15, wherein the allocating the second set of the plurality of blocks to the second memory area when a number of valid data stored in the first block included in the first memory area is a first threshold or more.

17. The method according to claim 16, wherein the copying is executed when the number of valid data stored in the first block is less than the first threshold.

18. The method according to claim 15, wherein a programming time for the first block is shorter than that for the second block.

19. The method according to claim 15, wherein a capacity of the first block is smaller than that of the second block.

20. The method according to claim 15, wherein a number of blocks allocatable to the first memory area has an upper limit.

* * * * *